(12) United States Patent
Matsuzaki et al.

(10) Patent No.: US 12,349,412 B2
(45) Date of Patent: Jul. 1, 2025

(54) SEMICONDUCTOR DEVICE AND METHOD FOR MANUFACTURING SEMICONDUCTOR DEVICE

(71) Applicant: Semiconductor Energy Laboratory Co., Ltd., Atsugi (JP)

(72) Inventors: Takanori Matsuzaki, Atsugi (JP); Kosei Nei, Yokohama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 732 days.

(21) Appl. No.: 17/602,433

(22) PCT Filed: Apr. 15, 2020

(86) PCT No.: PCT/IB2020/053525
§ 371 (c)(1),
(2) Date: Oct. 8, 2021

(87) PCT Pub. No.: WO2020/222062
PCT Pub. Date: Nov. 5, 2020

(65) Prior Publication Data
US 2022/0173249 A1    Jun. 2, 2022

(30) Foreign Application Priority Data
Apr. 29, 2019   (JP) ................................ 2019-087007

(51) Int. Cl.
*H10D 30/67*    (2025.01)
(52) U.S. Cl.
CPC ..... *H10D 30/6755* (2025.01); *H10D 30/6758* (2025.01)

(58) Field of Classification Search
CPC ...................... H01L 29/7869; H01L 29/78603
See application file for complete search history.

(56) References Cited

U.S. PATENT DOCUMENTS

| 9,502,434 B2 | 11/2016 | Tanaka et al. |
| 9,698,276 B2 | 7/2017 | Yamazaki |

(Continued)

FOREIGN PATENT DOCUMENTS

| CN | 110313070 A | 10/2019 |
| JP | 2011-151383 A | 8/2011 |

(Continued)

OTHER PUBLICATIONS

International Search Report (Application No. PCT/IB2020/053525) Dated Jul. 21, 2020.

(Continued)

*Primary Examiner* — Trang Q Tran
(74) *Attorney, Agent, or Firm* — Eric J. Robinson; Robinson Intellectual Property Law Office, P.C.

(57) ABSTRACT

A semiconductor device with less variation in transistor characteristics is provided. The semiconductor device includes a transistor, a first and a second conductor, and a first to a third insulator. The transistor and the first conductor are provided over the first insulator. The transistor includes an oxide semiconductor. The second insulator is provided over the transistor. The first conductor includes a region which does not overlap with the second insulator. The third insulator is provided to cover the first conductor, the transistor, and the second insulator. The second conductor is provided over the third insulator and at least partly overlaps with the first conductor.

12 Claims, 38 Drawing Sheets

(56) References Cited

U.S. PATENT DOCUMENTS

| | | | |
|---|---|---|---|
| 9,705,002 B2 | 7/2017 | Yamazaki et al. | |
| 9,917,207 B2 | 3/2018 | Yamazaki | |
| 10,096,718 B2 | 10/2018 | Asami | |
| 10,096,721 B2 | 10/2018 | Yamazaki et al. | |
| 10,516,060 B2 | 12/2019 | Yamazaki | |
| 10,923,477 B2 | 2/2021 | Yamazaki et al. | |
| 11,417,771 B2 | 8/2022 | Yamazaki | |
| 11,869,980 B2 | 1/2024 | Yamazaki | |
| 2011/0156027 A1 | 6/2011 | Yamazaki et al. | |
| 2012/0032730 A1 | 2/2012 | Koyama | |
| 2015/0187814 A1* | 7/2015 | Miyairi | H01L 29/78603 257/43 |
| 2015/0221775 A1 | 8/2015 | Yamazaki et al. | |
| 2016/0155850 A1 | 6/2016 | Yamazaki | |
| 2017/0186875 A1 | 6/2017 | Yamazaki | |
| 2017/0365720 A1 | 12/2017 | Asami | |
| 2019/0371798 A1 | 12/2019 | Yamazaki et al. | |
| 2020/0043931 A1 | 2/2020 | Sato et al. | |
| 2021/0175235 A1 | 6/2021 | Yamazaki et al. | |
| 2024/0113231 A1 | 4/2024 | Yamazaki | |

FOREIGN PATENT DOCUMENTS

| | | |
|---|---|---|
| JP | 2012-257187 A | 12/2012 |
| JP | 2015-188064 A | 10/2015 |
| JP | 2015-213164 A | 11/2015 |
| JP | 2016-111352 A | 6/2016 |
| JP | 2017-120896 A | 7/2017 |
| JP | 2017-168836 A | 9/2017 |
| JP | 2017-228777 A | 12/2017 |
| JP | 2018-125528 A | 8/2018 |
| JP | 2018-133570 A | 8/2018 |
| KR | 2015-0092707 A | 8/2015 |
| KR | 2017-0086546 A | 7/2017 |
| KR | 2019-0118154 A | 10/2019 |
| TW | 201535673 | 9/2015 |
| TW | 201626567 | 7/2016 |
| TW | 201836020 | 10/2018 |
| WO | WO-2015/159179 | 10/2015 |
| WO | WO-2016/083952 | 6/2016 |
| WO | WO-2017/153862 | 9/2017 |
| WO | WO-2018/150292 | 8/2018 |

OTHER PUBLICATIONS

Written Opinion (Application No. PCT/IB2020/053525) Dated Jul. 21, 2020.

* cited by examiner

FIG. 4A
|  | Intermediate state New crystalline phase | |
|---|---|---|
| Amorphous | Crystalline | Crystal |
| • completely amorphous | • CAAC<br>• nc<br>• CAC<br><br>excluding single crystal and poly crystal | • single crystal<br>• poly crystal |
FIG. 4B
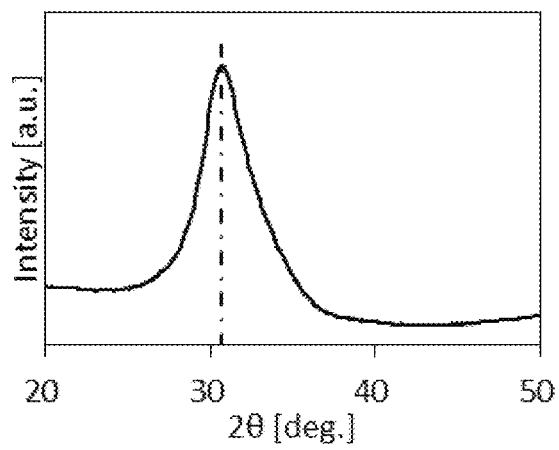
FIG. 4C
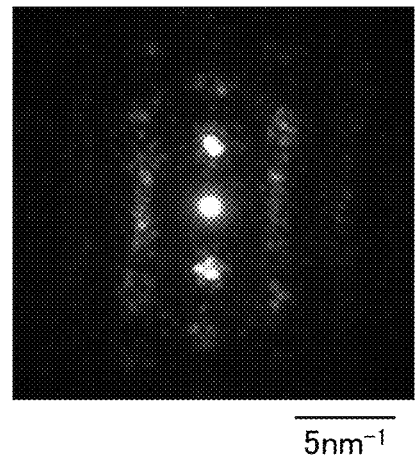

205
230a,230b,243B,242B  206

SEMICONDUCTOR DEVICE AND METHOD FOR MANUFACTURING SEMICONDUCTOR DEVICE

TECHNICAL FIELD

One embodiment of the present invention relates to a transistor, a semiconductor device, and an electronic device. One embodiment of the present invention relates to a method for manufacturing a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (a liquid crystal display device, a light-emitting display device, and the like), a projection device, a lighting device, an electro-optical device, a power storage device, a storage device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

In recent years, semiconductor devices have been developed and an LSI, a CPU, and a memory are mainly used. A CPU includes semiconductor elements each provided with an electrode that is a connection terminal, which includes a semiconductor integrated circuit (including at least a transistor and a memory) separated from a semiconductor wafer.

A semiconductor integrated circuit (IC chip) of LSIs, CPUs, memories, and the like is mounted on a circuit board, for example, a printed wiring board, to be used as one of components of a variety of electronic devices.

A technique by which a transistor is formed using a semiconductor thin film formed over a substrate having an insulating surface has been attracting attention. Such a transistor is widely used in electronic devices such as an integrated circuit (IC) and an image display device (also simply referred to as a display device). A silicon-based semiconductor material is widely known as a semiconductor thin film applicable to the transistor; in addition, an oxide semiconductor has been attracting attention as another material.

It is known that a transistor using an oxide semiconductor has an extremely low leakage current in a non-conduction state. For example, a low-power CPU utilizing a characteristic of a low leakage current of the transistor using an oxide semiconductor has been disclosed (see Patent Document 1). Furthermore, a storage device that can retain data for a long time by utilizing a characteristic of low leakage current of the transistor using an oxide semiconductor is disclosed, for example (see Patent Document 2).

In recent years, demand for an integrated circuit with higher density has risen with reductions in size and weight of electronic devices. Furthermore, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device in which variation of transistor characteristics is small. Another object of one embodiment of the present invention is to provide a semiconductor device with high productivity. Another object of one embodiment of the present invention is to provide a highly reliable semiconductor device. Another object of one embodiment of the present invention is to provide a semiconductor device having excellent electrical characteristics. Another object of one embodiment of the present invention is to provide a semiconductor device with a high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. In one embodiment of the present invention, there is no need to achieve all the objects. Other objects are apparent from and can be derived from the description of the specification, the drawings, the claims, and the like.

Means for Solving the Problems

One embodiment of the present invention is a semiconductor device including a transistor, a first and a second conductor, and a first to a third insulator; the transistor and the first conductor are provided over the first insulator; the transistor includes an oxide semiconductor; the second insulator is provided over the transistor; the first conductor includes a region not overlapping with the second insulator; the third insulator is provided to cover the first conductor, the transistor, and the second insulator; and the second conductor is provided over the third insulator and at least partly overlaps with the first conductor.

One embodiment of the present invention is a semiconductor device including a first and a second oxide, a first to a sixth conductor, and a first to a sixth insulator; the first conductor is provided over the first insulator; the second insulator is provided over the first conductor; the first oxide is provided over the second insulator; the second conductor and the third conductor are provided over the first oxide; the third insulator is provided over the second conductor and the third conductor; the second oxide is provided between the second conductor and the third conductor over the first oxide; the fourth insulator is provided over the second oxide; the fourth conductor is provided over the fourth insulator; the fifth conductor is provided over the first insulator and includes a region not overlapping with the third insulator;

the fifth insulator is provided to cover the second insulator, the third insulator, and the fifth conductor; and the sixth conductor is provided over the fifth insulator and at least partly overlaps with the fifth conductor.

In the above, the fifth insulator is preferably in contact with the first insulator in a region where the fifth insulator does not overlap with the second insulator, the third insulator, and the fifth conductor, and the sixth conductor at least partly overlaps with a region where the fifth insulator and the first insulator are in contact with each other. In the above, a top surface of the sixth conductor is preferably and substantially level with a top surface of the fifth insulator in a region overlapping with the second insulator.

In the above, the fifth insulator is preferably in contact with a side surface of the third insulator, a side surface of the second insulator, and a top surface and a side surface of the fifth conductor. In the above, the first insulator and the fifth insulator are preferably a nitride containing silicon. In the above, the fifth insulator preferably has a stacked-layer structure.

In the above, a top surface of the third insulator, a top surface of the second oxide, a top surface of the fourth insulator, and a top surface of the fourth conductor are preferably and substantially level with each other.

In the above, it is preferable that the fifth conductor at least partly overlap with the third insulator.

In the above, it is preferable that the first conductor and the fifth conductor be integrated in an island-like shape.

In the above, it is preferable that the fifth conductor does not overlap with the third insulator, and the fifth insulator be in contact with one side surface of the fifth conductor and a side surface opposite to the one side surface.

In the above, the third conductor is preferably and electrically connected to the sixth conductor.

In the above, an opening reaching the fifth conductor is preferably formed in the second insulator and the first oxide, and the third conductor is preferably in contact with the fifth conductor through the opening.

Effect of the Invention

According to one embodiment of the present invention, a semiconductor device in which variation of transistor characteristics is small can be provided. According to one embodiment of the present invention, a semiconductor device with high productivity can be provided. According to one embodiment of the present invention, a highly reliable semiconductor device can be provided. According to one embodiment of the present invention, a semiconductor device having excellent electrical characteristics can be provided. According to one embodiment of the present invention, a semiconductor device with a high on-state current can be provided. According to one embodiment of the present invention, a semiconductor device that can be miniaturized or highly integrated can be provided. Alternatively, according to one embodiment of the present invention, a semiconductor device with low power consumption can be provided.

Note that the description of these effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 4A is a table showing classifications of crystal structures of IGZO. FIG. 4B is a graph showing an XRD spectrum of a CAAC-IGZO film. FIG. 4C is an image showing a nanobeam electron diffraction pattern of a CAAC-IGZO film.

MODE FOR CARRYING OUT THE INVENTION

Figure 1A:
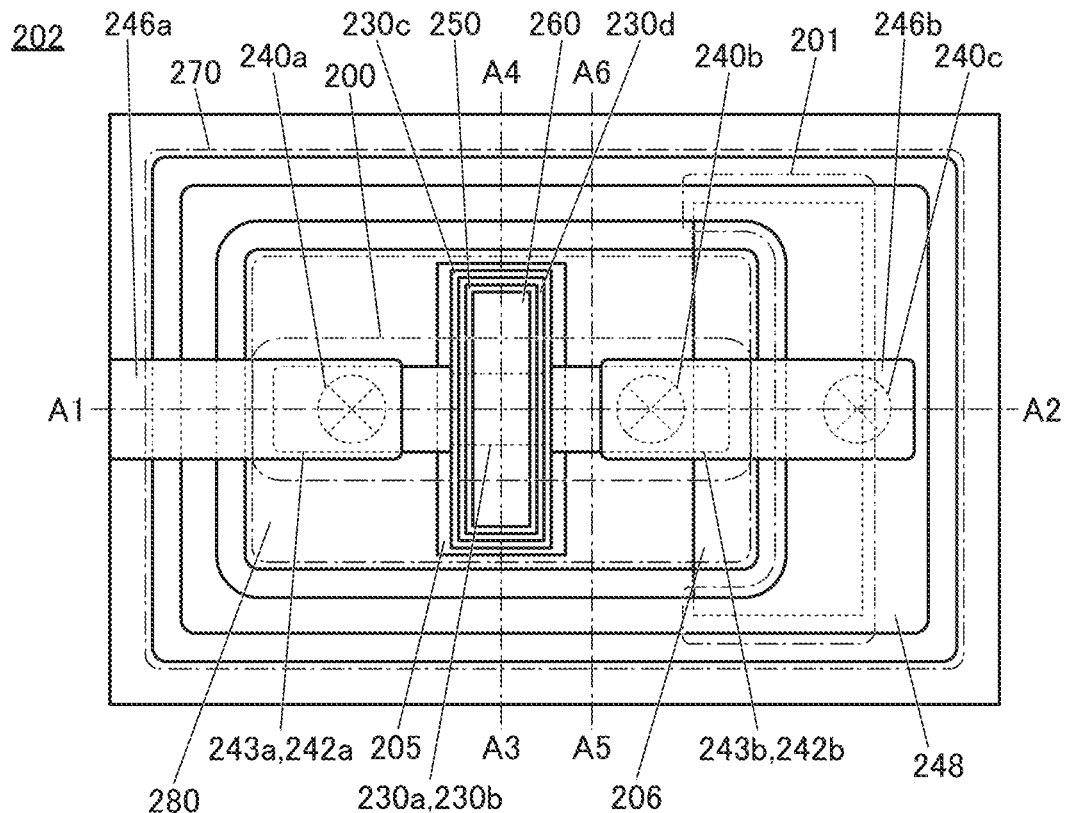
FIG. 1A is a top view of a semiconductor device of one embodiment of the present invention.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding of the invention. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a plan view), a perspective view, or the like, some components might not be illustrated for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which are used to specify one embodiment of the present invention in some cases.

In this specification and the like, terms for describing arrangement, such as "over" and "below", are used for convenience to describe the positional relation between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, and the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, and the average value in a channel formation region.

Note that in this specification and the like, depending on transistor structures, channel width in a region where a channel is actually formed (hereinafter also referred to as "effective channel width") is different from channel width illustrated in a top view of a transistor (hereinafter also referred to as "apparent channel width") in some cases. For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate with actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, in the case of an oxide semiconductor, oxygen vacancies (also referred to as Vo) are formed by entry of impurities in some cases, for example.

Note that in this specification and the like, silicon oxynitride is a matter that contains more oxygen than nitrogen in its composition. Moreover, silicon nitride oxide is a matter that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to $-10°$ and less than or equal to $10°$. Accordingly, the case where the angle is greater than or equal to $-5°$ and less than or equal to $5°$ is also included. Furthermore, "substantially parallel" indicates a state where two straight lines are placed at an angle greater than or equal to $-30°$ and less than or equal to $30°$. Moreover, "perpendicular" indicates a state where two straight lines are placed at an angle greater than or equal to $80°$ and less than or equal to $100°$. Accordingly, the case where the angle is greater than or equal to $85°$ and less than or equal to $95°$ is also included. Furthermore, "substantially perpendicular" indicates a state where two straight lines are placed at an angle greater than or equal to $60°$ and less than or equal to $120°$.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that a drain current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Embodiment 1

In this embodiment, an example of a semiconductor device including a memory device 202 of one embodiment of the present invention and a manufacturing method thereof are described below using FIG. 1 to FIG. 30.

<Structure Example of Semiconductor Device>

Figure 1B:
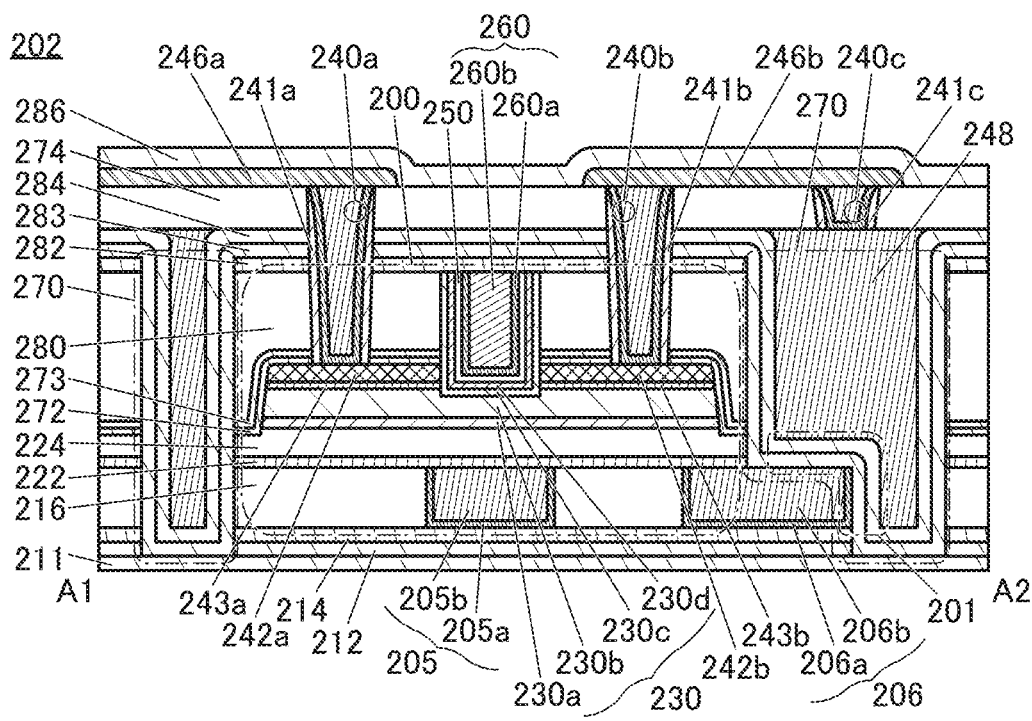
FIG. 1B is a cross-sectional view of the semiconductor device of one embodiment of the present invention.
Figure 2A:
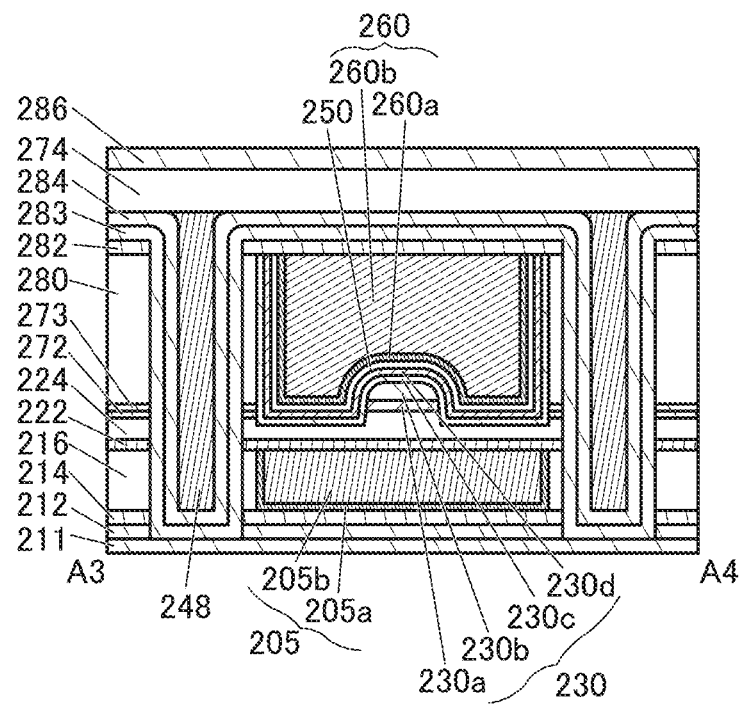
FIG. 2A and FIG. 2B are cross-sectional views of the semiconductor device of one embodiment of the present invention.
Figure 2B:
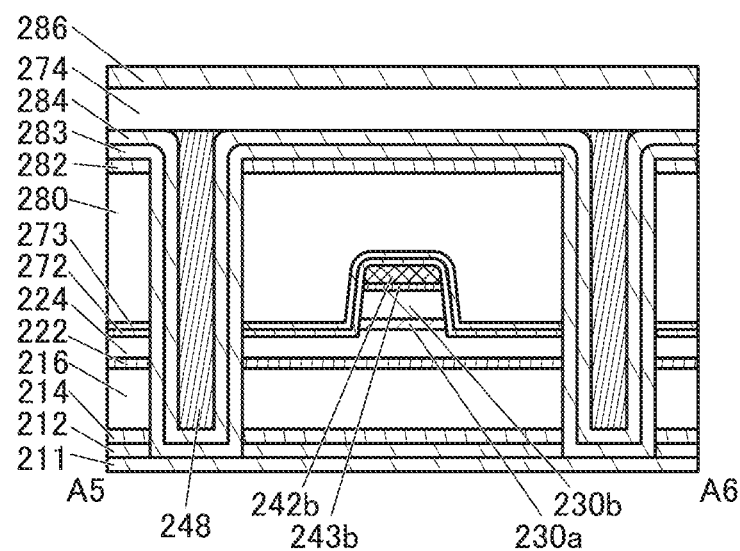

A structure of a memory device 202 including a transistor 200 and a capacitor 201 is described using FIG. 1A, FIG. 1B, FIG. 2A, and FIG. 2B. FIG. 1A is a top view of the memory device 202. FIG. 1B, FIG. 2A, and FIG. 2B are cross-sectional views of the memory device 202. Here, FIG. 1B is a cross-sectional view of a portion indicated with a dashed-dotted line A1-A2 in FIG. 1A, and is a cross-sectional view in the channel length direction of the transistor 200. FIG. 2A is a cross-sectional view of a portion indicated with a dashed-dotted line A3-A4 in FIG. 1A, and is a cross-sectional view in the channel width direction of the transistor 200. FIG. 2B is a cross-sectional view of a portion indicated with a dashed-dotted line A5-A6 in FIG. 1A. Note that for clarity of the drawing, some components are not shown in the top view of FIG. 1A.

The semiconductor device of one embodiment of the present invention includes an insulator 211 over a substrate (not shown), an insulator 212 over the insulator 211, an insulator 214 over the insulator 212, the transistor 200 and the capacitor 201 over the insulator 214, an insulator 280 over the transistor 200, an insulator 282 over the insulator 280, an insulator 283 over the insulator 282, an insulator 284 over the insulator 283, and an insulator 274 over the insulator 284. The transistor 200 includes an oxide 230 (an oxide 230a, an oxide 230b, an oxide 230c, and an oxide 230d). The insulator 211, the insulator 212, the insulator 214, the insulator 280, the insulator 282, the insulator 283, the insulator 284, and the insulator 274 function as interlayer films. A conductor 240 (a conductor 240a, a conductor 240b, and a conductor 240c) that is electrically connected to the transistor 200 and functions as a plug is also included. Note that an insulator 241 (an insulator 241a, an insulator 241b, and an insulator 241c) is provided in contact with side surfaces of the conductor 240 functioning as a plug. A conductor 246 (a conductor 246a and a conductor 246b) that is electrically connected to the conductor 240 and functions as a wiring is provided over the insulator 274 and the conductor 240. The insulator 286 is provided over the conductor 246 and the insulator 274.

The transistor 200 includes an insulator 216 over the insulator 214; a conductor 205 (a conductor 205a and a conductor 205b) disposed so as to be embedded in the insulator 216 or the insulator 216; an insulator 222 over the insulator 216 and the conductor 205; an insulator 224 over the insulator 222; an oxide 230a over the insulator 224; an oxide 230b over the oxide 230a; an oxide 243 (an oxide 243a and an oxide 243b) and an oxide 230c over the oxide 230b; a conductor 242a over the oxide 243a; a conductor 242b over the oxide 243b; an oxide 230d over the oxide 230c; an insulator 250 over the oxide 230d; a conductor 260 (a conductor 260a and a conductor 260b) that is positioned over the insulator 250 and partly overlaps with the oxide 230c; an insulator 272 in contact with part of the top surface of the insulator 224, part of the side surface of the oxide 230a, part of the side surface of the oxide 230b, the side surface of the oxide 243a, the side surface of the oxide 243b, the side surface of the conductor 242a, the top surface of the conductor 242a, the side surface of the conductor 242b, and the top surface of the conductor 242b; and an insulator 273 over the insulator 272. The insulator 280 is positioned over the insulator 273. The oxide 230c is in contact with the side surface of the oxide 243a, the side surface of the oxide 243b, the side surface of the conductor 242a, and the side surface of the conductor 242b. Here, as shown in FIG. 1B and FIG. 2A, the top surface of the conductor 260 is positioned to be substantially level with the top surface of the insulator 250, the top surface of the oxide 230d, and the top surface of the oxide 230c. The insulator 282 is in contact with the top surfaces of the conductor 260, the insulator 250, the oxide 230d, the oxide 230c, and the insulator 280. The conductor 242a and the conductor 242b might be collectively referred to as a conductor 242 in the following descriptions.

An opening reaching the oxide 230b is provided in the insulator 280, the insulator 273, and the insulator 272. A groove and a slit, for example, are included in the category of the opening. A region where an opening is formed is referred to as an opening portion in some cases. The oxide 230d, the oxide 230c, the insulator 250, and the conductor 260 are provided in the opening. In addition, in the channel length direction of the transistor 200, the conductor 260, the insulator 250, the oxide 230d, and the oxide 230c are provided between the conductor 242a and the oxide 243a and the conductor 242b and the oxide 243b. The insulator 250 includes a region in contact with the side surface of the conductor 260 and a region in contact with the bottom surface of the conductor 260. The oxide 230c in a region overlapping with the oxide 230b includes part in contact with the oxide 230b, part facing the side surface of the conductor 260 with the insulator 250 therebetween, and part overlapping with the bottom surface of the conductor 260 with the insulator 250 therebetween.

As shown in FIG. 1A and FIG. 1B, an opening 270 reaching the insulator 211 is formed in the insulator 212, the insulator 214, the insulator 216, the insulator 222, the insulator 224, the insulator 272, the insulator 273, the insulator 280, and the insulator 282. The opening 270 is provided to surround the transistor 200. The capacitor 201 is formed in a region of the opening 270 which overlaps with a conductor 206 (a conductor 206a and a conductor 206b). In this specification and the like, a space in the opening 270 is referred to as the inside of the opening 270 in some cases. Furthermore, in this specification and the like, a region surrounded by the opening 270 in a top view like the insulator 280 in FIG. 1A is referred to as the inside of the region surrounded with the opening 270 in some cases.

The capacitor 201 includes the conductor 206 over the insulator 214, an insulator 283 covering the insulator 282, the insulator 280, the transistor 200, and the conductor 206, an insulator 284 over the insulator 283, and a conductor 248 which is provided over the insulator 284 and at least part of which overlaps with the conductor 206. The conductor 206 functions as the lower electrode of the capacitor 201, the insulator 283 and the insulator 284 function as dielectrics of the capacitor 201, and the conductor 248 functions as the upper electrode of the capacitor 201. In other words, the capacitor 201 forms a MIM (Metal-Insulator-Metal) capacitor.

The conductor 206 is a conductor formed in the same layer as the conductor 205 and at least a side surface thereof is in contact with the insulator 216. The conductor 206 has a region not overlapping with the insulator 222, the insulator 224, the insulator 280, or the like and the region overlaps with the opening 270. As shown in FIG. 1B, at least part of the conductor 206 may overlap with the insulator 222, the insulator 224, and the insulator 280.

The insulator 283 is in contact with the insulator 211 in a region not overlapping with the insulator 222, the insulator 224, the insulator 280, or the conductor 206, i.e., at the bottom of the opening 270. The insulator 283 is preferably provided in contact with a top surface of the insulator 211, a side surface of the insulator 212, a side surface of the insulator 214, a side surface of the insulator 216, a side surface of the insulator 222, a side surface of the insulator 224, a side surface of the insulator 272, a side surface of the insulator 273, a side surface of the insulator 280, a side surface of the insulator 282, and a top surface of the insulator 282. The insulator 283 is preferably in contact with a top surface and a side surface of the conductor 206 in the opening 270 as shown in FIG. 1B. The insulator 283 is provided in contact with a bottom surface and an inner wall of the opening 270 and the insulator 284 is provided inside the insulator 283.

The conductor 248 is provided inside the insulator 284. The conductor 248 is provided to be embedded inside the opening 270. At least part of the conductor 248 preferably overlaps with a region in which the insulator 283 is in contact with the insulator 211. It is preferable that a top surface of the conductor 248 be substantially level with a top surface of the region of the insulator 284 overlapping with the insulator 280.

In the opening 270, the capacitor 201 is formed in a region where the conductor 248 overlaps with a top surface of the conductor 206 with the insulator 283 and the insulator 284 therebetween, and in a region where the conductor 248 faces the side surface of the conductor 206 with the insulator 283 and the insulator 284 therebetween, as shown in FIG. 1A and FIG. 1B.

In the opening 270 formed to surround the transistor 200, the insulator 283 is in contact with the insulator 211 in a region where the insulator 283 does not overlap with the conductor 206 as shown in FIG. 1A, FIG. 1B, FIG. 2A, and FIG. 2B. The insulator 283 is in contact with the side surface of the insulator 212. Accordingly, the components of the transistor 200 including the oxide 230 and the like, the insulator 214, the insulator 216, the insulator 222, the insulator 224, the insulator 272, the insulator 273, the insulator 280, and the insulator 282 are isolated from the outside with the insulator 283, the insulator 284, the insulator 211, and the insulator 212. In other words, the transistor 200 is positioned in a region sealed with the insulator 283, the insulator 284, the insulator 211, and the insulator 212. Over and under the transistor 200, the insulator 214 and the insulator 282 are further provided inside the insulator 283.

Here, the insulator 211, the insulator 212, the insulator 214, the insulator 282, the insulator 283, and the insulator 284 are preferably insulators in which impurities such as hydrogen are less likely to be diffused, and for example, insulators in which impurities such as hydrogen are less likely to be diffused than the insulator 280 or the insulator 274. For example, the insulator 211, the insulator 212, the insulator 283, and the insulator 284 are preferably formed using materials having a function of inhibiting the diffusion of hydrogen and oxygen. In addition, for example, the insulator 214 and the insulator 282 are preferably formed using materials having a function of trapping and fixing hydrogen. Typically, silicon nitride can be used for the insulator 211, the insulator 212, the insulator 283, and the insulator 284. Typically, aluminum oxide can be used for the insulator 214 and the insulator 282.

As described above, it can be said that the transistor 200 is placed in a region sealed with insulators in which impurities such as hydrogen are less likely to be diffused. This can reduce impurities such as hydrogen diffusing in the transistor 200, the insulator 280, the insulator 216, the insulator 224, and the like and then mixing with the oxide 230.

The insulator 241a is provided in contact with the inner wall of the opening in an insulator 272, an insulator 273, the insulator 280, the insulator 282, the insulator 283, the insulator 284, and the insulator 274; the first conductor of the conductor 240a is provided in contact with the side surface of the insulator 241a; and the second conductor of the conductor 240a is provided on the inner side thereof. The insulator 241b is provided in contact with the inner wall of the opening in an insulator 272, an insulator 273, the insulator 280, the insulator 282, the insulator 283, the insulator 284, and the insulator 274; the first conductor of the conductor 240b is provided in contact with the side surface of the insulator 241b; and the second conductor of the conductor 240b is provided on the inner side thereof. In contact with the inner wall of an opening formed in an insulator 274, the insulator 241c is provided. In contact with the side surface of the insulator 241c, a first conductor of the conductor 240c is provided, and a second conductor of the conductor 240c is further provided on the inner side. Here, the level of a top surface of the conductor 240 and the level of a top surface of the insulator 274 can be substantially the same. Note that although the transistor 200 has a structure in which the first conductor of the conductor 240 and the second conductor of the conductor 240 are stacked, the present invention is not limited thereto. The conductor 240 may have a single-layer structure or a stacked-layer structure of three or more layers, for example. In the case where a structure body has a stacked-layer structure, layers may be distinguished by ordinal numbers corresponding to the formation order.

In the transistor 200, the conductor 260 functions as a first gate (also referred to as a top gate) electrode, and the conductor 205 functions as a second gate (also referred to as a back gate) electrode. The insulator 250 functions as a first gate insulator, and the insulator 224 functions as a second gate insulator. The conductor 242a has a function as one of the source and the drain, and the conductor 242b has a function of the other of the source and the drain. A region of the oxide 230 that overlaps with the conductor 260 at least partly functions as a channel formation region.

In the transistor 200, a metal oxide functioning as a semiconductor is preferably used in the oxide 230 including the channel formation region. The oxide 230 preferably includes the oxide 230a positioned over the insulator 224, the oxide 230b positioned over the oxide 230a, the oxide 230c that is positioned over the oxide 230b and is at least partly in contact with the oxide 230b, and the oxide 230d positioned over the oxide 230c.

The metal oxide functioning as a semiconductor has a band gap of preferably 2 eV or higher, further preferably 2.5 eV or higher. With use of a metal oxide having such a wide bandgap, the off-state current of the transistor can be reduced.

As the oxide 230, for example, a metal oxide such as an In-M-Zn oxide including indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. An In—Ga oxide, an In—Zn oxide, or an indium oxide may be used as the oxide 230.

The atomic ratio of In to the element M in the metal oxide used as the oxide 230b or the oxide 230c is preferably greater than that of the metal oxide used as the oxide 230a or the oxide 230d.

The oxide 230a is under the oxide 230b or the oxide 230c, whereby impurities and oxygen can be inhibited from being diffused into the oxide 230b or the oxide 230c from the structure bodies formed under the oxide 230a.

The oxide 230d is over the oxide 230b or the oxide 230c, whereby impurities can be inhibited from being diffused into the oxide 230b or the oxide 230c from structure bodies formed above the oxide 230d. The oxide 230d is provided over the oxide 230b or the oxide 230c, whereby the diffusion of oxygen upward from the oxide 230b or the oxide 230c can be inhibited.

When the oxide 230a to the oxide 230d contain a common element as the main component besides oxygen, the density of defect states at each interface between the oxide 230a, the oxide 230b, the oxide 230c, and the oxide 230d can be low. In that case, a main carrier path is the oxide 230b, the oxide 230c, or the vicinity thereof, for example, the interface between the oxide 230b and the oxide 230c. Since the density of defect states at the interface between the oxide 230b and the oxide 230c can be decreased, the influence of interface scattering on carrier conduction is small, and a high on-state current can be obtained.

The oxide 230b and the oxide 230c preferably have crystallinity. It is particularly preferable to use a CAAC-OS (c-axis aligned crystalline oxide semiconductor) as the oxide 230b and the oxide 230c. The oxide 230d may also have crystallinity.

The CAAC-OS is a metal oxide having a dense structure with high crystallinity and a low amount of impurities or defects (e.g., Vo). On the other hand, a clear crystal grain boundary is difficult to observe in the CAAC-OS; thus, it can be said that a reduction in electron mobility due to the crystal grain boundary is unlikely to occur. Thus, a metal oxide including a CAAC-OS is physically stable. Therefore, the metal oxide including a CAAC-OS is resistant to heat and has high reliability. In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained.

An oxide semiconductor with a low carrier concentration is preferably used as the oxide 230 (e.g., the oxide 230b). In order to reduce the carrier concentration of the oxide semiconductor, the concentration of impurities in the oxide semiconductor is reduced so that the density of defect states can be reduced. In this specification and the like, a state with a low impurity concentration and a low density of defect states is referred to as a highly purified intrinsic or substantially highly purified intrinsic state. Examples of impurities contained in the oxide semiconductor include hydrogen, nitrogen, alkali metal, alkaline earth metal, iron, nickel, and silicon.

Specifically, hydrogen contained in an oxide semiconductor reacts with oxygen bonded to a metal atom to be water, and thus sometimes causes Vo in the oxide semiconductor. In some cases, a defect where hydrogen enters an oxygen vacancy (hereinafter, sometimes referred to as VoH) functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics. Uneven distribution of hydrogen concentration in the surface may cause variation of electrical characteristics of transistors according to the distribution of hydrogen concentration. Moreover, hydrogen in an oxide semiconductor is easily transferred by a stress such as heat or an electric field; thus, a large amount of hydrogen in an oxide semiconductor might reduce the reliability of the transistor.

Accordingly, in the case where an oxide semiconductor is used as the oxide 230, the amount of VoH in the oxide 230 is preferably reduced as much as possible so that the oxide 230 becomes a highly purified intrinsic or substantially highly purified intrinsic oxide. To obtain such an oxide semiconductor in which VoH is sufficiently reduced, it is important to remove impurities such as moisture and hydrogen in the oxide semiconductor (also may be referred to as dehydration treatment or dehydrogenation treatment). When an oxide semiconductor with sufficiently reduced impurities such as VoH is used for a channel formation region of a transistor, the transistor can have stable electrical characteristics.

However, even when an oxide semiconductor is formed to have a low hydrogen concentration, hydrogen might be taken from an insulating film which functions as an interlayer film and in contact with the oxide semiconductor. For example, in the case where an insulating film functioning as an interlayer film is formed, a large amount of highly reactive hydrogen (e.g., a hydrogen radical) is generated during the formation and a large amount of hydrogen may be taken in the insulating film functioning as an interlayer film. The large amount of hydrogen taken in the insulating film functioning as an interlayer film might be partly diffused into the oxide 230 through the conductor 240 or the like functioning as a via hole due to heat treatment or the like in the manufacturing process of the transistor 200. As described above, the hydrogen concentration of the oxide semiconductor may be increased due to hydrogen contained in the insulating film functioning as an interlayer film.

In view of the above, the transistor 200 of this embodiment including the insulator 280 is sealed with insulating films in which hydrogen is not likely to diffuse (e.g., the insulator 211, the insulator 212, the insulator 283, the insulator 284), whereby hydrogen is inhibited from entering the insulator 280 and the transistor 200. It is preferable that the insulator 211, the insulator 212, the insulator 283, and the insulator 284 have a function of inhibiting the diffusion of hydrogen (e.g., at least one of a hydrogen atom and a hydrogen molecule). The insulator 212, the insulator 212, the insulator 283, and the insulator 284 formed between the block including the transistor 200 and the insulator 280 and the interlayer films such as the insulator 274 can inhibit hydrogen contained in the interlayer films from entering the block including transistor 200 and the insulator 280. Thus, the amount of hydrogen diffused in the conductor 242, the oxide 230, or the like can be reduced.

By sealing the block including the transistor 200 and the insulator 280 with the insulator 211, the insulator 212, the insulator 283, and the insulator 284 in such a manner, the hydrogen concentration in the oxide 230 can be reduced. The hydrogen concentration of the oxide 230b, which is measured using secondary ion mass spectrometry (SIMS), can be lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$, for example. The oxide 230 with sufficiently reduced impurities such as hydrogen is used in the channel formation region of the transistor 200, whereby the transistor can have normally-off characteristics, stable electrical characteristics, and improved reliability. The diffusion of hydrogen into the transistor 200 is suppressed, whereby variation in electrical characteristics of transistors according to the distribution of hydrogen concentration in the surface.

Furthermore, the capacitor 201 can be manufactured using no additional mask to the manufacturing process of the transistor 200 having the sealed structure described above. In other words, part of the manufacturing process of the transistor 200 can be used for part of the manufacturing process of the capacitor 201. Thus, the memory device 202 of one embodiment of the present invention can be manufactured with high productivity.

With the structure above, a semiconductor device with small variation in transistor characteristics can be provided. A highly reliable semiconductor device can be provided. A semiconductor device having excellent electrical characteristics can be provided. A semiconductor device with high productivity can be provided.

In a cross-sectional view of the transistor in the channel length direction, it is preferable that a groove portion be provided in the oxide 230b and the oxide 230c be embedded in the groove portion in the transistor 200. At this time, the oxide 230c is provided to cover the inner wall (the side wall and the bottom surface) of the groove. It is preferable that the thickness of the oxide 230c be approximately the same as the depth of the groove.

With such a structure, when an opening in which the conductor 260 and the like are to be embedded, a damaged region, which may be formed on the surface of the oxide 230b at the bottom of the opening, can be removed. This can suppress poor electrical characteristics of the transistor 200 which is caused by the damaged region.

FIG. 1A, FIG. 1B, and the like show the structure in which the side wall of the opening in which the conductor 260 and the like are embedded is substantially perpendicular to the formation surface of the oxide 230b including the groove of the oxide 230b; this embodiment is not limited thereto. For example, the opening may have a U-shape with a bottom portion having a moderate curve. For example, the side surface of the opening may be tilted with respect to the surface on which the oxide 230b is formed.

As shown in FIG. 2A, a curved surface is preferably provided between the side surface of the oxide 230b and the top surface of the oxide 230b in a cross-sectional view in the channel width direction of the transistor 200. That is, an end portion of the side surface and an end portion of the top surface may be curved (such a shape is hereinafter also referred to as a rounded shape). Here, in a region where the oxide 230b overlaps with the oxide 230c, the oxide 230c is provided in contact with the top surface and the side surface of the oxide 230b and the side surface of the oxide 230a as shown in FIG. 2A.

The radius of curvature of the curved surface is preferably greater than 0 nm and less than the thickness of the oxide 230b in a region overlapping with the conductor 242, or less than half of the length of a region of the top surface of the oxide 230b that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the groove with the insulator 250 and the conductor 260, which are formed in a later step. Furthermore, reduction in the length of the region of the top surface of the oxide 230b that does not have the curved surface can be prevented, and decrease in the on-state current and mobility of the transistor 200 can be inhibited. Thus, a semiconductor device with excellent electrical characteristics can be provided.

The oxide 230 preferably has a stacked-layer structure of a plurality of oxide layers with different chemical compositions. Specifically, the atomic ratio of the element M to the metal element as the main component in the metal oxide used as the oxide 230a is preferably greater than the atomic ratio of the element M to the metal element as the main component in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a.

In order to make the oxide 230c serve as a main carrier path, the atomic ratio of indium to a metal element that is a main component in the oxide 230c is preferably higher than that in the oxide 230b. When a metal oxide having a high content of indium is used for a channel formation region, the on-state current of the transistor can be increased. Accordingly, when the atomic ratio of indium to a metal element that is a main component of the oxide 230c is higher than the atomic ratio of indium to a metal element of a main component in the oxide 230b, the oxide 230c can serve as a main carrier path.

The conduction band minimum of the oxide 230c is remoter from the vacuum level than that of the oxide 230a and the oxide 230b. In other words, the electron affinity of the oxide 230c is preferably larger than that of the oxide 230a and the oxide 230b. At this time, the oxide 230c serves as a main carrier path.

As the oxide 230c, specifically, a metal oxide having a composition of In:M:Zn=4:2:3 [atomic ratio] or in the neighborhood of the composition, In:M:Zn=5:1:3 [atomic ratio] or in the neighborhood of the composition, or In:M:Zn=10:1:3 [atomic ratio] or in the neighborhood of the composition, indium oxide, or the like may be used.

A shift voltage (Vsh) measured with +GBT (Gate Bias Temperature) stress test is given as a parameter to evaluate the reliability of a transistor. The shift voltage (Vsh) is defined as gate voltage (Vg) at which, in a drain current (Id)-gate voltage (Vg) curve of a transistor, the tangent at a point where the slope of the curve is the steepest intersects the straight line of Id=1 pA. Furthermore, the amount of change in Vsh is represented as ΔVsh.

The ΔVsh of a transistor under a +GBT stress test shifts in the negative direction with time in some cases. In addition, ΔVsh sometimes shows the behavior of shifting to not one direction (e.g., a negative direction) but both the negative direction and the positive direction. Note that this behavior is sometimes referred to as jagged behavior of ΔVsh in +GBT stress tests in this specification and the like.

When the metal oxide including the element M not as its main component or the metal oxide with a small ratio of the element M is used as the oxide 230c, ΔVsh can be reduced and jagged behavior of ΔVsh can be suppressed, for example, whereby the reliability of a transistor can be improved.

The oxide 230b and the oxide 230c are preferably an oxide having crystallinity such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can suppress oxygen extraction from the oxide 230b even when heat treatment is performed; thus, the transistor 200 is stable with respect to high temperatures in a manufacturing process (what is called thermal budget).

In addition, a CAAC-OS is preferably used for the oxide 230c; the c-axis of a crystal included in the oxide 230c is preferably aligned in a direction substantially perpendicular to the formation surface or top surface of the oxide 230c. The CAAC-OS has a property of making oxygen move easily in the direction perpendicular to the c-axis. Thus, oxygen contained in the oxide 230c can be efficiently supplied to the oxide 230b.

The oxide 230d preferably contains at least one of the metal elements contained in the metal oxide used as the oxide 230c, and further preferably contains all of these metal elements. For example, it is preferable that an In-M-Zn oxide, an In—Zn oxide, or an indium oxide be used as the oxide 230c, and an In-M-Zn oxide, a M-Zn oxide, or an oxide of the element M be used as the oxide 230d. Accordingly, the density of defect states at the interface between the oxide 230c and the oxide 230d can be decreased.

The conduction band minimum of the oxide 230d is preferably closer to the vacuum level than the conduction band minimum of the oxide 230c. In other words, the electron affinity of the oxide 230d is preferably smaller than the electron affinity of the oxide 230c. In that case, a metal oxide that can be used for the oxide 230a or the oxide 230b is preferably used for the oxide 230d. At this time, the oxide 230c serves as a main carrier path.

Specifically, as the oxide 230c, a metal oxide with a composition of In:M:Zn=4:2:3 [atomic ratio] or in the neighborhood of the composition, In:M:Zn=5:1:3 [atomic ratio] or in the neighborhood of the composition, or In:M:Zn=10:1:3 [atomic ratio] or in the neighborhood of the composition, or indium oxide may be used. For the oxide 230d, a metal oxide with a composition of In:M:Zn=1:3:4 [atomic ratio] or in the neighborhood of the composition, M:Zn=2:1 [atomic ratio] or in the neighborhood of the composition, M:Zn=2:5 [atomic ratio] or in the neighborhood of the composition, or an oxide of the element M is used.

The oxide 230d is preferably a metal oxide that inhibits diffusion or passage of oxygen more readily than the oxide 230c. Providing the oxide 230d between the insulator 250 and the oxide 230c can inhibit the diffusion of oxygen contained in the insulator 280 into the insulator 250. Thus, the oxygen can be efficiently supplied to the oxide 230b through the oxide 230c.

When the atomic ratio of In to the metal element as the main component in the metal oxide used as the oxide 230d is smaller than the atomic ratio of In to the metal element as the main component in the metal oxide used as the oxide 230c, the diffusion of In to the insulator 250 side can be inhibited. Since the insulator 250 functions as a gate insulator, the transistor exhibits poor characteristics when In enters the insulator 250 and the like. Thus, the oxide 230d provided between the oxide 230c and the insulator 250 enables the provision of a semiconductor device with high reliability.

Here, the conduction band minimum gradually changes at junction portions of the oxide 230a, the oxide 230b, the oxide 230c, and the oxide 230d. In other words, the conduction band minimum at the junction portions of the oxide 230a, the oxide 230b, the oxide 230c, and the oxide 230d continuously changes or is continuously connected. To obtain this, the density of defect states in a mixed layer formed at the interface between the oxide 230a and the oxide 230b, the interface between the oxide 230b and the oxide 230c, and the interface between the oxide 230c and the oxide 230d is preferably decreased.

Specifically, when the oxide 230a and the oxide 230b, the oxide 230b and the oxide 230c, and the oxide 230c and the oxide 230d contain the same element as a main component in addition to oxygen, a mixed layer with a low density of defect states can be formed. For example, in the case where the oxide 230b is an In-M-Zn oxide, an In-M-Zn oxide, an M-Zn oxide, an oxide of the element M, an In—Zn oxide, indium oxide, or the like may be used as the oxide 230a, the oxide 230c, and the oxide 230d.

Specifically, as the oxide 230a, a metal oxide with a composition In:M:Zn=1:3:4 [atomic ratio] or a neighborhood thereof, or In:M:Zn=1:1:0.5 [atomic ratio] or a neighborhood thereof is used. As the oxide 230b, a metal oxide with a composition of In:M:Zn=1:1:1 [atomic ratio] or in the neighborhood of the composition, or In:M:Zn=4:2:3 [atomic ratio] or in the neighborhood of the composition may be used. As the oxide 230c, a metal oxide with a composition of In:M:Zn=4:2:3 [atomic ratio] or in the neighborhood of the composition, In:M:Zn=5:1:3 [atomic ratio] or in the neighborhood of the composition, or In:M:Zn=10:1:3 [atomic ratio] or in the neighborhood of the composition, or indium oxide may be used. Note that a composition in the neighborhood includes the range of ±30% of an intended atomic ratio.

Gallium is preferably used as the element M. As the oxide 230d, a metal oxide with a composition of In:M:Zn=1:3:4 [atomic ratio] or in the neighborhood of the composition, M:Zn=2:1 [atomic ratio] or in the neighborhood of the composition, M:Zn=2:5 [atomic ratio] or in the neighborhood of the composition, or an oxide of the element M is used.

When the metal oxide is deposited by a sputtering method, the above atomic ratio is not limited to the atomic ratio of the deposited metal oxide and may be the atomic ratio of a sputtering target used for depositing the metal oxide.

When the oxide 230a, the oxide 230b, the oxide 230c, and the oxide 230d have the above structure, the density of defect states at the interface between the oxide 230a and the oxide 230b, the interface between the oxide 230b and the oxide 230c, and the interface between the oxide 230c and the oxide 230d can be made low. Thus, the influence of interface scattering on carrier conduction is small, and the transistor 200 can have a high on-state current and excellent frequency characteristics.

Although a structure in which the oxide 230 has a four-layer stacked structure of the oxide 230a, the oxide 230b, the oxide 230c, and the oxide 230d in the transistor 200 is described, the present invention is not limited thereto.

For example, the oxide 230 may be a single layer of the oxide 230b or has a two-layer structure of the oxide 230a and the oxide 230b, a two-layer structure of the oxide 230b and the oxide 230c, a three-layer structure of the oxide 230a, the oxide 230b, and the oxide 230c, or a stacked-layer structure including five or more layers. Alternatively, each of the oxide 230a, the oxide 230b, the oxide 230c, and the oxide 230d may have a stacked-layer structure.

The insulator 211, the insulator 212, the insulator 214, the insulator 272, the insulator 273, the insulator 282, the insulator 283, the insulator 284, and the insulator 286 preferably function as barrier insulating films, each of which inhibits the diffusion of impurities such as water and hydrogen from the substrate side or above the transistor 200 into the transistor 200. Thus, for each of the insulator 211, the insulator 212, the insulator 214, the insulator 272, the insulator 273, the insulator 282, the insulator 283, the insulator 284, and the insulator 286, an insulating material having a function of inhibiting the diffusion of impurities such as hydrogen atoms, hydrogen molecules, water molecules, nitrogen atoms, nitrogen molecules, nitrogen oxide molecules (e.g., $N_2O$, $NO$, or $NO_2$), or copper atoms (through which the impurities are less likely to pass) is preferably used. Alternatively, it is preferable to use an insulating material having a function of inhibiting the diffusion of oxygen (e.g., at least one of an oxygen atom, an oxygen molecule, and the like) (through which the above oxygen is less likely to pass).

Note that in this specification, a barrier insulating film refers to an insulating film having a barrier property. A barrier property in this specification means a function of inhibiting the diffusion of a specific substance (also referred to as having lower permeability of the substance). Alternatively, a barrier property in this specification means a function of trapping or fixing (also referred to as gettering) a specific substance.

Aluminum oxide, hafnium oxide, gallium oxide, indium gallium zinc oxide, silicon nitride, or silicon nitride oxide can be used as the insulator 211, the insulator 212, the insulator 214, the insulator 272, the insulator 273, the insulator 282, the insulator 283, the insulator 284, and the insulator 286, for example. For example, silicon nitride, which has a high hydrogen barrier property, is preferably used as the insulator 211, the insulator 212, the insulator 283, the insulator 284, and the insulator 286. For example, aluminum oxide, which has a function of capturing or fixing more hydrogen, is preferably used as the insulator 214, the insulator 272, the insulator 273, and the insulator 282. Accordingly, impurities such as water and hydrogen can be inhibited from being diffused to the transistor 200 side from the substrate side through the insulator 211, the insulator 212, and the insulator 214. Impurities such as water or hydrogen can be inhibited from being diffused into the transistor 200 side from the insulator 274, the conductor 246, and the like, which are provided outside the insulator 284. Impurities such as water or hydrogen can be inhibited from being diffused into the transistor 200 side from the insulator 280, the conductor 246, and the like, which are provided above the insulator 273. Alternatively, oxygen contained in the insulator 224 or the like can be inhibited from being diffused to the substrate side through the insulator 211, the insulator 212, and the insulator 214. In this manner, the transistor 200 is preferably surrounded by the insulator 211, the insulator 212, the insulator 214, the insulator 272, the insulator 273, the insulator 282, the insulator 283, and the insulator 284 having a function of inhibiting the diffusion of oxygen and impurities such as water and hydrogen.

The resistivities of the insulator 211, the insulator 284, and the insulator 286 are preferably low in some cases. For example, by setting the resistivities of the insulator 211, the insulator 284, and the insulator 286 to approximately $1 \times 10^{13}$ $\Omega$cm, the insulator 211, the insulator 284, and the insulator 286 can sometimes reduce charge up of the conductor 205, the conductor 242, the conductor 260, or the conductor 246 in treatment using plasma or the like in the manufacturing process of a semiconductor device. The resistivities of the insulator 211, the insulator 284, and the insulator 286 are preferably higher than or equal to $1 \times 10^{10}$ $\Omega$cm and lower than or equal to $1 \times 10^{15}$ $\Omega$cm.

Either the insulator 211 or the insulator 212 is not necessarily provided. Either the insulator 283 or the insulator 284 is not necessarily provided. For example, the insulator 211 and the insulator 283 are not necessarily provided in the case where the insulator 212 and the insulator 284 are formed using a CVD method with a compound gas containing no hydrogen atom or having a low hydrogen atom content.

In the memory device 202 in FIG. 1A, FIG. 1B, FIG. 2A, and FIG. 2B, the opening 270 is formed in the insulator 212; however, the present invention is not limited thereto. For example, the opening 270 is not necessarily formed in the insulator 212. In this case, the opening 270 is formed in and over the insulator 214 and a bottom surface of the opening 270 is the insulator 212. Thus, the insulator 283 is in contact with the top surface of the insulator 212 at the bottom of the opening 270.

Although the transistor 200 having a structure in which the insulator 211, the insulator 212, the insulator 283, and the insulator 284 each has a single-layer structure is shown, the present invention is not limited thereto. For example, each of the insulator 211, the insulator 212, the insulator 283, and the insulator 284 may have a stacked-layer structure of two or more layers.

The insulator 216 and the insulator 280 preferably have a lower permittivity than the insulator 214. When a material with a low dielectric constant is used for the interlayer film, the parasitic capacitance generated between wirings can be reduced. As the insulator 216 and the insulator 280, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

Furthermore, when data in the memory device 202 is read out, a potential higher than that when data is retained is applied to the conductor 205 to decrease Vth of the transistor 200, so that electric charge corresponding to data retained in the capacitor 201 can be easily read out. In the memory device 202 described in this embodiment, the capacitor 201 is formed in accordance with the sealed structure of the transistor 200, which may cause the electric capacitance of the capacitor 201 to be small; however, when the potential applied to the conductor 205 is high in reading data, the speed of reading data of the memory device 202 can be sufficiently fast.

The conductor 205 is positioned to overlap with the oxide 230 and the conductor 260. Furthermore, the conductor 205 is preferably provided to be embedded in the insulator 214 or the insulator 216.

As shown in FIG. 1A, the conductor 205 is preferably provided to be larger than a region of the oxide 230 that does not overlap with the conductor 242*a* and the conductor 242*b*. In particular, as shown in FIG. 2A, the conductor 205 preferably extends to a region outside an end portion of the oxide 230 that intersects with the channel width direction. That is, the conductor 205 and the conductor 260 preferably overlap with each other with the insulators therebetween outside a side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, the S-channel transistor refers to a transistor structure in which a channel formation region is electrically surrounded by electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 205 does not necessarily have to be provided in each transistor. For example, the conductor 205 may be shared by a plurality of transistors.

Although the transistor 200 having a structure in which the conductor 205*a* and the conductor 205*b* are stacked as the conductor 205 is shown, the present invention is not limited thereto. For example, the conductor 205 may have a single-layer structure or a stacked-layer structure of three or more layers. In the case where a structure body has a stacked-layer structure, layers may be distinguished with ordinal numbers corresponding to the formation order.

Here, for the conductor 205*a*, it is preferable to use a conductive material having a function of inhibiting the diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting the diffusion of oxygen (e.g., at least one of an oxygen atom, an oxygen molecule, and the like).

When a conductive material having a function of inhibiting the diffusion of oxygen is used for the conductor 205*a*, the conductivity of the conductor 205*b* can be inhibited from being lowered because of oxidation. As a conductive material having a function of inhibiting the diffusion of oxygen, for example, tantalum, tantalum nitride, ruthenium, or ruthenium oxide is preferably used. Thus, the conductor 205*a* is a single layer or a stacked layer of the above conductive materials. For example, the conductor 205*a* may be a stack of tantalum, tantalum nitride, ruthenium, or ruthenium oxide and titanium or titanium nitride.

Moreover, the conductor 205*b* is preferably formed using a conductive material containing tungsten, copper, or aluminum as its main component. Note that the conductor 205*b* is shown as a single layer but may have a stacked-layer structure, for example, a stack of the conductive materials and titanium or titanium nitride.

A conductor 206 has a region not overlapping with the insulator 222, the insulator 224, the insulator 280, or the like and the region overlaps with the opening 270. A side surface of the conductor 206 may be in contact with the insulator 216 and the other side surface may be aligned with the side surfaces of the insulator 212 and the insulator 214 as shown in FIG. 1B.

At least part of the conductor 206 may overlap with the insulator 222, the insulator 224, and the insulator 280 as shown in FIG. 1B. With this structure, the conductor 206 and the conductor 205 can be arranged close to each other. Thus, the area of memory device 202 can be reduced and memory capacity per unit area of the semiconductor device can be increased.

The conductor 206 is preferably formed with the same steps as the conductor 205. It is thus preferable that the conductor 206*a* have a structure similar to that of the conductor 205*a* and the conductor 206*b* have a structure similar to that of the conductor 205*b*. The conductor 206 functions as the lower electrode of the capacitor 201.

The conductor 205 and the conductor 206 are provided in island-like shapes inside the region surrounded by the opening 270, whereby the insulator 283 is in contact with the insulator 211 outside the transistor 200 and the conductor 206. This can seal the transistor 200 and the conductor 206 with more certainty. Furthermore, the conductor 260, the insulator 250, the oxide 230*c*, and the oxide 230*d* are provided in island-like shapes inside the region surrounded by the opening 270, whereby the transistor 200 and the conductor 206 can be sealed with much more certainty.

The insulator 222 and the insulator 224 function as gate insulators.

It is preferable that the insulator 222 have a function of inhibiting the diffusion of hydrogen (e.g., at least one of a hydrogen atom, a hydrogen molecule, and the like). In addition, it is preferable that the insulator 222 have a function of inhibiting the diffusion of oxygen (e.g., at least one of an oxygen atom, an oxygen molecule, and the like). For example, the insulator 222 preferably has a function of further inhibiting the diffusion of one or both of hydrogen and oxygen as compared to the insulator 224.

As the insulator 222, an insulator containing an oxide of one or both of aluminum and hafnium, which is an insulating material, is preferably used. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and the diffusion of impurities such as hydrogen from the periphery of the transistor 200 into the oxide 230. Thus, providing the insulator 222 can inhibit the diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

For example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. As miniaturization and high integration of a transistor proceed, a problem such as leakage current may arise because of a reduction in the thickness of the gate insulator. When a high-k material is used for the insulator functioning as a gate insulator, a gate potential during operation of the transistor can be reduced while the physical thickness of the gate insulator is maintained.

It is preferable that oxygen be released from the insulator 224 in contact with the oxide 230 by heating. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

For the insulator 224, specifically, an oxide material from which part of oxygen is released by heating, in other words, an insulating material including an excess-oxygen region is preferably used. An oxide that releases oxygen by heating is an oxide film in which the amount of released oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis is preferably within the range of from 100° C. to 700° C., or from 100° C. to 400° C.

One or more of heat treatment, microwave treatment, and RF (Radio Frequency) treatment may be performed in a state in which the insulator including an excess-oxygen region and the oxide 230 are in contact with each other. By the treatment(s), water or hydrogen in the oxide 230 can be removed. For example, in the oxide 230, dehydrogenation can be performed when a reaction in which a bond of VoH is cut occurs, i.e., a reaction of VoH→Vo+H occurs. Part of hydrogen generated at this time is bonded to oxygen to be H$_2$O, and removed from the oxide 230 or an insulator in the vicinity of the oxide 230 in some cases. Part of hydrogen is diffused into or trapped by (also referred to as gettering) by the conductor 242 in some cases.

For the microwave treatment, for example, an apparatus including a power supply that generates high-density plasma or an apparatus including a power supply that applies RF to the substrate side is suitably used. For example, the use of a gas containing oxygen and high-density plasma enables high-density oxygen radicals to be generated, and RF application to the substrate side allows the oxygen radicals generated by the high-density plasma to be efficiently introduced into the oxide 230 or an insulator in the vicinity of the oxide 230. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 200, heat treatment is preferably performed with a surface of the oxide 230 exposed. The heat treatment is performed at higher than or equal to 100° C. and lower than or equal to 600° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce Vo. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that oxygen adding treatment performed on the oxide 230 can promote a reaction in which Vo in the oxide 230 is repaired with supplied oxygen, i.e., a reaction of "Vo+O→null". Furthermore, hydrogen which remains in the oxide 230 reacts with supplied oxygen, so that the hydrogen can be removed as H$_2$O (dehydration). This can inhibit recombination of hydrogen which remains in the oxide 230 with Vo and formation of VoH.

Note that the insulator 222 and the insulator 224 may each have a stacked-layer structure of two or more layers. In such cases, without limitation to a stacked-layer structure formed of the same material, the insulator 222 and the insulator 224 may have a stacked-layer structure formed of different materials.

The oxide 243 (the oxide 243a and the oxide 243b) may be provided over the oxide 230b.

The oxide 243 (the oxide 243a and the oxide 243b) preferably has a function of suppressing the passage of oxygen. The oxide 243 having a function of inhibiting the passage of oxygen is preferably provided between the oxide 230b and the conductor 242 functioning as the source electrode and the drain electrode, in which case the electric resistance between the conductor 242 and the oxide 230b can be reduced. Such a structure improves the electrical characteristics and reliability of the transistor 200. In the case where the electrical resistance between the oxide 230b and the conductor 242 can be sufficiently reduced, the oxide 243 is not necessarily provided.

A metal oxide including an element M may be used as the oxide 243. In particular, aluminum, gallium, yttrium, or tin is preferably used as the element M The concentration of the element M in the oxide 243 is preferably higher than that in the oxide 230b. Furthermore, gallium oxide may be used as the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230b. The thickness of the oxide 243 is preferably larger than or equal to 0.5 nm and smaller than or equal to 5 nm, further preferably larger than or equal to 1 nm and smaller than or equal to 3 nm, still further preferably larger than or equal to 1 nm and smaller than or equal to 2 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

The conductor 242a is provided over the oxide 243a and the conductor 242b is provided over the oxide 243b. Each of the conductor 242a and the conductor 242b functions as a source electrode or a drain electrode of the transistor 200.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

When the oxide 243 is not provided, the contact between the conductor 242 and the oxide 230b or the oxide 230c may make oxygen in the oxide 230b or the oxide 230c diffuse into the conductor 242, resulting in oxidation of the conductor 242. It is highly possible that oxidation of the conductor 242 lowers the conductivity of the conductor 242. Note that the diffusion of oxygen in the oxide 230b or the oxide 230c into the conductor 242 can be rephrased as absorption of oxygen in the oxide 230b or the oxide 230c by the conductor 242.

When oxygen in the oxide 230b or the oxide 230c is diffused into the conductor 242a and the conductor 242b, a layer is sometimes formed between the conductor 242a and the oxide 230b and between the conductor 242b and the oxide 230b or between the conductor 242a and the oxide 230c and between the conductor 242b and the oxide 230c. The layer contains more oxygen than the conductor 242a or the conductor 242b does, and thus the layer is assumed to have an insulating property. In this case, a three-layer structure of the conductor 242a or the conductor 242b, the layer, and the oxide 230b or the oxide 230c can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

Note that hydrogen contained in the oxide 230b, the oxide 230c, or the like is diffused into the conductor 242a or the conductor 242b in some cases. In particular, when a nitride containing tantalum is used for the conductor 242a and the conductor 242b, hydrogen contained in the oxide 230b, the oxide 230c, or the like is likely to be diffused into the conductor 242a or the conductor 242b, and the diffused hydrogen is bonded to nitrogen contained in the conductor 242a or the conductor 242b in some cases. That is, hydrogen contained in the oxide 230b, the oxide 230c, or the like is sometimes absorbed by the conductor 240a or the conductor 242b in some cases.

As shown in FIG. 2B, there is a curved surface between the side surface of the conductor 242b and the top surface of the conductor 242b in some cases. That is, an end portion of the side surface and an end portion of the top surface might be curved. The radius of curvature of the curved surface at an end portion of the conductor 242b is greater than or equal to 3 nm and less than or equal to 10 nm, preferably greater than or equal to 5 nm and less than or equal to 6 nm, for example. When the end portions are not angular, coverage with films in later deposition steps after the formation of the conductor 242 is improved. Although not shown in FIG. 2B, the descriptions on the conductor 242b applies to the conductor 242a.

It is preferable that the insulator 272 be provided to cover the top surface and the side surface of the conductor 242 and function as a barrier insulating layer. With this structure, absorption of excess oxygen contained in the insulator 280 by the conductor 242 can be inhibited. Furthermore, by inhibiting oxidation of the conductor 242, an increase in the contact resistance between the transistor 200 and a wiring can be inhibited. Consequently, the transistor 200 can have excellent electrical characteristics and reliability.

Thus, the insulator 272 preferably has a function of inhibiting oxygen diffusion. For example, the insulator 272 preferably has a function of further inhibiting the diffusion of oxygen as compared to the insulator 280. For example, an insulator containing an oxide of one or both of aluminum and hafnium is preferably formed as the insulator 272. For another example, an insulator containing aluminum nitride may be used as the insulator 272.

The insulator 273 is preferably provided over the insulator 272. For example, the insulator 272 may be aluminum oxide formed using a sputtering method and the insulator 273 may be aluminum oxide formed using an ALD (Atomic Layer Deposition) method. The insulator 273 is formed using an ALD method, whereby a dense film with a smaller number of defects such as cracks and pinholes or with a uniform thickness can be formed.

Such a structure sometimes makes it possible to supply oxygen to the insulator 224 at the time of forming the insulator 272. Since the insulator 224 is sealed with the insulator 272 and the insulator 273, oxygen supplied to the insulator 224 is inhibited from being diffused to the outside, and the oxygen can be supplied efficiently to the oxide 230. Moreover, the above structure is preferable because the insulator 273 may absorb hydrogen in the insulator 224.

An insulator that functions as a barrier insulating film may be provided, instead of the insulator 272 and the insulator 273, between the top surface of the conductor 242 and the insulator 280. With this structure, absorption of excess oxygen contained in the insulator 280 by the conductor 242 can be inhibited. Furthermore, by inhibiting oxidation of the conductor 242, an increase in the contact resistance between the transistor 200 and a wiring can be inhibited. Consequently, the transistor 200 can have excellent electrical characteristics and reliability. Thus, the above insulator functioning as a barrier insulating film preferably has a function of inhibiting the diffusion of oxygen. For example, the above insulator functioning as a barrier insulating film preferably has a function of inhibiting oxygen diffusion more than the insulator 280 has. An insulator containing an oxide of one or both of aluminum and hafnium may be deposited as the above insulator functioning as a barrier insulating film, for example. In particular, aluminum oxide is preferably deposited using an ALD method.

The insulator 250 functions as a gate insulator. The insulator 250 is preferably in contact with a top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator that releases oxygen by heating. When an insulator that releases oxygen by heating is provided as the insulator 250 in contact with the top surface of the oxide 230c, oxygen can be efficiently supplied to the channel formation region of the oxide 230b and oxygen vacancies in the channel formation region of the oxide 230b can be reduced. Thus, a transistor that has stable electrical characteristics with small variation in electrical characteristics and improved reliability can be provided. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Although the insulator 250 is shown as a single layer in FIG. 1B and FIG. 2A, a stacked-layer structure of two or more layers may be employed. In the case where the insulator 250 has a stacked-layer structure including two layers, it is preferable that a lower layer of the insulator 250 be formed using an insulator from which oxygen is released by heating and an upper layer of the insulator 250 be formed using an insulator having a function of inhibiting the diffusion of oxygen. With such a structure, oxygen contained in a lower layer of the insulator 250 can be inhibited from being diffused into the conductor 260. That is, the reduction in the amount of oxygen supplied to the oxide 230 can be inhibited. In addition, oxidation of the conductor 260 due to oxygen from the lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high relative permittivity. The gate insulator having a stacked-layer structure of the lower layer of the insulator 250 and the upper layer of the insulator 250 can be thermally stable and can have a high relative permittivity. Accordingly, a gate potential that is applied during operation of the transistor can be reduced while the physical thickness of the gate insulator is kept. Furthermore, the equivalent oxide thickness (EOT) of the insulator functioning as the gate insulator can be reduced.

Specifically, as the upper layer of the insulator 250, a metal oxide containing one kind or two or more kinds selected from hafnium, aluminum, gallium, yttrium, zirconium, tungsten, titanium, tantalum, nickel, germanium, magnesium, or a metal oxide that can be used as the oxide 230 can be used. In particular, an insulator containing an oxide of one or both of aluminum and hafnium is preferably used.

Furthermore, a metal oxide may be provided between the insulator 250 and the conductor 260. The metal oxide preferably inhibits the diffusion of oxygen from the insulator 250 into the conductor 260. Providing the metal oxide that inhibits the diffusion of oxygen inhibits the diffusion of oxygen from the insulator 250 into the conductor 260. That is, the reduction in the amount of oxygen supplied to the oxide 230 can be inhibited. Moreover, oxidation of the conductor 260 due to oxygen in the insulator 250 can be inhibited.

Note that, the metal oxide preferably has a function of part of the first gate electrode. For example, a metal oxide that can be used as the oxide 230 can be used as the metal oxide.

In that case, when the conductor 260a is deposited using a sputtering method, the metal oxide can have a reduced electric resistance value to be a conductor. This can be referred to as an OC (Oxide Conductor) electrode.

With the metal oxide, the on-state current of the transistor 200 can be increased without a reduction in the influence of the electric field from the conductor 260. Since a distance between the conductor 260 and the oxide 230 is kept by the physical thicknesses of the insulator 250 and the metal oxide, leakage current between the conductor 260 and the oxide 230 can be inhibited. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The conductor 260 functions as a first gate electrode of the transistor 200. The conductor 260 preferably includes the conductor 260a and the conductor 260b positioned over the conductor 260a. For example, the conductor 260a is preferably positioned to cover a bottom surface and a side surface of the conductor 260b. Moreover, as shown in FIG. 1B and FIG. 2A, the top surface of the conductor 260 is substantially level with the top surface of the insulator 250 and the top surface of the oxide 230c. Although the conductor 260 has a two-layer structure of the conductor 260a and the conductor 260b in FIG. 1B and FIG. 2A, the conductor 260 may have a single-layer structure or a stacked-layer structure of three or more layers.

For the conductor 260a, a conductive material having a function of inhibiting the diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting the diffusion of oxygen (e.g., at least one of an oxygen atom, an oxygen molecule, and the like).

In addition, when the conductor 260a has a function of inhibiting the diffusion of oxygen, the conductivity of the conductor 260b can be inhibited from being lowered because of oxidation due to oxygen contained in the insulator 250. As a conductive material having a function of inhibiting the diffusion of oxygen, for example, tantalum, tantalum nitride, ruthenium, or ruthenium oxide is preferably used.

The conductor 260 functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of titanium or titanium nitride and the above conductive material may be employed.

In the transistor 200, the conductor 260 is formed in a self-aligned manner to fill the opening formed in the insulator 280 and the like. The formation of the conductor 260 in this manner allows the conductor 260 to be positioned certainly in a region between the conductor 242a and the conductor 242b without alignment.

As shown in FIG. 2A in the channel width direction of the transistor 200, when the bottom surface of the insulator 222 is considered as a reference, the level of the bottom surface of the conductor 260 in a region where the conductor 260 and the oxide 230b do not overlap with each other is preferably lower than the level of the bottom surface of the oxide 230b. When the conductor 260 functioning as the gate electrode covers a side surface and a top surface of the channel formation region of the oxide 230b with the insulator 250 and the like therebetween, the electric field of the conductor 260 is likely to act on the entire channel formation region of the oxide 230b. Thus, the on-state current of the transistor 200 can be increased and the frequency characteristics of the transistor 200 can be improved. When a bottom surface of the insulator 222 is a reference, the difference between the level of the bottom surface of the conductor 260 in a region where the oxide 230a and the oxide 230b and the conductor 260 do not overlap with each other and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 224, the oxide 230, the conductor 242, and the insulator 273. In addition, a top surface of the insulator 280 may be planarized.

The insulator 280 functioning as an interlayer film preferably has a low permittivity. When a material with a low dielectric constant is used for the interlayer film, the parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen released by heating can be easily formed.

The concentration of impurities such as water and hydrogen in the insulator 280 is preferably reduced. Moreover, the insulator 280 preferably has a low hydrogen concentration and includes an excess-oxygen region or excess oxygen, and may be provided using a material similar to that for the insulator 216, for example. The insulator 280 may have a stacked-layer structure of the above materials; silicon oxide formed using a sputtering method and silicon oxynitride formed using a CVD method stacked thereover. Furthermore, silicon nitride may be stacked over the stacked structure.

The insulator 282 preferably functions as a barrier insulating film that inhibits impurities such as water and hydrogen from diffusing into the insulator 280 from the above and also has a function of capturing impurities such as hydrogen. The insulator 282 preferably functions as a barrier insulating film that inhibits passage of oxygen. As the insulator 282, for example, an insulator such as aluminum oxide can be used. The insulator 282, which has a function of capturing impurities such as hydrogen, is provided in contact with the insulator 280 in a region sealed with the insulator 211, the insulator 212, the insulator 283, and the insulator 284, whereby impurities such as hydrogen contained in the insulator 280 and the like can be captured and the amount of hydrogen in the sealed region can be kept constant.

The insulator 282 is preferably in contact with top surfaces of the oxide 230c, the oxide 230d, the insulator 250, and the conductor 260. With the structure, oxygen contained in the insulator 280 can be inhibited from being diffused into the conductor 260 side. Furthermore, oxygen contained in the insulator 280 can be supplied to the oxide 230a and the oxide 230b efficiently through the oxide 230c; hence, oxygen vacancies in the oxide 230a and the oxide 230b can be reduced and the electrical characteristics and the reliability of the transistor can be improved.

The insulator 283 and the insulator 284 function as barrier insulating films sealing the transistor 200 and as dielectric films of the capacitor 201. The insulator 283 covers the insulator 212, the insulator 214, the insulator 216, the insulator 222, the insulator 224, the insulator 272, the insulator 273, the insulator 280, and the insulator 282. The insulator 284 is positioned on the insulator 283. As barrier insulating films used for the insulator 283 and the insulator 284, a nitride containing silicon such as silicon nitride or silicon nitride oxide is preferably used.

For example, silicon oxide deposited using a sputtering method is used as the insulator 283 and silicon oxynitride deposited using a CVD method is used as the insulator 284. When the insulator 283 is formed using a sputtering method, a high-density silicon nitride film where a void is unlikely to be formed can be obtained. When the insulator 284 is formed using a CVD method, a silicon nitride film can be formed at a high forming rate.

For the conductor 248, a conductor that can be used for the conductor 260 is used. The conductor 248 has a single-layer structure in FIG. 1B and the like; the structure is not limited thereto, and the conductor 248 may have a structure with two or more layers. For example, the conductor 248 may have a stacked-layer structure similar to the conductor 260a and the conductor 260b over the conductor 260a.

The conductor 248 is provided to be embedded in the inner portion than the insulator 284 in the opening 270. It is preferable that part of the conductor 248 overlap with the conductor 206, and another part of the conductor 248 overlap with the region where the insulator 283 is in contact with the insulator 211. With such a structure, a capacitor is formed in the region where the conductor 248 overlaps with the conductor 206 and the region where the conductor 248 faces the side surface of the conductor 206, which can increase the electrostatic capacitance.

The conductor 248 is formed to be embedded in the opening 270 and is positioned to surround the transistor 200 as shown in FIG. 1A. This can make the capacitor 201 be provided in a hook shape, which can increase the electrostatic capacitance, as shown in FIG. 1A.

As the conductor 240a, the conductor 240b, and the conductor 240c, a conductive material containing tungsten, copper, or aluminum as its main component is preferably used. The conductor 240a, the conductor 240b, and the conductor 240c may each have a stacked-layer structure.

In the case where the conductor 240 has a stacked-layer structure, a conductive material having a function of inhibiting transmission of impurities such as water or hydrogen is preferably used for a conductor in contact with the insulator 274, the insulator 284, the insulator 283, the insulator 282, the insulator 280, the insulator 273, and the insulator 272. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. The use of the conductive material can prevent oxygen added to the insulator 280 from being absorbed by the conductor 240a, the conductor 240b, and the conductor 240c. Moreover, impurities such as water and hydrogen contained in a layer above the insulator 274 can be inhibited from entering the oxide 230 through the conductor 240a, the conductor 240b, and the conductor 240c.

As the insulator 241a, the insulator 241b, and the insulator 241c, for example, an insulator such as silicon nitride, aluminum oxide, or silicon nitride oxide may be used. Since the insulator 241a, the insulator 241b, and the insulator 241c are provided in contact with the insulator 283 and the insulator 284, impurities such as water or hydrogen contained in the insulator 274 or the like can be inhibited from entering the oxide 230 through the conductor 240a, the conductor 240b, and the conductor 240c. In particular, silicon nitride is suitable because of its high blocking property against hydrogen. Furthermore, oxygen contained in the insulator 280 can be prevented from being absorbed by the conductor 240a, the conductor 240b, and the conductor 240c.

The insulator 274 functions as an interlayer film. The permittivity of the insulator 274 is preferably lower than that of the insulator 214. When a material with a low dielectric constant is used for the interlayer film, the parasitic capacitance generated between wirings can be reduced. The insulator 274 can be provided using a material similar to that for the insulator 280, for example.

The conductor 246a functioning as a wiring that is connected to one of the source electrode and the drain electrode of the transistor 200 is provided in contact with a top surface of the conductor 240a. The conductor 246b connecting the other of the source electrode and the drain electrode of the transistor 200 to the upper electrode of the capacitor 201 is provided in contact with a top surface of the conductor 240b and a top surface of the conductor 240c. The conductor 246a and the conductor 246b are not limited thereto and appropriately provided in accordance with the circuit structure of the semiconductor device including the memory device 202.

The conductor 246 is preferably formed using a conductive material containing tungsten, copper, or aluminum as its main component. Furthermore, the conductor may have a stacked-layer structure and may be a stack of titanium or titanium nitride and any of the above conductive materials, for example. The conductor may be formed to be embedded in the openings provided in an insulator.

The insulator 286 is provided over the conductor 246 and the insulator 274. This makes a top surface of the conductor 246 and a side surface of the conductor 246 be in contact with the insulator 286. In other words, the conductor 246 can have a structure in which the conductor 246 is surrounded by the insulator 286. With such a structure, the passage of oxygen from the outside can be inhibited and the oxidation of the conductor 246 can be prevented. Furthermore, impurities such as water and hydrogen can be prevented from diffusing from the conductor 246 to the outside, which is preferable.

Figure 3A:
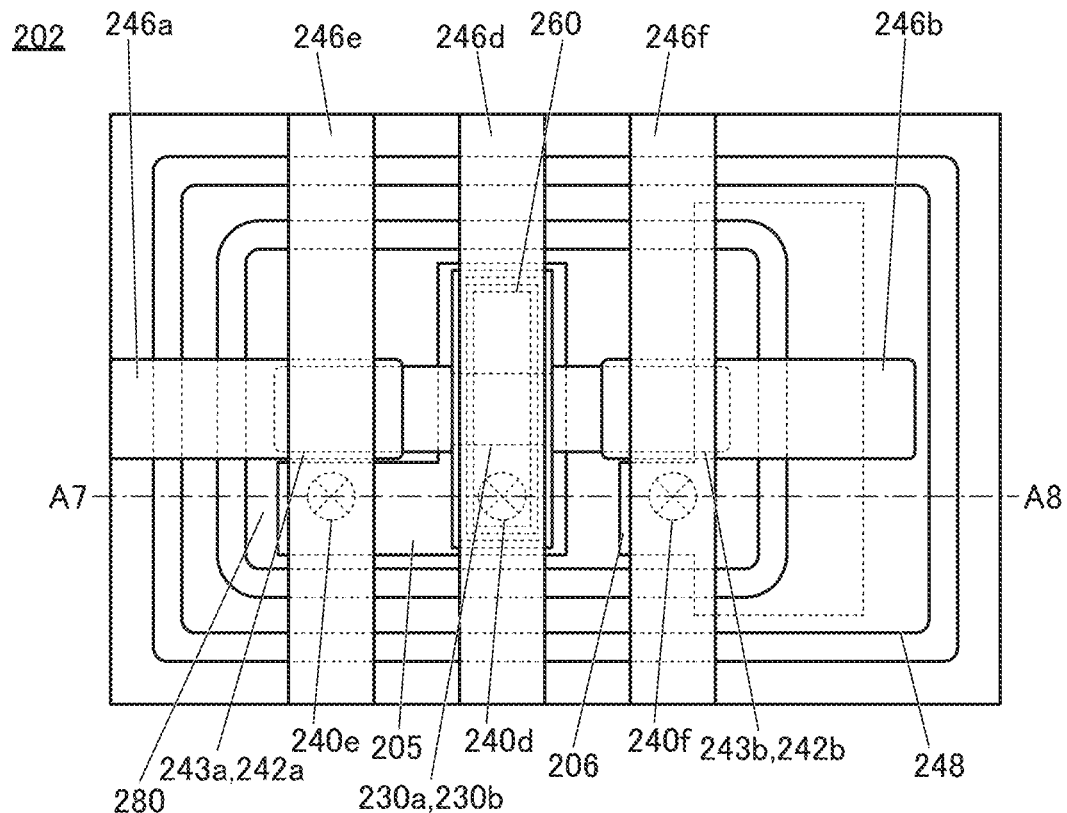
FIG. 3A is a top view of a semiconductor device of one embodiment of the present invention.
Figure 3B:
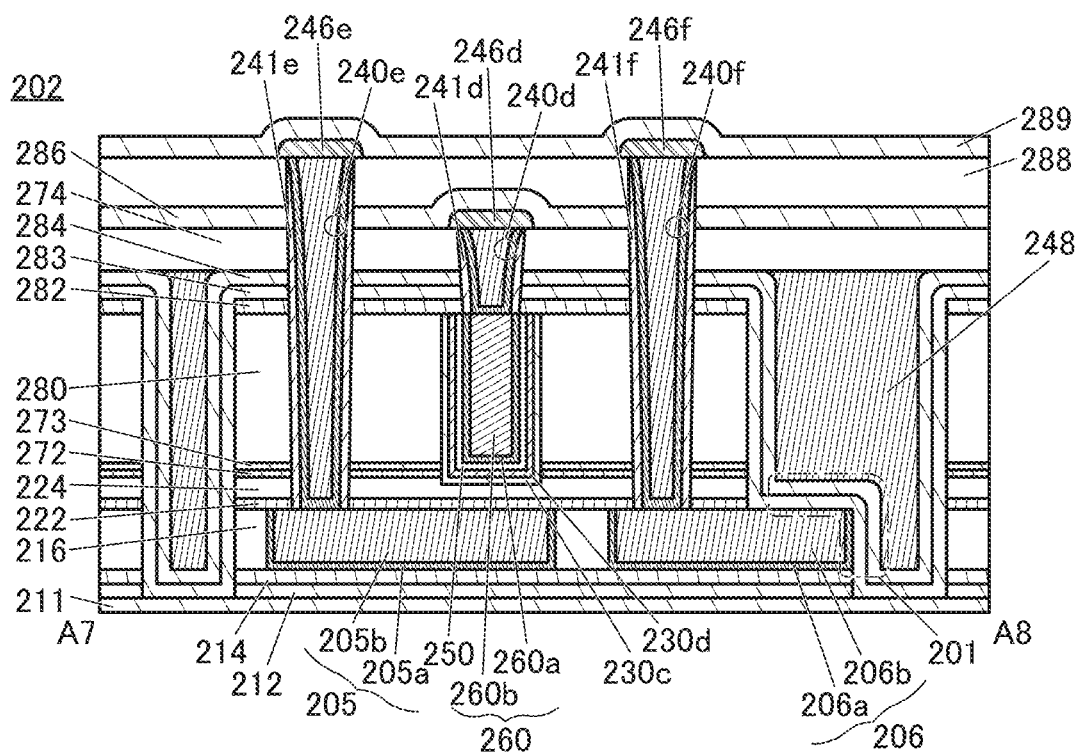
FIG. 3B is a cross-sectional view of the semiconductor device of one embodiment of the present invention.

A conductor may be provided in the same layer as or over the conductor 246a and the conductor 246b and connected to electrodes of the transistor 200 or the capacitor 201. FIG. 3A and FIG. 3B show an example of providing wirings to extract the conductor 260 functioning as the first gate of the transistor 200, the conductor 205 functioning as the second gate electrode of the transistor 200, and the conductor 206 functioning as the lower electrode of the capacitor 201. FIG. 3A shows a top view of the memory device 202. FIG. 3B is a cross-sectional view of a portion indicated with the dashed-dotted line A7-A8 in FIG. 3A. Note that for clarity of the drawing, some components are not shown in the top view of FIG. 3A.

In the memory device 202 shown in FIG. 3A and FIG. 3B, a conductor 246d is provided in the same layer as the conductor 246a and the conductor 246b, the insulator 288 is provided over the insulator 286, the conductor 246e and the conductor 246f are provided over the insulator 288, and the insulator 289 is provided to cover the conductor 246e and the conductor 246f. An opening reaching the conductor 260 is provided under the conductor 246d, a conductor 240d is provided to be embedded in the opening, and an insulator 241d is provided in contact with a side surface of the conductor 240d. An opening reaching the conductor 205 is formed under the conductor 246e, the conductor 240e is provided to be embedded in the opening, and an insulator 241e is provided in contact with a side surface of the conductor 240e. An opening reaching the conductor 206 is formed under the conductor 246f, a conductor 240f is formed to be embedded in the opening, and an insulator 241f is provided in contact with a side surface of the conductor 240f.

The conductor 246d, the conductor 246e, and the conductor 246f can have structures similar to that of the conductor 246. The conductor 240d, the conductor 240e, and the conductor 240f can have structures similar to that of the conductor 240. The insulator 241d, the insulator 241e, and the insulator 241f can have structures similar to that of the insulator 241. The insulator 288 can have a structure similar to that of the insulator 274. The insulator 289 can have a structure similar to that of the insulator 286.

With such a structure, the conductor 246d functions as a wiring that is connected to the conductor 260, the conductor 246e functions as a wiring connected to the conductor 205, and the conductor 246f functions as a wiring connected to the conductor 206.

Since the insulator 241d, the insulator 241e, and the insulator 241f are provided in contact with the insulator 283 and the insulator 284, the entry of impurities such as water and hydrogen contained in the insulator 274, the insulator 288 and the like into the sealed region with the insulator 283 and the like through the conductor 240d, the conductor 240e, and the conductor 240f can be suppressed.

The conductor 246d to the conductor 246f extend in the channel width direction of the transistor 200 in FIG. 3A; the present invention is not limited thereto, and the conductor 246d to the conductor 246f may be appropriately provided in accordance with a circuit structure of the semiconductor device. The conductor 246d is provided in a lower layer and the conductor 246e and the conductor 246f are provided in an upper layer; the present invention is not limited thereto and the conductor 246d, the conductor 246e, and the conductor 246f may be appropriately provided in accordance with a circuit structure of the semiconductor device. The conductor 246d to the conductor 246f are provided over the insulator 284; the present invention is not limited thereto, and the conductor 246d to the conductor 246f may be provided under the insulator 211, for example. The semiconductor devices shown in this embodiment and the other embodiments can be provided with conductors functioning as wirings as described above.

<Constituent Material of Semiconductor Device>

Constituent materials that can be used for the semiconductor device will be described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be reduced.

<<Conductor>>

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure in which a material containing the above metal element and a conductive material containing oxygen are combined is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

The oxide 230 is preferably formed using a metal oxide functioning as a semiconductor (an oxide semiconductor). A metal oxide that can be used as the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to indium and zinc. Furthermore, one or more kinds of elements selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, the element M, and zinc is considered. The element M is aluminum, gallium, yttrium, or tin. Other elements that can be used as the element M include boron, titanium, iron, nickel, germanium, zirconium, molybdenum, lanthanum, cerium, neodymium, hafnium, tantalum, tungsten, magnesium, and cobalt. Note that a plurality of the above elements may be used in combination as the element M in some cases.

Note that in this specification and the like, a metal oxide containing nitrogen is also collectively referred to as a metal oxide in some cases. A metal oxide containing nitrogen may be referred to as a metal oxynitride.

<Classification of Crystal Structure>

First, the classification of the crystal structures of oxide semiconductor will be explained with FIG. 4A. FIG. 4A is a diagram showing the classification of the crystal structures of an oxide semiconductor, typically IGZO (a metal oxide containing In, Ga, and Zn).

As shown in FIG. 4A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 4A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 4B shows an XRD spectrum, which is obtained using GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 4B and obtained using GIXD measurement is hereinafter simply referred to as an XRD spectrum. The CAAC-IGZO film in FIG. 4B has a composition in the neighborhood of In:Ga:Zn=4:2:3 [atomic ratio]. The CAAC-IGZO film in FIG. 4B has a thickness of 500 nm.

As shown in FIG. 4B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 4B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 4C shows a diffraction pattern of the CAAC-IGZO film. FIG. 4C shows a diffraction pattern obtained using the NBED in which an electron beam is incident in the direction parallel to the substrate. The composition of the CAAC-IGZO film in FIG. 4C is In:Ga:Zn=4:2:3 [atomic ratio] or the neighborhood thereof. In the nanobeam electron diffraction method, electron diffraction is performed with a probe diameter of 1 nm.

As shown in FIG. 4C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 4A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis using out-of-plane XRD measurement with an XRD apparatus using $\theta/2\theta$ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to thermal budget. Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor using some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. A material structure of the CAC-OS is described.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and fast switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Therefore, hydrogen in the oxide semiconductor is preferably reduced as much as possible. Specifically, the hydrogen concentration in the oxide semiconductor, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

<<Other Semiconductor Materials>>

Note that a semiconductor material that can be used for the oxide 230 is not limited to the above metal oxides. A semiconductor material which has a band gap (a semiconductor material that is not a zero-gap semiconductor) can be used for the oxide 230. For example, a single element semiconductor such as silicon, a compound semiconductor such as gallium arsenide, or a layered material (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), zirconium selenide (typically $ZrSe_2$).

<Manufacturing Method of Semiconductor Device>

Next, a method of manufacturing a semiconductor device that is one embodiment of the present invention, which is shown in FIG. 1A and FIG. 1B, is described with reference to FIG. 5A to FIG. 19A and FIG. 5B to FIG. 19B.

FIG. 5A to FIG. 19A shown top views. FIG. 5B to FIG. 19B are cross-sectional views corresponding to portions indicated with dashed-dotted line A1-A2 in FIG. 5A to FIG. 19A, and are also cross-sectional views of the transistor 200 in the channel length direction. Note that for clarity of the drawings, some components are not shown in the top views of FIG. 5A to FIG. 19A.

First, a substrate (not shown) is prepared, and the insulator 211 is formed over the substrate. The insulator 211 can be deposited using a sputtering method, a CVD method, a molecular beam epitaxy (MBE) method, a pulsed laser deposition (PLD) method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

Using a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As the ALD method, a thermal ALD method, in which a precursor and a reactant react with each other only by a thermal energy, a PEALD (Plasma Enhanced ALD) method, in which a reactant excited by plasma is used, and the like can be used.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. The use of plasma in a PEALD method is sometimes preferable because deposition at a lower temperature is possible. Note that a precursor used in the ALD method sometimes contains impurities such as carbon. Thus, in some cases, a film provided using the ALD method contains impurities such as carbon in a larger amount than a film provided using another deposition method. Note that impurities can be quantified using X-ray photoelectron spectroscopy (XPS).

Unlike a deposition method in which particles ejected from a target or the like are deposited, a CVD method and an ALD method are deposition methods in which a film is formed through reaction at a surface of an object to be processed. Thus, a CVD method and an ALD method are deposition methods that enable favorable step coverage almost regardless of the shape of an object to be processed. In particular, an ALD method has excellent step coverage and excellent film-thickness uniformity and thus is suitable for covering a surface of an opening with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, using a CVD method and an ALD method, a film with a certain composition can be deposited depending on the flow rate ratio of the source gases. Moreover, using a CVD method or an ALD method, by changing the flow rate ratio of the source gases during the deposition, a film whose composition is continuously changed can be deposited. In the case where the film is deposited while changing the flow rate ratio of the source gases, as compared to the case where the film is deposited using a plurality of deposition chambers, the time taken for the deposition can be shortened because the time taken for transfer and pressure adjustment is omitted. Thus, the productivity of the semiconductor device can be increased in some cases.

In this embodiment, for the insulator 211, silicon nitride is deposited using a CVD method.

Next, the insulator 212 is deposited over the insulator 211. The insulator 212 can be deposited using a sputtering method, a CVD method, an MBE method, a PLD method, an ALD method, or the like. In this embodiment, for the insulator 212, silicon nitride is deposited using a sputtering method.

When an insulator through which copper is less likely to pass, such as silicon nitride, is used for the insulator 211 and the insulator 212 in such a manner, even in the case where a metal that is likely to diffuse copper or the like is used for a conductor in a layer (not shown) below the insulator 211, the diffusion of the metal into an upper area through the insulator 211 and the insulator 212 can be inhibited. The use of an insulator through which impurities such as water and hydrogen are less likely to pass, such as silicon nitride, can inhibit the diffusion of impurities such as water and hydrogen contained in a layer below the insulator 211.

Next, the insulator 214 is deposited over the insulator 212. The insulator 214 can be deposited using a sputtering method, a CVD method, an MBE method, a PLD method, an ALD method, or the like. In this embodiment, aluminum oxide is used for the insulator 214.

It is preferable that the hydrogen concentration of the insulator 212 be lower than that of the insulator 211, and the hydrogen concentration of the insulator 214 be lower than that of the insulator 212. When silicon nitride is deposited using a sputtering method for the insulator 212, silicon nitride having a hydrogen concentration lower than that of the insulator 211 formed by depositing silicon nitride using a CVD method can be formed. When the insulator 214 is formed of aluminum oxide, the insulator 214 can have lower hydrogen concentration than the insulator 212.

The transistor 200 is formed over the insulator 214 in a later step; it is preferable that a film adjacent to the transistor 200 have a relatively low hydrogen concentration and a film with a relatively high hydrogen concentration be positioned away from the transistor 200.

Next, the insulator 216 is deposited over the insulator 214. The insulator 216 can be deposited using a sputtering method, a CVD method, an MBE method, a PLD method, an ALD method, or the like. In this embodiment, silicon oxide or silicon oxynitride is used for the insulator 216. The insulator 216 is preferably deposited using the deposition method using the gas in which hydrogen atoms are reduced or removed. Thus, the hydrogen concentration of the insulator 216 can be reduced.

Then, an opening reaching the insulator 214 is formed in the insulator 216. The conductor 205 and the conductor 206 are embedded in the opening in a later step. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxide or silicon oxynitride is used as the insulator 216 in which the groove is to be formed, silicon nitride, aluminum oxide, or hafnium oxide is preferably used for the insulator 214. For example, the insulator 212, the insulator 214, and the insulator 216 may be formed using a sputtering method with no exposure to the air. For example, a multi-chamber deposition apparatus is used.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After formation of the openings, a conductive film to be the conductor 205a and the conductor 206a is deposited. The conductive film desirably include a conductor that has a function of inhibiting the passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited using a sputtering method, a CVD method, an MBE method, a PLD method, an ALD method, or the like.

In this embodiment, the conductive film to be the conductor 205a and the conductor 206a has a multilayer structure. First, tantalum nitride is deposited using a sputtering method, and titanium nitride is stacked over the tantalum nitride. Even when a metal that is likely to be diffused, such as copper, is used for a conductive film to be the conductor 205b and the conductor 206b described below, the use of such metal nitrides for a lower layer of the conductive film to be the conductor 205b and the conductor 206b can prevent outward diffusion of the metal from the conductor 205a and the conductor 206a.

Next, a conductive film to be the conductor 205b and the conductor 206b is deposited. The conductive film can be deposited using a plating method, a sputtering method, a CVD method, an MBE method, a PLD method, an ALD method, or the like. In this embodiment, as the conductive film to be the conductor 205b and the conductor 206b, a low-resistant conductive material such as copper is deposited.

Next, chemical mechanical polishment (CMP) treatment is performed to remove parts of the conductive film to be the conductor 205a and the conductor 206a and the conductive film to be the conductor 205b and the conductor 206b, so that the insulator 216 is exposed. As a result, the conductor 205a, the conductor 205b, the conductor 206a, and the conductor 206b are left only in the opening portion. Thus, the conductor 205 and the conductor 206 whose top surfaces are flat can be formed (see FIG. 5A and FIG. 5B). Note that the insulator 216 is partly removed with the CMP treatment in some cases.

Since the conductor 206 is formed at the same time as the conductor 205 in this manner, the conductor 206 functioning as the lower electrode of the capacitor 201 can be formed with no additional mask.

Next, the insulator 222 is deposited over the insulator 216, the conductor 205, and the conductor 206. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited using a sputtering method, a CVD method, an MBE method, a PLD method, an ALD method, or the like.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent the entry of moisture or the like into the insulator 222 and the like as much as possible.

In this embodiment, as the heat treatment, after the formation of the insulator 222, heat treatment at 400° C. for one hour is performed with a flow rate ratio of a nitrogen gas and an oxygen gas of 4 slm:1 slm. Through the heat treatment, impurities such as water and hydrogen contained in the insulator 222 can be removed, for example. In the case where an oxide containing hafnium is used as the insulator 222, the heat treatment can improve the crystallinity of the insulator 222. The heat treatment can also be performed after the deposition of the insulator 224, for example.

Next, the insulator 224 is deposited over the insulator 222. The insulator 224 can be deposited using a sputtering method, a CVD method, an MBE method, a PLD method, an ALD method, or the like. In this embodiment, for the insulator 224, a silicon oxide film or a silicon oxynitride film is deposited using a CVD method. The insulator 224 is preferably deposited using the deposition method using a gas in which hydrogen atoms are reduced or removed. Thus, the concentration of hydrogen in the insulator 224 can be reduced. The hydrogen concentration of the insulator 224 is preferably reduced because the insulator 224 is in contact with the oxide 230a in a later step.

Here, plasma treatment containing oxygen may be performed under reduced pressure so that an excess-oxygen region can be formed in the insulator 224. For the plasma treatment containing oxygen, an apparatus including a power source for generating high-density plasma using a microwave is preferably used, for example. Alternatively, a power source may be provided to apply RF to the substrate side. The use of high-density plasma enables high-density oxygen radicals to be generated, and RF application to the substrate side allows the oxygen radicals generated by the high-density plasma to be efficiently introduced into the insulator 224. Alternatively, after plasma treatment containing an inert gas is performed using this apparatus, plasma treatment containing oxygen may be performed to compensate for released oxygen. Note that impurities such as water and hydrogen contained in the insulator 224 can be removed by selecting the conditions for the plasma treatment appropriately. In that case, the heat treatment does not need to be performed.

Here, after aluminum oxide is deposited over the insulator 224 using a sputtering method, for example, the aluminum oxide may be subjected to CMP treatment until the insulator 224 is reached. The CMP treatment can planarize and smooth a surface of the insulator 224. When the CMP treatment is performed on the aluminum oxide positioned over the insulator 224, it is easy to detect the endpoint of the CMP treatment. Although part of the insulator 224 is polished using the CMP treatment and the thickness of the insulator 224 is reduced in some cases, the thickness can be adjusted when the insulator 224 is deposited. Planarizing and smoothing the surface of the insulator 224 can prevent deterioration in the coverage with an oxide deposited later and a decrease in the yield of the semiconductor device in some cases. The deposition of aluminum oxide over the insulator 224 using a sputtering method is preferred because oxygen can be added to the insulator 224.

Figure 5A:
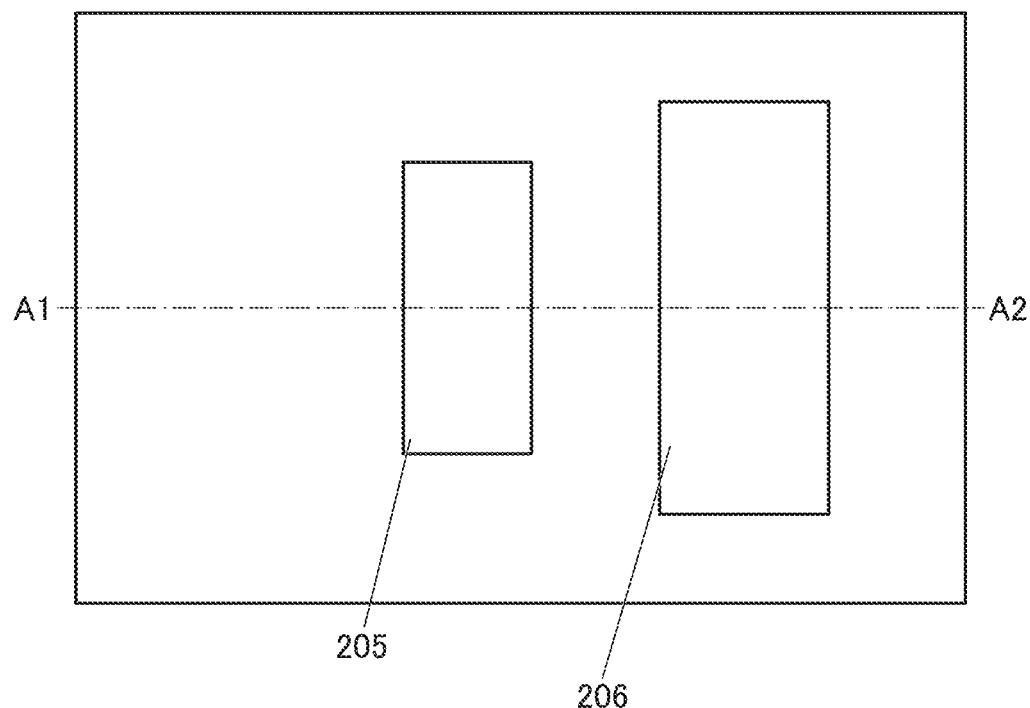
FIG. 5A is a top view showing a method of manufacturing a semiconductor device of one embodiment of the present invention.
Figure 5B:
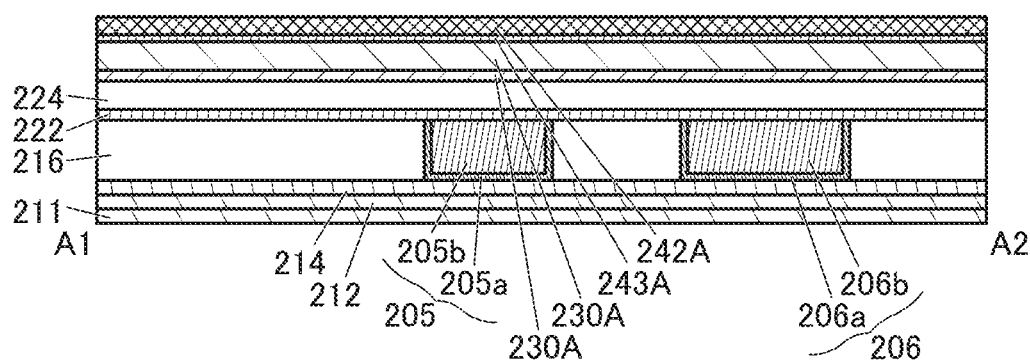
FIG. 5B is a cross-sectional view showing the method of manufacturing a semiconductor device of one embodiment of the present invention.

Next, an oxide film 230A and an oxide film 230B are deposited in this order over the insulator 224 (see FIG. 5A and FIG. 5B). Note that it is preferable to deposit the oxide film 230A and the oxide film 230B successively without exposure to the air. Through the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be deposited using a sputtering method, a CVD method, an MBE method, a PLD method, an ALD method, or the like.

For example, in the case where the oxide film 230A and the oxide film 230B are deposited using a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited using a sputtering method, the above In-M-Zn oxide target or the like can be used.

In particular, when the oxide film 230A is deposited, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed using a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed using a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is heated, the crystallinity of the oxide film can be improved.

In this embodiment, the oxide film 230A is formed with a sputtering method using an oxide target with In:Ga:Zn=1:3:4 [atomic ratio]. In addition, the oxide film 230B is formed with a sputtering method using an oxide target with In:Ga:Zn=4:2:4.1 [atomic ratio]. Note that each of the oxide films is preferably formed to have characteristics required for the oxide 230a and the oxide 230b by selecting the deposition conditions and the atomic ratios as appropriate.

Next, a conductive film 243A is deposited over the oxide film 230B (see FIG. 5A and FIG. 5B). The oxide film 243A can be deposited using a sputtering method, a CVD method, an MBE method, a PLD method, an ALD method, or the like. The atomic ratio of Ga to In in the oxide film 243A is preferably greater than the atomic ratio of Ga to In in the oxide film 230B. In this embodiment, the oxide film 243A is deposited using a sputtering method using an oxide target with In:Ga:Zn=1:3:4 [atomic ratio].

Note that the insulator 222, the insulator 224, the oxide film 230A, the oxide film 230B, and the oxide film 243A are preferably deposited without exposure to the air. For example, a multi-chamber deposition apparatus is used.

Next, heat treatment is preferably performed. The heat treatment is performed at a temperature higher than or equal to 250° C. and lower than or equal to 650° C., preferably higher than or equal to 300° C. and lower than or equal to 600° C. so that the oxide film 230A, the oxide film 230B, and the oxide film 243A do not become polycrystals. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent the entry of moisture or the like into the oxide film 230A, the oxide film 230B, the oxide film 243A, and the like as much as possible.

In this embodiment, the heat treatment is performed in such a manner that treatment is performed at 550° C. in a nitrogen atmosphere for one hour, and then another treatment is successively performed at 550° C. in an oxygen atmosphere for one hour. Through the heat treatment, impurities such as water and hydrogen in the oxide film 230A, the oxide film 230B, and the oxide film 243A can be removed. Furthermore, the heat treatment improves the crystallinity of the oxide film 230B, thereby offering a dense structure with higher density.

Then, a conductive film 242A is deposited over the oxide film 243A (see FIG. 5A and FIG. 5B). The conductive film 242A can be deposited using a sputtering method, a CVD method, an MBE method, a PLD method, an ALD method, or the like. For example, for the conductive film 242A, titanium nitride is deposited using a sputtering method. Note that heat treatment may be performed before the formation of the conductive film 242A. This heat treatment may be performed under reduced pressure, and the conductive film 242A may be successively formed without exposure to the air. The treatment can remove moisture and hydrogen adsorbed onto a surface of the oxide film 243A and the like, and further can reduce the moisture concentration and the hydrogen concentration in the oxide film 230A, the oxide film 230B, and the oxide film 243A. The heat treatment is preferably performed at a temperature higher than or equal to 100° C. and lower than or equal to 400° C. In this embodiment, the heat treatment is performed at 200° C.

Figure 6A:
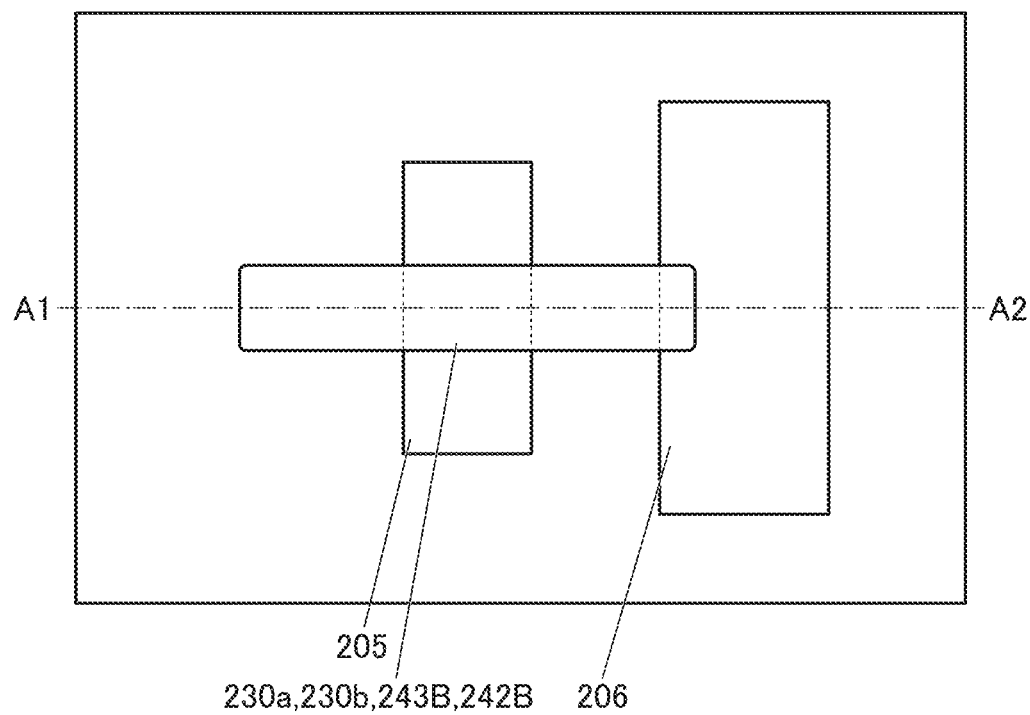
FIG. 6A is a top view showing a method of manufacturing a semiconductor device of one embodiment of the present invention.
Figure 6B:
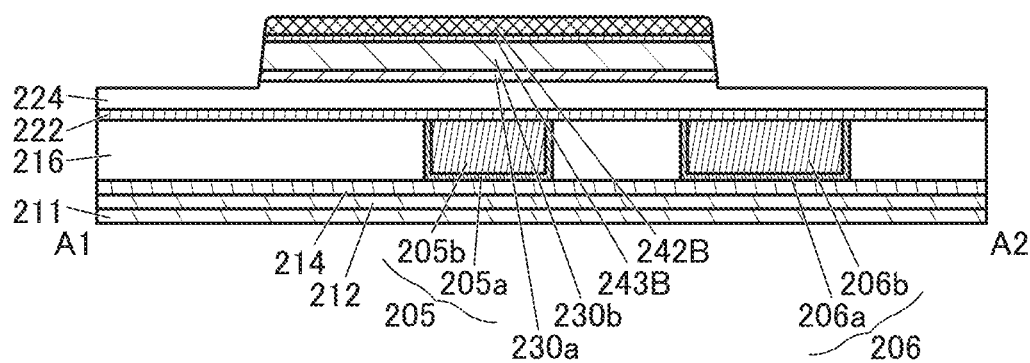
FIG. 6B is a cross-sectional view showing the method of manufacturing a semiconductor device of one embodiment of the present invention.

Next, the oxide film 230A, the oxide film 230B, the oxide film 243A, and the conductive film 242A are processed into island-like shapes using a lithography method to form the oxide 230a, the oxide 230b, an oxide layer 243B, and a conductor layer 242B (see FIG. 6A and FIG. 6B). A dry etching method or a wet etching method can be used for the processing. Processing using a dry etching method is suitable for microfabrication. The oxide film 230A, the oxide film 230B, the oxide film 243A, and the conductive film 242A may be processed under different conditions. Note that in this step, the thickness of the insulator 224 in a region not overlapping with the oxide 230a is reduced in some cases.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed with, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed using dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A may be performed after removing the resist mask or with the resist mask left. In the latter case, the resist mask sometimes disappears during the etching. The hard mask may be removed through etching after the etching of the conductive film 242A and the like. Meanwhile, the hard mask is not necessarily removed when the hard mask material does not affect later steps or can be utilized in later steps.

Here, the oxide 230a, the oxide 230b, the oxide layer 243B, and the conductor layer 242B are formed to at least partly overlap with the conductor 205. At least part of the conductor 206b is formed not to overlap with the oxide 230a, the oxide 230b, the oxide layer 243B, or the conductive layer 242B.

It is preferable that the side surfaces of the oxide 230a, the oxide 230b, the oxide layer 243B, and the conductor layer 242B be substantially perpendicular to a top surface of the insulator 222. When the side surfaces of the oxide 230a, the oxide 230b, the oxide layer 243B, and the conductor layer 242B are substantially perpendicular to the top surface of the insulator 222, a plurality of transistors 200 can be provided in a smaller area and at a higher density. Alternatively, a structure may be employed in which an angle formed by the side surfaces of the oxide 230a, the oxide 230b, the oxide layer 243B, and the conductive layer 242B and the top surface of the insulator 222 is an small angle. In that case, the angle formed by the side surfaces of the oxide 230a, the oxide 230b, the oxide layer 243B, and the conductive layer 242B and the top surface of the insulator 222 is preferably greater than or equal to 60° and less than 70°. With such a shape, in later steps, the coverage with the insulator 272 and the like can be improved, so that defects such as a void can be reduced.

There is a curved surface between the side surface of the conductive layer 242B and a top surface of the conductive layer 242B. That is, an end portion of the side surface and an end portion of the top surface are preferably curved. The curvature radius of the curved surface at the end portion of the conductive layer 242B is greater than or equal to 3 nm and less than or equal to 10 nm, preferably greater than or equal to 5 nm and less than or equal to 6 nm, for example. There is no angular shape at the edge between a side surface of the conductive layer 242B and a top surface of the conductive layer 242B, whereby coverage of films in the following formation steps are improved.

Figure 7A:
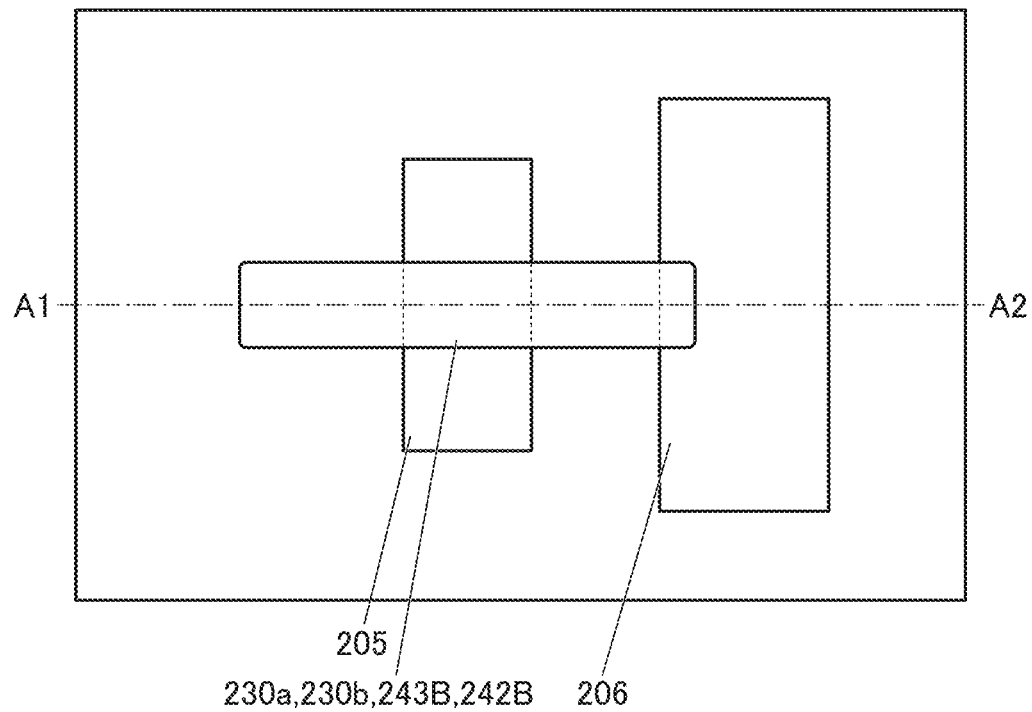
FIG. 7A is a top view showing a method of manufacturing a semiconductor device of one embodiment of the present invention.
Figure 7B:
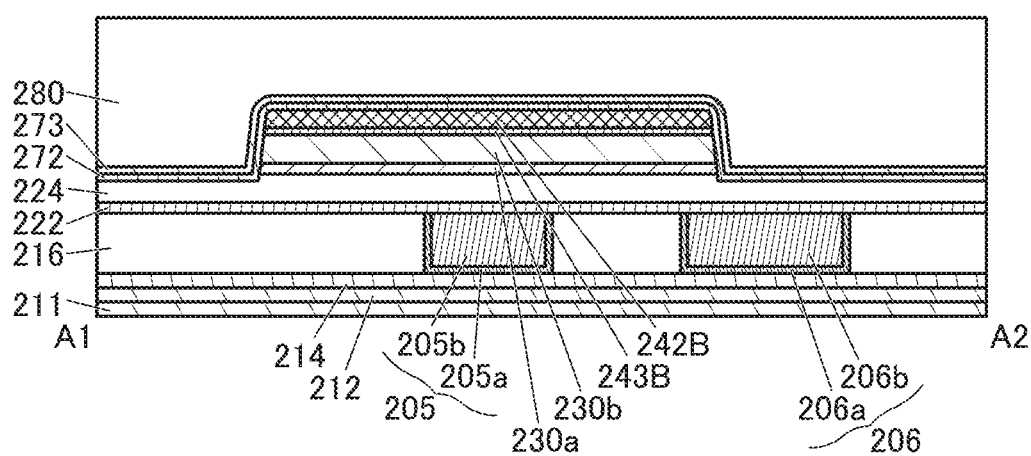
FIG. 7B is a cross-sectional view showing the method of manufacturing a semiconductor device of one embodiment of the present invention.
Figure 8A:
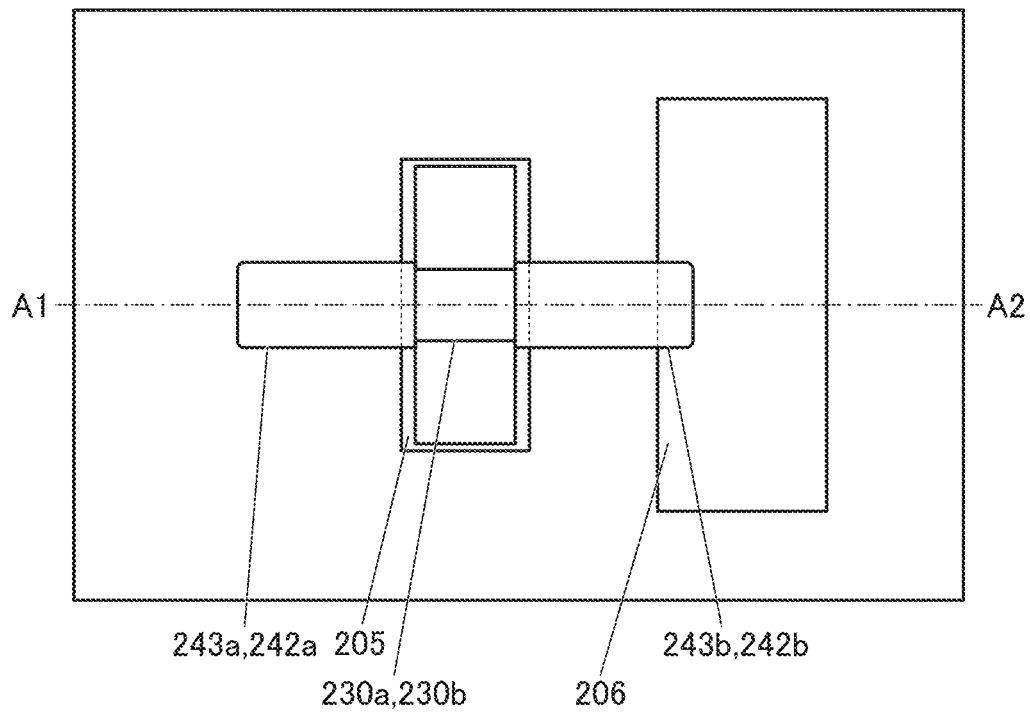
FIG. 8A is a top view showing a method of manufacturing a semiconductor device of one embodiment of the present invention.
Figure 8B:
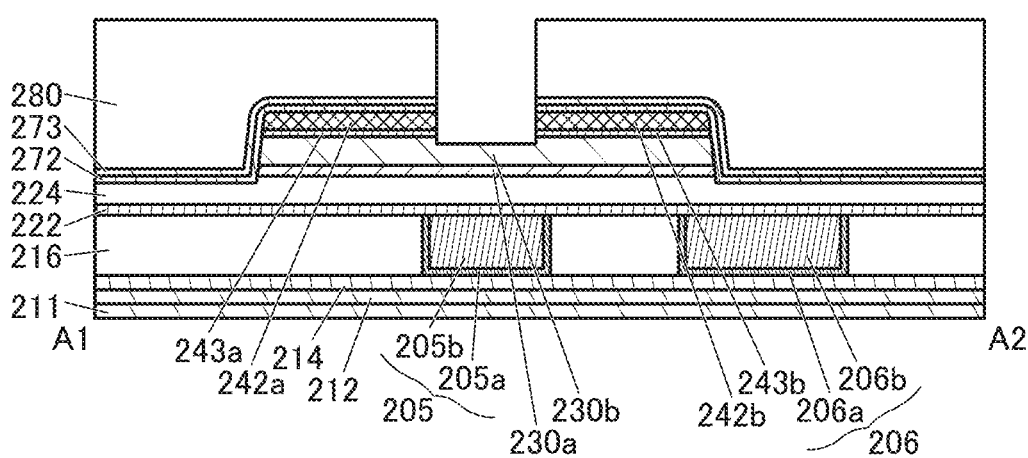
FIG. 8B is a cross-sectional view showing the method of manufacturing a semiconductor device of one embodiment of the present invention.

Then, the insulator 272 is deposited over the insulator 224, the oxide 230a, the oxide 230b, the oxide layer 243B, and the conductor layer 242B (see FIG. 7A and FIG. 7B). The insulator 272 can be deposited using a sputtering method, a CVD method, an MBE method, a PLD method, an ALD method, or the like. In this embodiment, for the insulator 272, aluminum oxide is deposited using a sputtering method. When an aluminum oxide film is deposited using a sputtering method, oxygen can be injected into the insulator 224.

Then, the insulator 273 is deposited over the insulator 272 (see FIG. 7A and FIG. 7B). The insulator 273 can be deposited using a sputtering method, a CVD method, an MBE method, a PLD method, an ALD method, or the like. In this embodiment, aluminum oxide is deposited as the insulator 273 using an ALD method. In this embodiment, silicon nitride may be deposited as the insulator 273 with a sputtering method.

Next, an insulating film to be the insulator 280 is deposited over the insulator 273. The insulating film can be deposited using a sputtering method, a CVD method, an MBE method, a PLD method, an ALD method, or the like. For example, as the insulating film, a silicon oxide film is deposited using a sputtering method, and a silicon oxide film is deposited thereover using a PEALD method or a thermal ALD method. The insulating film is preferably deposited using the deposition method using a gas in which hydrogen atoms are reduced or removed. Thus, the hydrogen concentration of the insulator 280 can be reduced. Note that heat treatment may be performed before the insulating film is deposited. The heat treatment may be performed under reduced pressure, and the insulating films may be successively formed without exposure to the air. The treatment can remove moisture and hydrogen adsorbed onto a surface of the insulator 273 and the like, and further can reduce the moisture concentration and the hydrogen concentration in the oxide 230a, the oxide 230b, the oxide layer 243B, and the insulator 224. The above heat treatment conditions can be used.

Next, the insulating film is subjected to CMP treatment, so that the insulator 280 having a flat top surface is formed (see FIG. 7A and FIG. 7B). Note that in a manner similar to that of the insulator 224, aluminum oxide may be deposited over the insulator 280 using a sputtering method, for example, and the aluminum oxide may be subjected to CMP until the insulator 280 is reached.

Here, microwave treatment may be performed. The microwave treatment is preferably performed in an atmosphere containing oxygen under reduced pressure. By performing the microwave treatment, an electric field from a microwave can be supplied to the insulator 280, the oxide 230b, the oxide 230a, and the like to divide VoH in the oxide 230b and the oxide 230a into Vo and hydrogen (H). Part of hydrogen divided at this time is bonded to oxygen contained in the insulator 280 and is removed as water molecules in some cases. Some hydrogen is gettered by the conductor 242 through the insulator 272 and the insulator 273 in some cases.

After the microwave treatment, heat treatment may be performed with the reduced pressure being maintained. Such treatment enables hydrogen in the insulator 280, the oxide 230b, and the oxide 230a to be removed efficiently. Note that the temperature of the heat treatment is preferably higher than or equal to 300° C. and lower than or equal to 500° C.

Performing the microwave treatment improves the film quality of the insulator 280, thereby inhibiting the diffusion of hydrogen, water, impurities, and the like. Accordingly, hydrogen, water, impurities, and the like can be inhibited from diffusing into the oxide 230 through the insulator 280 in a later step after the formation of the insulator 280, heat treatment, or the like.

Then, part of the insulator 280, part of the insulator 273, part of the insulator 272, part of the conductor layer 242B, part of the oxide layer 243B, and part of the oxide 230b are processed to form an opening reaching the oxide 230b. The opening is preferably formed to overlap with the conductor 205. The conductor 242a, the conductor 242b, the oxide 243a, and the oxide 243b are formed through the formation of the opening (see FIG. 8A and FIG. 8B).

An upper portion of the oxide 230b is removed when the opening is formed. When part of the oxide 230b is removed, a groove portion is formed in the oxide 230b. The groove portion may be formed in the same step as the formation of the opening or in a step different from the formation of the opening in accordance with the depth of the groove portion.

The part of the insulator 280, the part of the insulator 273, the part of the insulator 272, the part of the conductive layer 242B, the part of the oxide layer 243B, and the part of the oxide 230b can be processed with a dry etching method or a wet etching method. Processing using a dry etching method is suitable for microfabrication. The processing may be performed under different conditions. For example, part of the insulator 280 may be processed with a dry etching method, part of the insulator 273 and part of the insulator 272 may be processed with a wet etching method, and part of the oxide layer 243B, part of the conductor layer 242B, and part of the oxide 230b may be processed with a dry etching method. Processing of parts of the oxide layer 243B and the conductive layer 242B and processing of part of the oxide 230b may be performed under different conditions.

When the oxide 230b is partly removed to cut a groove with a dry etching method, a strong bias power is preferably applied. A bias power density is, for example, more than or equal to 0.02 W/cm$^2$, preferably more than or equal to 0.03 W/cm$^2$, further preferably more than or equal to 0.06 W/cm$^2$. The dry etching treatment time may be set as appropriate depending on the depth of the groove.

Here, it is preferable to remove impurities that are attached onto the surfaces of the oxide 230a, the oxide 230b, and the like or diffused into the oxide 230a, the oxide 230b, and the like. It is also preferable to remove the damaged region that is formed on the surface of the oxide 230b through the above dry etching. The impurities result from components contained in the insulator 280, the insulator 273, the insulator 272, and the conductive layer 242B; components contained in a member of an apparatus used to form the opening; and components contained in a gas or a liquid used for etching, for instance. Examples of the impurities include aluminum, silicon, tantalum, fluorine, and chlorine.

In particular, impurities such as aluminum and silicon block the oxide 230b or the oxide 230c from becoming a CAAC-OS. It is thus preferable to reduce or eliminate impurity elements such as aluminum and silicon, which block the oxide from becoming a CAAC-OS. For example, the concentration of aluminum atoms at the interface between the oxide 230b and the oxide 230c and in the vicinity thereof is lower than or equal to 5.0 atomic %, preferably lower than or equal to 2.0 atomic %, further preferably lower than or equal to 1.5 atomic %, still further preferably lower than or equal to 1.0 atomic %, and yet further preferably lower than 0.3 atomic %.

Note that in a metal oxide, a region that is hindered from becoming a CAAC-OS by impurities such as aluminum and silicon and becomes an amorphous-like oxide semiconductor (a-like OS) is referred to as a non-CAAC region in some cases. In the non-CAAC region, the density of the crystal structure is reduced to increase VoH; thus, the transistor is likely to be normally on. Hence, the non-CAAC region in the oxide 230b and the oxide 230c is preferably reduced or removed.

In contrast, the oxide 230b and the oxide 230c each preferably have a CAAC structure in a layer form. In particular, the CAAC structures are preferably formed to extend to the portions in the oxide 230b and the oxide 230c corresponding to a lower end portion of a drain. Here, in the transistor 200, the conductor 242a or the conductor 242b, and the vicinity thereof function as the drain. In other words, one or both of the oxide 230b and the oxide 230c in the vicinity of the lower edge portion of the conductor 242a (conductor 242b) preferably have a CAAC structure. In this manner, the damaged region of the oxide 230b is removed and the CAAC structure is formed in the edge portion of the drain, which significantly affects the drain withstand voltage, so that variation of the electrical characteristics of the transistor 200 can be further suppressed. The reliability of the transistor 200 can be improved.

In order to remove the above impurities and the like, cleaning treatment is performed. Examples of the cleaning method include wet cleaning using a cleaning solution and the like, plasma treatment using plasma, and cleaning by heat treatment, and any of these cleanings may be performed in appropriate combination. The cleaning treatment sometimes makes the groove deeper.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid may be higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is preferably used for the ultrasonic cleaning. Damage to the oxide 230b and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted hydrofluoric acid is performed and then, wet cleaning using pure water or carbonated water is performed. The cleaning treatment can remove impurities that are attached onto the surfaces of the oxide 230a, the oxide 230b, and the like or diffused into the oxide 230a, the oxide 230b, and the like. The crystallinity of the oxide 230c over the oxide 230b can be increased.

By the processing such as dry etching or the cleaning treatment, the thickness of the insulator 224 in a region that overlaps with the opening and does not overlap with the oxide 230b might become smaller than that in a region that overlaps with the oxide 230b.

After the etching or the cleaning treatment, heat treatment may be performed. The heat treatment is performed at a temperature higher than or equal to 100° C. and lower than or equal to 450° C., preferably higher than or equal to 350° C. and lower than or equal to 400° C., for example.

Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 230a and the oxide 230b to reduce the amount of oxygen vacancies Vo. This heat treatment can improve the crystallinity of the oxide 230b and the crystallinity of the oxide 230c which is formed in the groove of the oxide 230b. The heat treatment may be performed under reduced pressure. Alternatively, the heat treatment may be performed in an oxygen atmosphere, and then another heat treatment may be successively performed in a nitrogen atmosphere without exposure to the air.

Figure 9A:
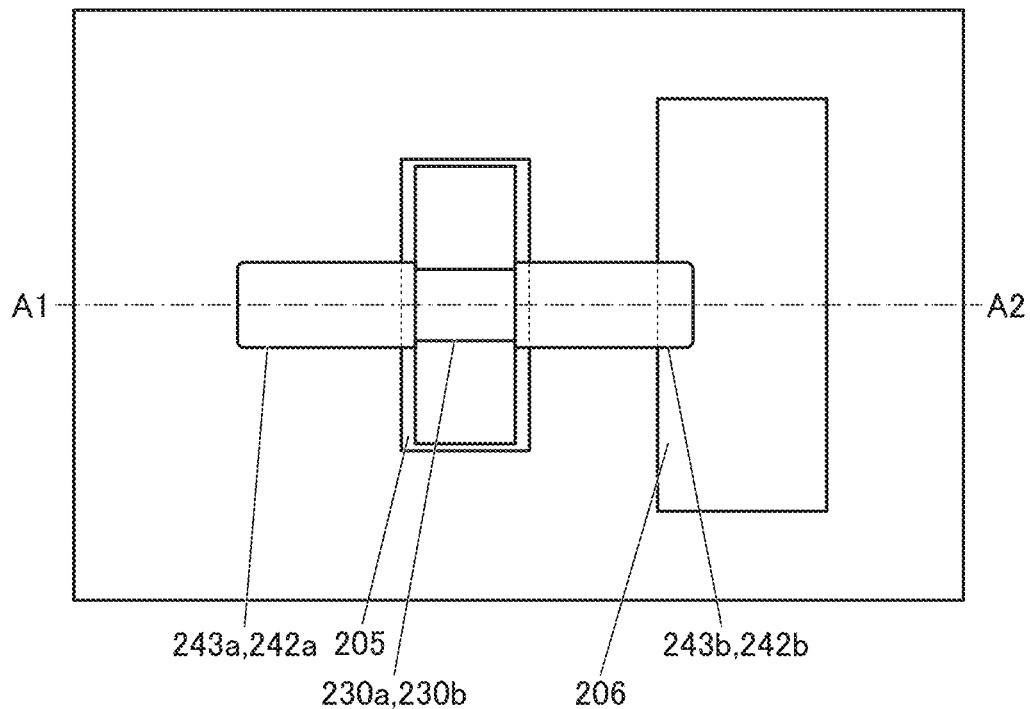
FIG. 9A is a top view showing a method of manufacturing a semiconductor device of one embodiment of the present invention.
Figure 9B:
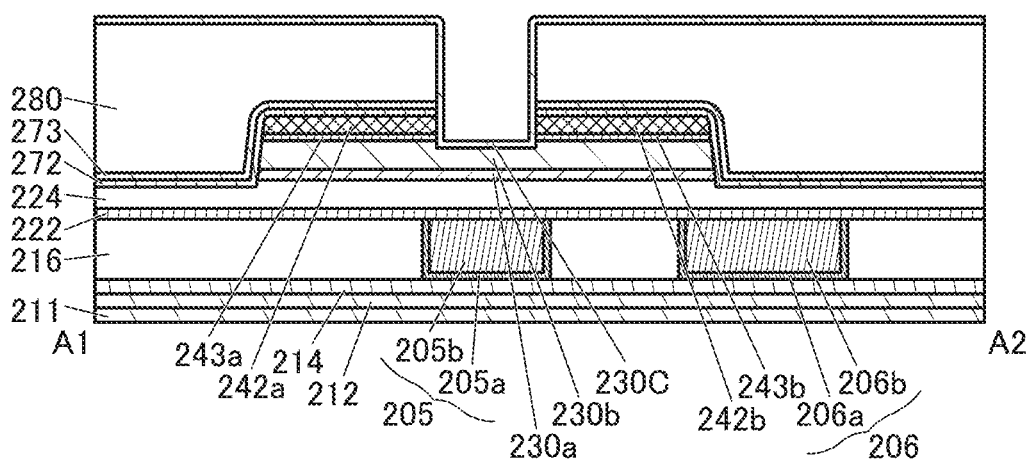
FIG. 9B is a cross-sectional view showing the method of manufacturing a semiconductor device of one embodiment of the present invention.

Next, an oxide film 230C is deposited (see FIG. 9A and FIG. 9B). The heat treatment may be performed before the oxide film 230C is deposited. It is preferable that the heat treatment be performed under a reduced pressure and the oxide film 230C be successively deposited without exposure to the air. Preferably, the heat treatment is performed in an atmosphere containing oxygen. Such treatment can remove moisture and hydrogen adsorbed on the surface of the oxide 230b or the like and can reduce the moisture concentration and the hydrogen concentration of the oxide 230a and the oxide 230b. The heat treatment is preferably performed at a temperature higher than or equal to 100° C. and lower than or equal to 400° C. In this embodiment, the heat treatment is performed at 200° C.

Note that the oxide film 230C is preferably provided in contact with at least the inner wall of the groove formed in the oxide 230b, part of the side surface of the oxide 243, part of the side surface of the conductor 242, part of the side surface of the insulator 272, part of the side surface of the insulator 273, and part of the side surface of the insulator 280. When the conductor 242 is surrounded by the oxide 243, the insulator 272, the insulator 273, and the oxide film 230C, a decrease in the conductivity of the conductor 242 due to oxidation in a later step can be inhibited.

The oxide film 230C can be formed with a sputtering method, a CVD method, an MBE method, a PLD method, an ALD method, or the like. The oxide film 230C may be formed with a deposition method similar to that for the oxide film 230A or the oxide film 230B depending on characteristics required for the oxide film 230C. In this embodiment, the oxide film 230C is formed with a sputtering method using an oxide target with In:Ga:Zn=4:2:3 [atomic ratio], an oxide target with In:Ga:Zn=5:1:3 [atomic ratio], an oxide target with In:Ga:Zn=10:1:3 [atomic ratio], or an indium oxide target.

Part of oxygen contained in the sputtering gas is sometimes supplied to the oxide 230a and the oxide 230b during the deposition of the oxide film 230C. Alternatively, in the deposition of the oxide film 230C, part of oxygen contained in the sputtering gas is supplied to the insulator 280 in some cases. Therefore, the proportion of oxygen in the sputtering gas for formation of the oxide film 230C is preferably 70% or higher, further preferably 80% or higher, still further preferably 100%. By forming the oxide film 230C under an atmosphere containing much oxygen, the oxide film 230C is likely to be CAAC-OS.

The oxide film 230C is preferably formed while the substrate is heated. In that case, the substrate temperature is set to higher than or equal to 200° C., so that oxygen vacancies in the oxide film 230C and the oxide 230b can be reduced. The deposition is performed while the substrate is being heated, whereby the crystallinity of the oxide film 230C and the oxide 230b can be improved.

Figure 10A:
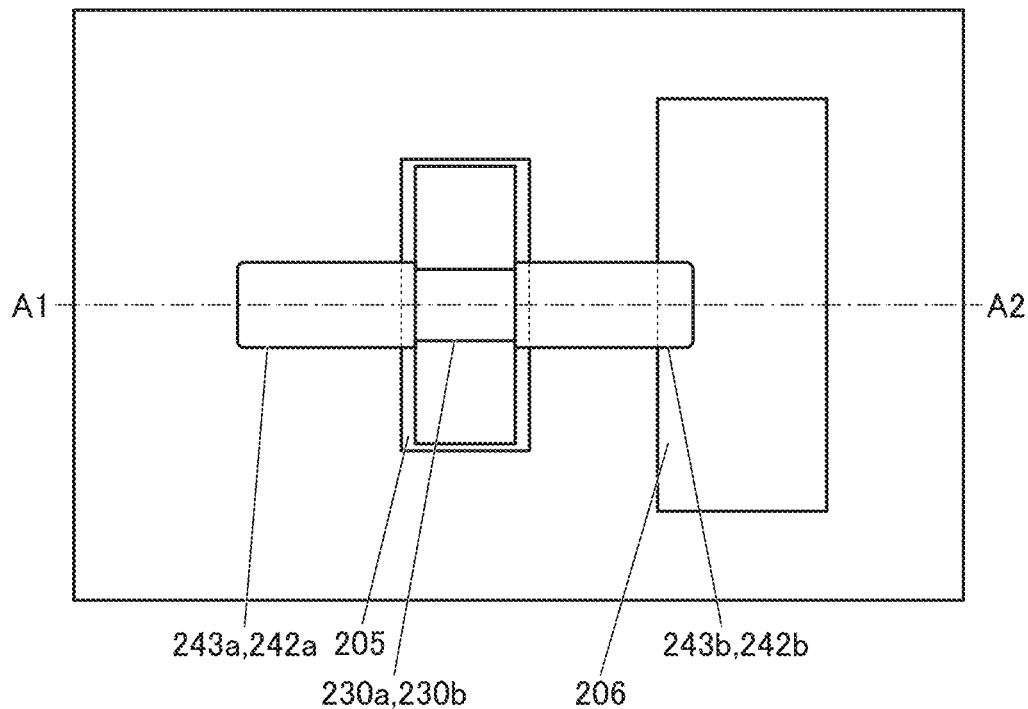
FIG. 10A is a top view showing a method of manufacturing a semiconductor device of one embodiment of the present invention.
Figure 10B:
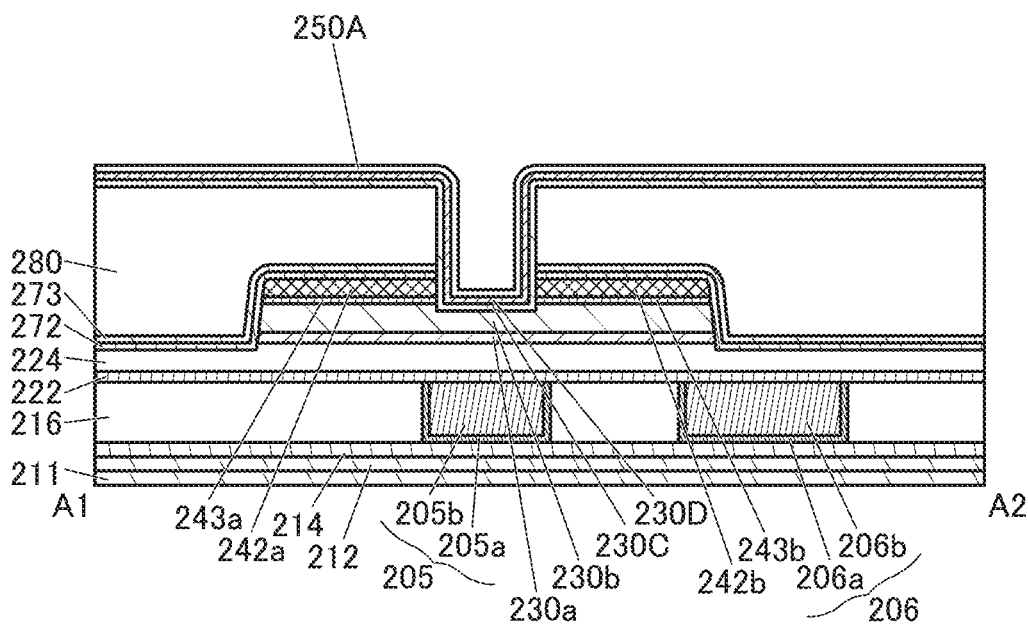
FIG. 10B is a cross-sectional view showing the method of manufacturing a semiconductor device of one embodiment of the present invention.

Next, an oxide film 230D is formed (see FIG. 10A and FIG. 10B). The oxide film 230D may be successively formed after the formation of the oxide film 230C without being exposed to the air.

The oxide film 230D can be deposited with a sputtering method, a CVD method, an MBE method, a PLD method, an ALD method, or the like. The oxide film 230D is deposited with a method similar to that for the oxide film 230A or the oxide film 230B in accordance with characteristics required for the oxide film 230D. In this embodiment, the oxide film 230D is deposited with a sputtering method using an oxide target with In:Ga:Zn=In:Ga:Zn=1:3:4 [atomic ratio].

Part of oxygen contained in the sputtering gas is sometimes supplied to the oxide film 230C during the deposition of the oxide film 230D. Alternatively, in the deposition of the oxide film 230D, part of oxygen contained in the sputtering gas is supplied to the insulator 280 in some cases. Therefore, the proportion of oxygen contained in the sputtering gas for the oxide film 230D is higher than or equal to 70%, preferably higher than or equal to 80%, further preferably 100%.

Next, an insulating film 250A is deposited (see FIG. 10A and FIG. 10B). Heat treatment may be performed before the deposition of the insulating film 250A, the heat treatment may be performed under reduced pressure, and the insulating film 250A may be successively deposited without exposure to the air. Preferably, the heat treatment is performed in an atmosphere containing oxygen. The treatment enables removal of moisture and hydrogen adsorbed onto the surface of the oxide film 230C and the like, and further enables reductions in the moisture concentration and the hydrogen concentration in the oxide 230a, the oxide 230b, and the oxide film 230C. The heat treatment is preferably performed at a temperature higher than or equal to 100° C. and lower than or equal to 400° C.

The insulating film 250A can be deposited using a sputtering method, a CVD method, an MBE method, a PLD method, an ALD method, or the like. The insulating film 250A is preferably deposited using a deposition method using a gas in which hydrogen atoms are reduced or removed. This reduces the hydrogen concentration of the insulating film 250A. The hydrogen concentration is preferably reduced because the insulating film 250A becomes the insulator 250 that is in contact with the oxide 230d in a later step.

Note that in the case where the insulator 250 has a stacked-layer structure of two layers, the insulating film to be the lower layer of the insulator 250 and the insulating film to be the upper layer of the insulator 250 are preferably deposited successively without being exposed to the air. When deposition without exposure to the air is performed, attachment of impurities or moisture from the atmosphere to the insulating film to be the lower layer of the insulator 250 and the insulating film to be the upper layer of the insulator 250 can be prevented, whereby the vicinity of the interface between the insulating film to be the lower layer of the insulator 250 and the insulating film to be the upper layer of the insulator 250 can be kept clean.

Here, after the insulating film 250A is deposited, the microwave treatment may be performed in an atmosphere containing oxygen under reduced pressure. By performing the microwave treatment, an electric field of a microwave is applied to the insulating film 250A, the oxide film 230C, the oxide 230b, the oxide 230a, and the like, so that VoH in the oxide film 230C, the oxide 230b, and the oxide 230a can be divided into Vo and hydrogen. Some hydrogen divided at this time is bonded to oxygen and is removed as $H_2O$ from the insulating film 250A, the oxide film 230C, the oxide 230b, and the oxide 230a in some cases. In other cases, part of hydrogen is gettered by the conductor 242. Performing the microwave treatment in such a manner can reduce the hydrogen concentration in the insulating film 250A, the oxide film 230C, the oxide 230b, and the oxide 230a. Furthermore, oxygen is supplied to Vo that can exist after VoH in the oxide 230a, the oxide 230b, and the oxide film 230C is divided into Vo and hydrogen, so that Vo can be repaired or filled.

After the microwave treatment, heat treatment may be performed with the reduced pressure being maintained. Such treatment enables hydrogen in the insulating film 250A, the oxide film 230C, the oxide 230b, and the oxide 230a to be removed efficiently. In other cases, part of hydrogen is gettered by the conductor 242. Alternatively, it is possible to repeat the step of performing heat treatment with the reduced pressure being maintained after the microwave treatment. The repetitions of the heat treatment enable hydrogen in the insulating film 250A, the oxide film 230C, the oxide 230b, and the oxide 230a to be removed more efficiently. Note that the temperature of the heat treatment is preferably higher than or equal to 300° C. and lower than or equal to 500° C.

Furthermore, the microwave treatment improves the film quality of the insulating film 250A, thereby inhibiting the diffusion of hydrogen, water, impurities, and the like. Accordingly, hydrogen, water, impurities, and the like can be inhibited from being diffused into the oxide 230b, the oxide 230a, and the like through the insulator 250 in a later step such as deposition of a conductive film to be the conductor 260 or a later treatment such as heat treatment.

Figure 11A:
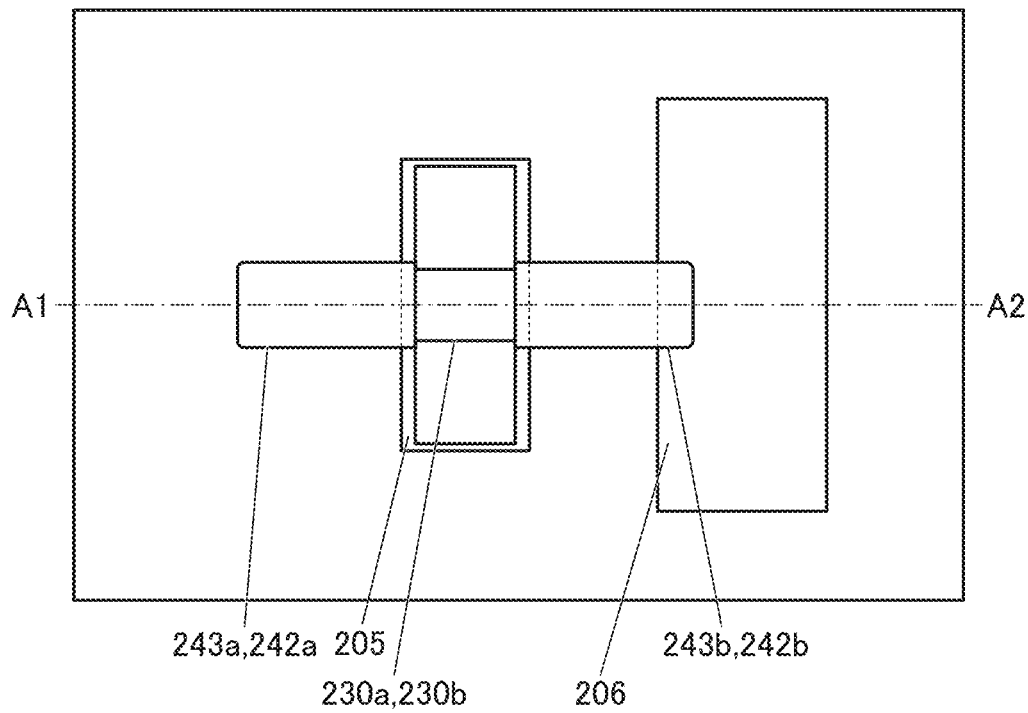
FIG. 11A is a top view showing a method of manufacturing a semiconductor device of one embodiment of the present invention.
Figure 11B:
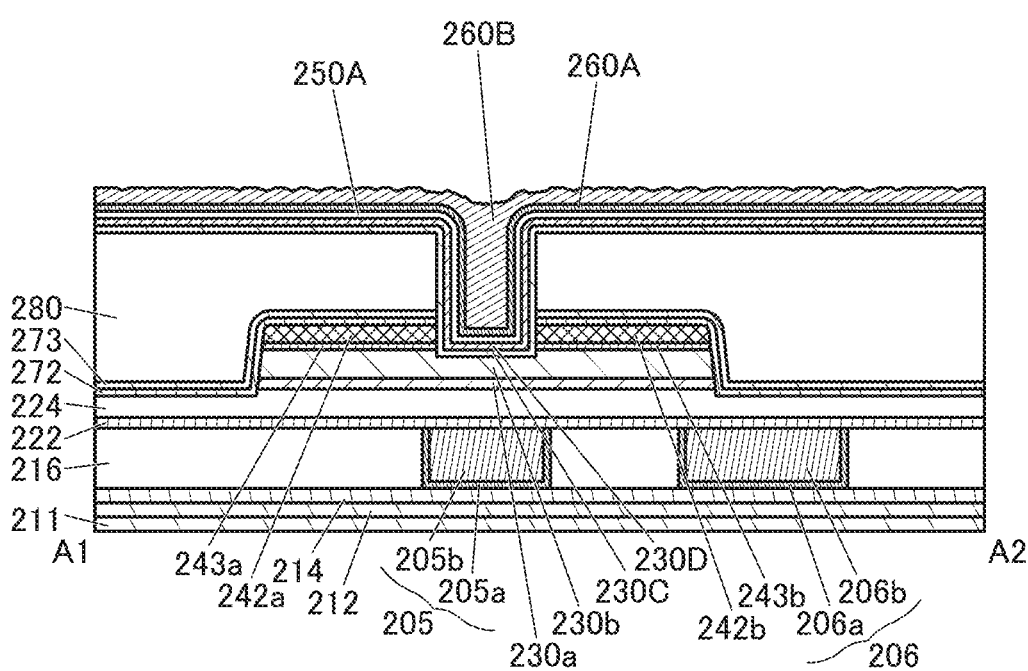
FIG. 11B is a cross-sectional view showing the method of manufacturing a semiconductor device of one embodiment of the present invention.

Next, a conductive film 260A and a conductive film 260B are deposited in this order (see FIG. 11A and FIG. 11B). The conductive film 260A and the conductive film 260B can be deposited using a sputtering method, a CVD method, an MBE method, a PLD method, an ALD method, or the like. In this embodiment, the conductive film 260A is deposited using an ALD method, and the conductive film 260B is deposited using a CVD method.

Figure 12A:
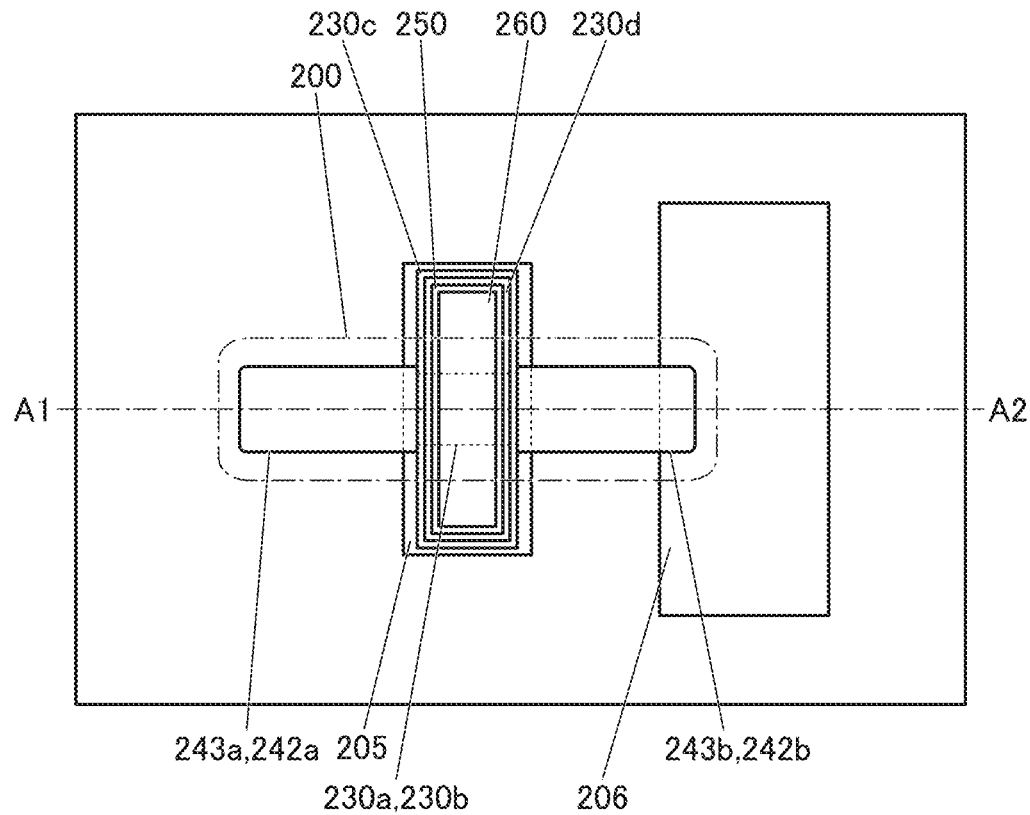
FIG. 12A is a top view showing a method of manufacturing a semiconductor device of one embodiment of the present invention.
Figure 12B:
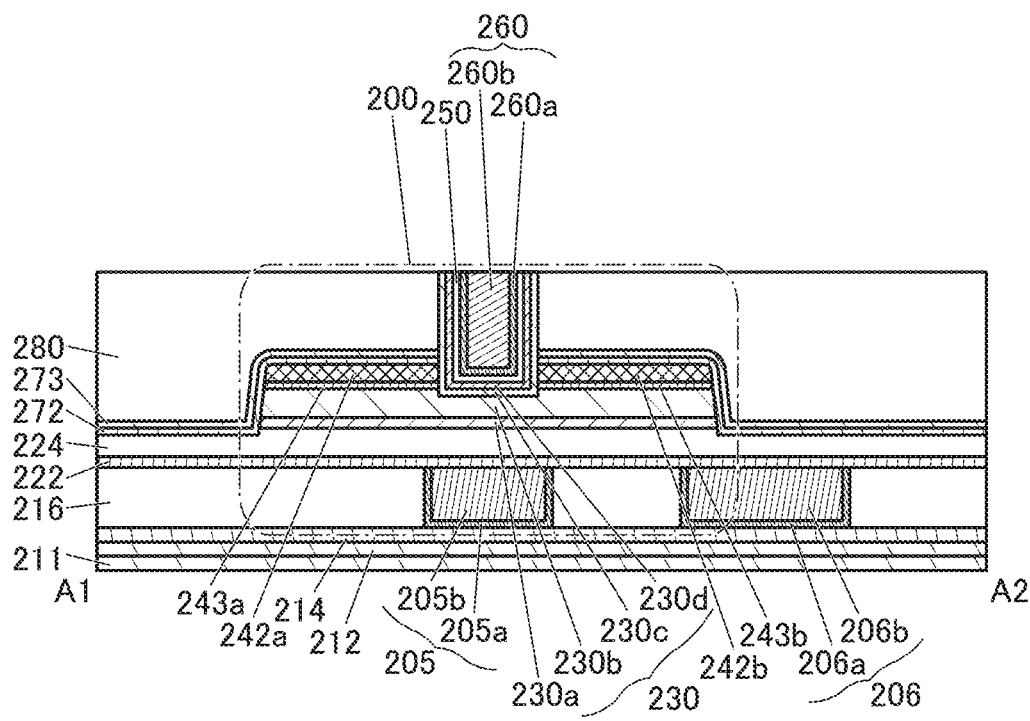
FIG. 12B is a cross-sectional view showing the method of manufacturing a semiconductor device of one embodiment of the present invention.

Then, the oxide film 230C, the oxide film 230D, the insulating film 250A, the conductive film 260A, and the conductive film 260B are polished with CMP treatment until the insulator 280 is exposed, whereby the oxide 230c, the oxide 230d, the insulator 250, and the conductor 260 are formed (see FIG. 12A and FIG. 12B). Accordingly, the oxide 230c is positioned to cover the inner wall (the side wall and bottom surface) of the opening reaching the oxide 230b and the groove of the oxide 230b. The oxide 230d is positioned to cover the inner wall of the opening and the groove with the oxide 230c therebetween. The insulator 250 is positioned to cover the inner wall of the opening and the groove with the oxide 230d therebetween. The conductor 260 is positioned to fill the opening and the groove with the oxide 230c, the oxide 230d, and the insulator 250 therebetween.

Next, heat treatment may be performed. In this embodiment, treatment is performed at 400° C. in a nitrogen atmosphere for one hour. The heat treatment can reduce the moisture concentration and the hydrogen concentration in the insulator 250 and the insulator 280. After the heat treatment, the insulator 282 may be successively deposited without exposure to the air.

Figure 13A:
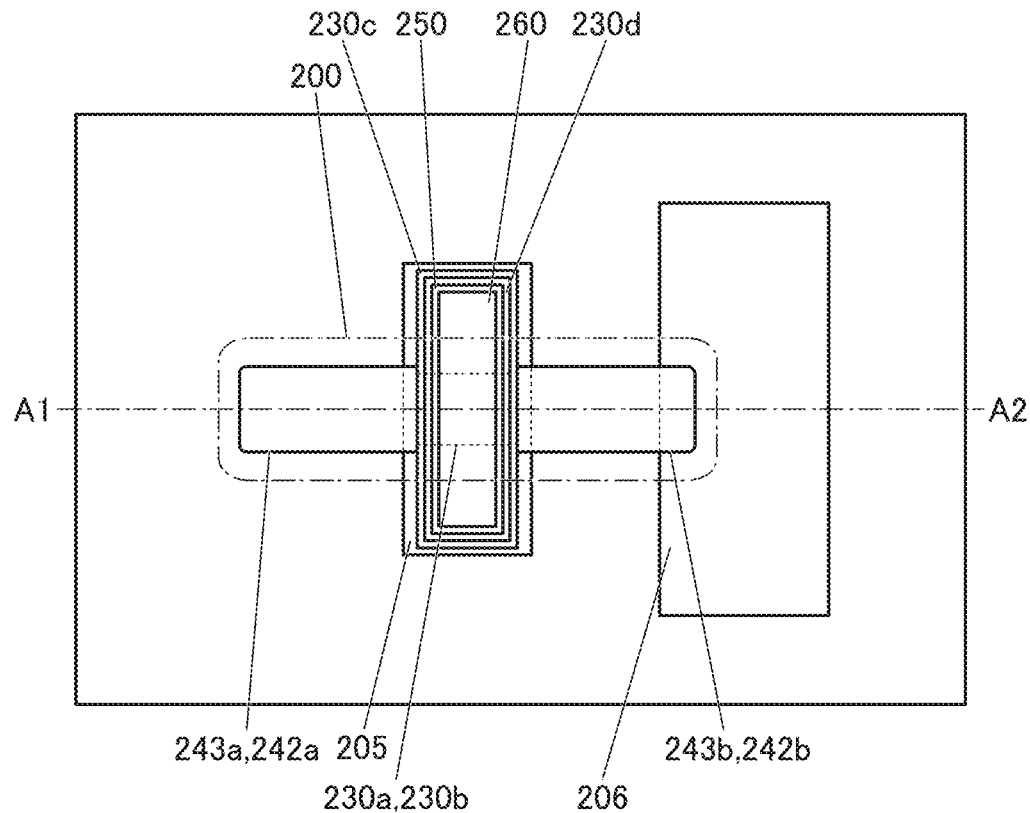
FIG. 13A is a top view showing a method of manufacturing a semiconductor device of one embodiment of the present invention.
Figure 13B:
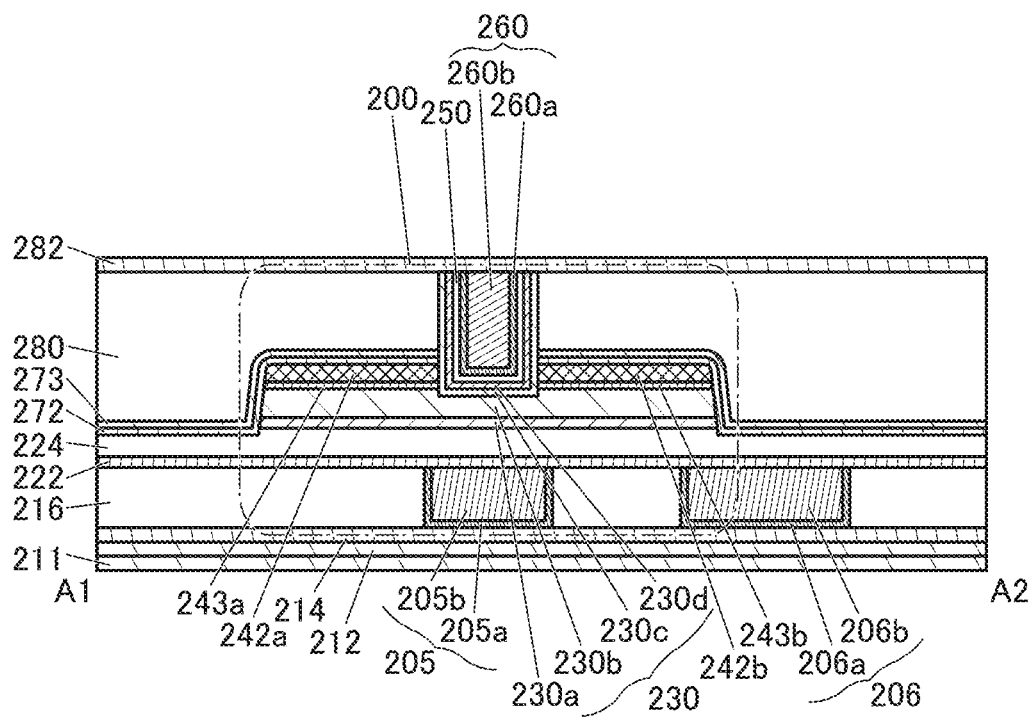
FIG. 13B is a cross-sectional view showing the method of manufacturing a semiconductor device of one embodiment of the present invention.

Next, the insulator 282 is formed over the oxide 230c, the insulator 250, the conductor 260, and the insulator 280 (see FIG. 13A and FIG. 13B). The insulator 282 can be deposited using a sputtering method, a CVD method, an MBE method, a PLD method, an ALD method, or the like. Aluminum oxide is preferably deposited as the insulator 282 using a sputtering method, for example. The insulator 282 is deposited with a sputtering method in an oxygen-containing atmosphere, whereby oxygen can be added to the insulator 280 during the deposition. At this time, the insulator 282 is preferably deposited while the substrate is being heated. It is preferable to form the insulator 282 in contact with the top surface of the conductor 260 because oxygen contained in the insulator 280 can be inhibited from being absorbed by the conductor 260 in a later heat treatment.

Figure 14A:
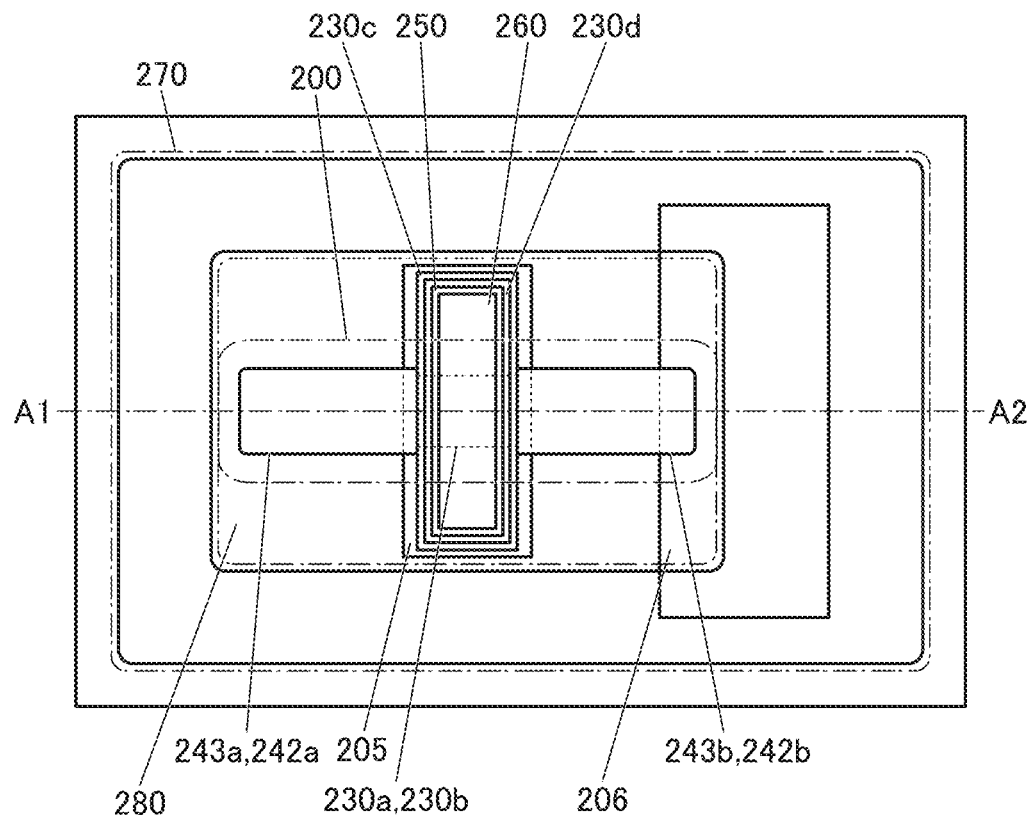
FIG. 14A is a top view showing a method of manufacturing a semiconductor device of one embodiment of the present invention.
Figure 14B:
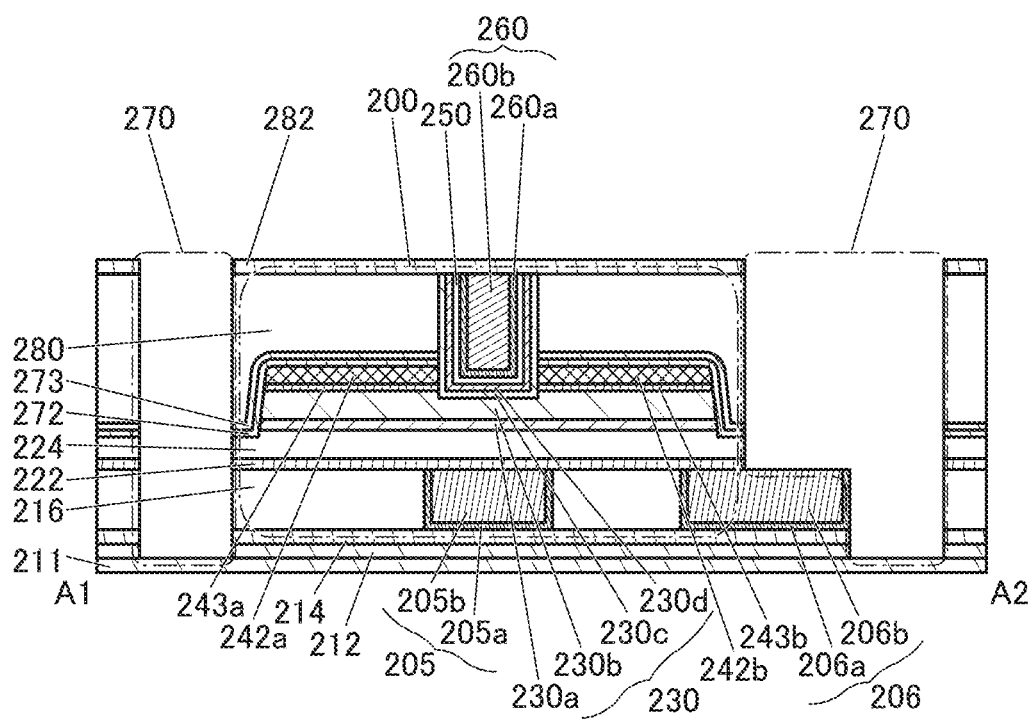
FIG. 14B is a cross-sectional view showing the method of manufacturing a semiconductor device of one embodiment of the present invention.

Next, part of the insulator 282, part of the insulator 280, part of the insulator 273, part of the insulator 272, part of the insulator 224, part of the insulator 222, part of the insulator 216, part of the insulator 214, and part of the insulator 212 are processed, and the opening 270 reaching the insulator 211 is formed (see FIG. 14A and FIG. 14B). Accordingly, part of the side surface of the insulator 282, part of the side surface of the insulator 280, part of the side surface of the insulator 273, part of the side surface of the insulator 272, part of the side surface of the insulator 224, part of the side surface of the insulator 222, part of the side surface of the insulator 216, part of the side surface of the insulator 214, and part of the side surface of the insulator 212 are exposed in the opening 270. The opening 270 may be formed so as to surround the transistor 200 in the top view. The opening 270 may be formed to surround a plurality of the transistors 200.

The capacitor 201 formed in a later step is formed in a region where the conductor 206 and the opening 270 overlap. Thus, the opening 270 is formed so that at least part of the conductor 206 is exposed. In other words, at least part of the conductor 206 includes a region not overlapping with the insulator 282, the insulator 280, the insulator 273, the insulator 272, the insulator 224, the insulator 222, the insulator 216, the insulator 214, or the insulator 212.

Furthermore, at least part of the side surface of the conductor 206 is preferably exposed inside the opening 270. With such a structure, the conductor 248 can be provided to face the side surface of the conductor 206 in a later step; the capacitor 201 can be formed at the side surface of the conductor 206.

The part of the insulator 282, the part of the insulator 280, the part of the insulator 273, the part of the insulator 272, the part of the insulator 224, the part of the insulator 222, the part of the insulator 216, the part of the insulator 214, and the part of the insulator 212 can be processed with a dry etching method or a wet etching method. Processing using a dry etching method is suitable for microfabrication. The processing may be performed under different conditions.

Figure 15A:
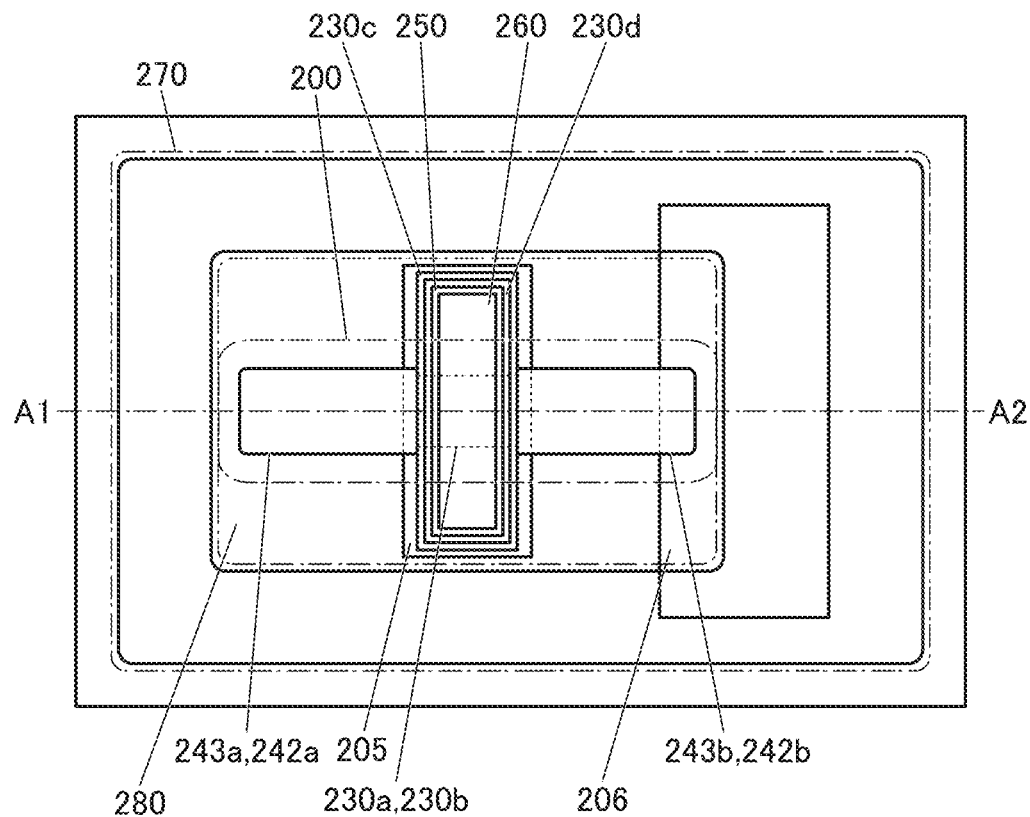
FIG. 15A is a top view showing a method of manufacturing a semiconductor device of one embodiment of the present invention.
Figure 15B:
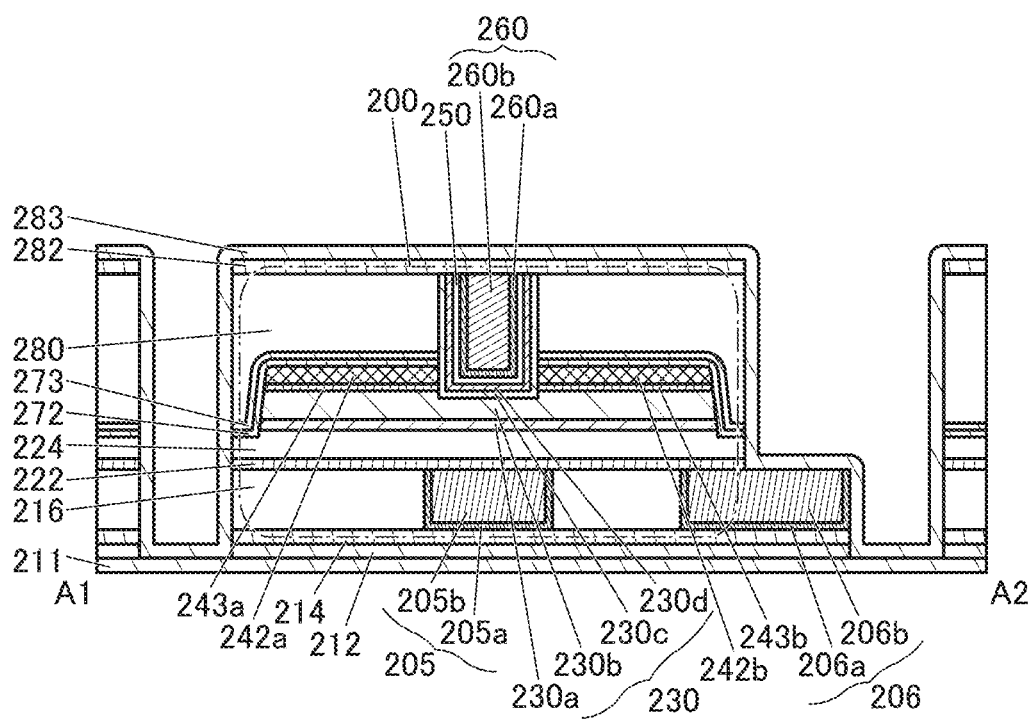
FIG. 15B is a cross-sectional view showing the method of manufacturing a semiconductor device of one embodiment of the present invention.

Next, an insulator 283 is formed to cover the insulator 282, the insulator 280, the insulator 273, the insulator 272, the insulator 224, the insulator 222, the insulator 216, the insulator 214, the insulator 212, and the conductor 206 (see FIG. 15A and FIG. 15B). The insulator 283 can be deposited with a sputtering method, a CVD method, an MBE method, a PLD method, an ALD method, or the like. For example, silicon nitride may be formed using a sputtering method. As shown in FIG. 15B, the insulator 283 is in contact with the insulator 211 at the bottom surface of the opening 270. That is, the top surface and the side surface of the transistor 200 are surrounded by the insulator 283 and the bottom surface of the transistor 200 is surrounded by the insulator 211. Surrounding the transistor 200 by the insulator 283 and the insulator 211 having high barrier properties inhibits entry of moisture and hydrogen from the outside.

Figure 16A:
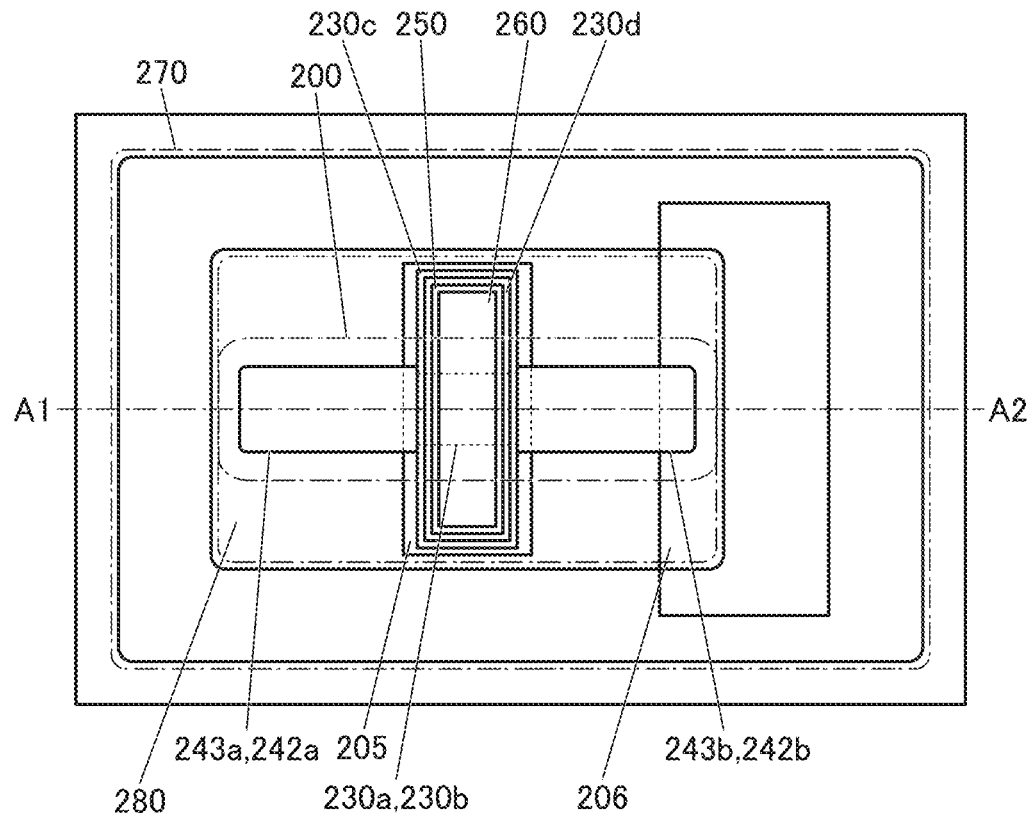
FIG. 16A is a top view showing a method of manufacturing a semiconductor device of one embodiment of the present invention.
Figure 16B:
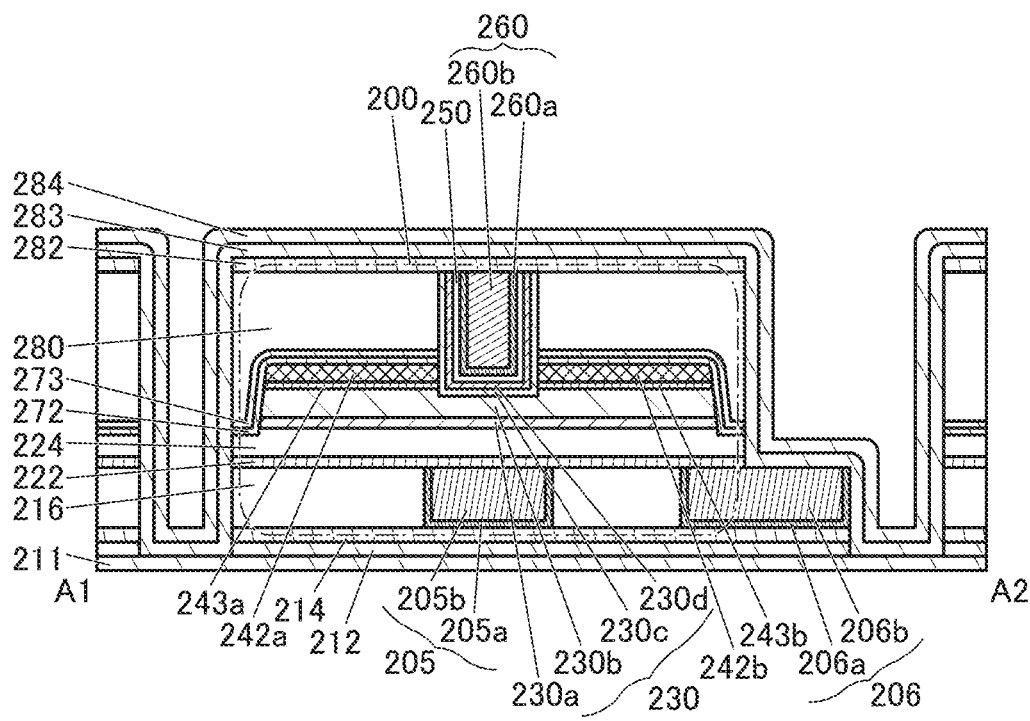
FIG. 16B is a cross-sectional view showing the method of manufacturing a semiconductor device of one embodiment of the present invention.

Next, the insulator 284 is preferably formed over the insulator 283 (see FIG. 16A and FIG. 16B). For example, the insulator 284 can be formed with a sputtering method, a CVD method, an MBE method, a PLD method, an ALD method, or the like. The insulator 284 is preferably formed using the same material as those for the insulator 212 and the insulator 283.

Note that the insulator 284 is preferably deposited with a deposition method that enables high coverage. Specifically, silicon nitride is preferably deposited with a CVD method. It is particularly preferable that the insulator 284 be deposited using a CVD method using a compound gas containing no hydrogen atom or having a low hydrogen atom content.

The insulator 283 and the insulator 284 function as barrier insulating films to seal the transistor 200 and as dielectric films of the capacitor 201. Thus, the insulator 283 and the insulator 284 are formed as described above, whereby dielectric films of the capacitor 201 can be provided with no additional step.

Figure 17A:
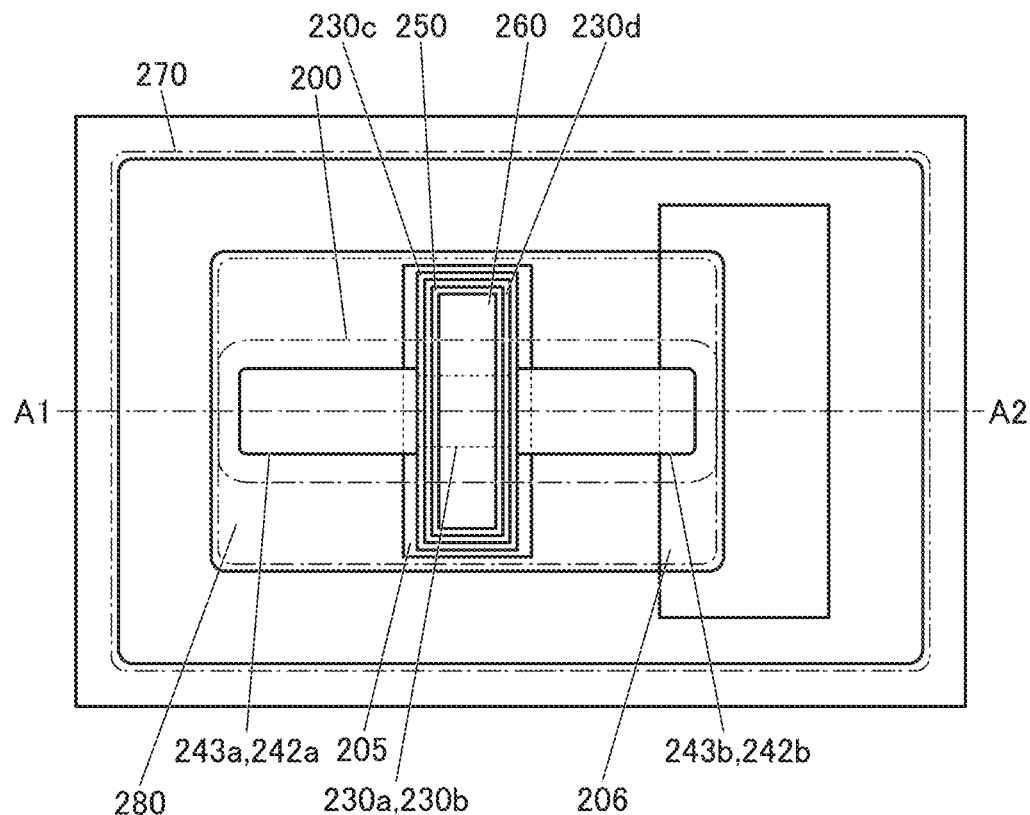
FIG. 17A is a top view showing a method of manufacturing a semiconductor device of one embodiment of the present invention.
Figure 17B:
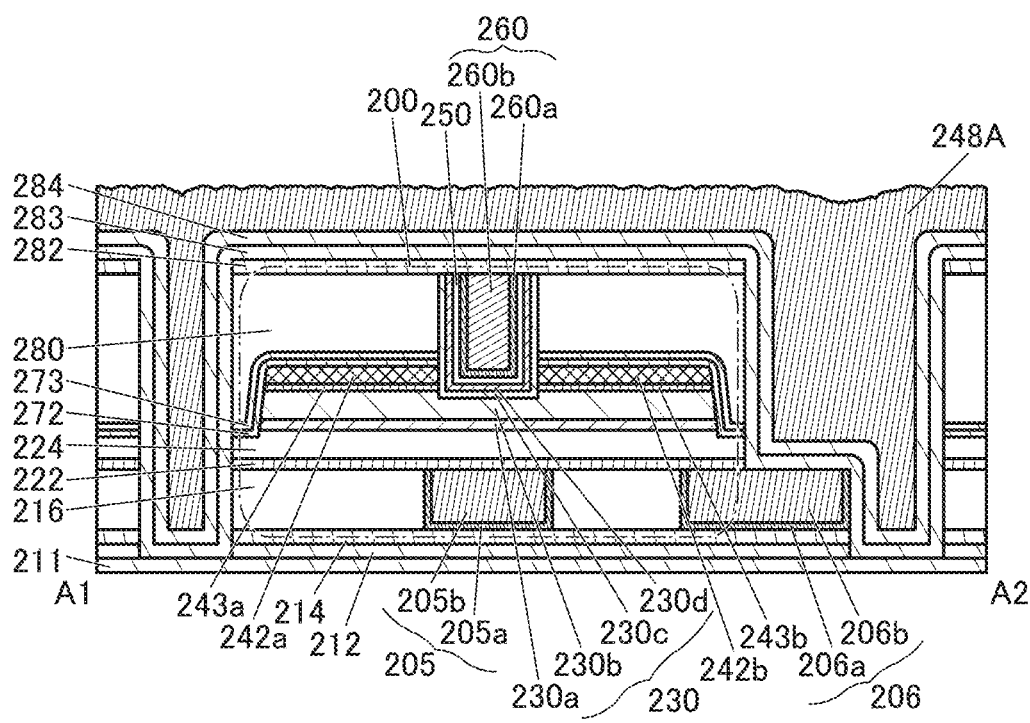
FIG. 17B is a cross-sectional view showing the method of manufacturing a semiconductor device of one embodiment of the present invention.

Next, a conductive film 248A is formed over the insulator 284 (see FIG. 17A and FIG. 17B). The conductive film 248A is formed to be embedded in the opening 270 in which the insulator 283 and the insulator 284 have been formed. The conductive film 248A can be formed using a sputtering method, a CVD method, an MBE method, a PLD method, an ALD method, or the like. The conductive film 248A may have either a single-layer structure or a stacked-layer structure. The conductive film 248A may be formed in such a manner that titanium nitride is deposited using an ALD method and tungsten is deposited over the titanium nitride using a CVD method, for example.

Figure 18A:
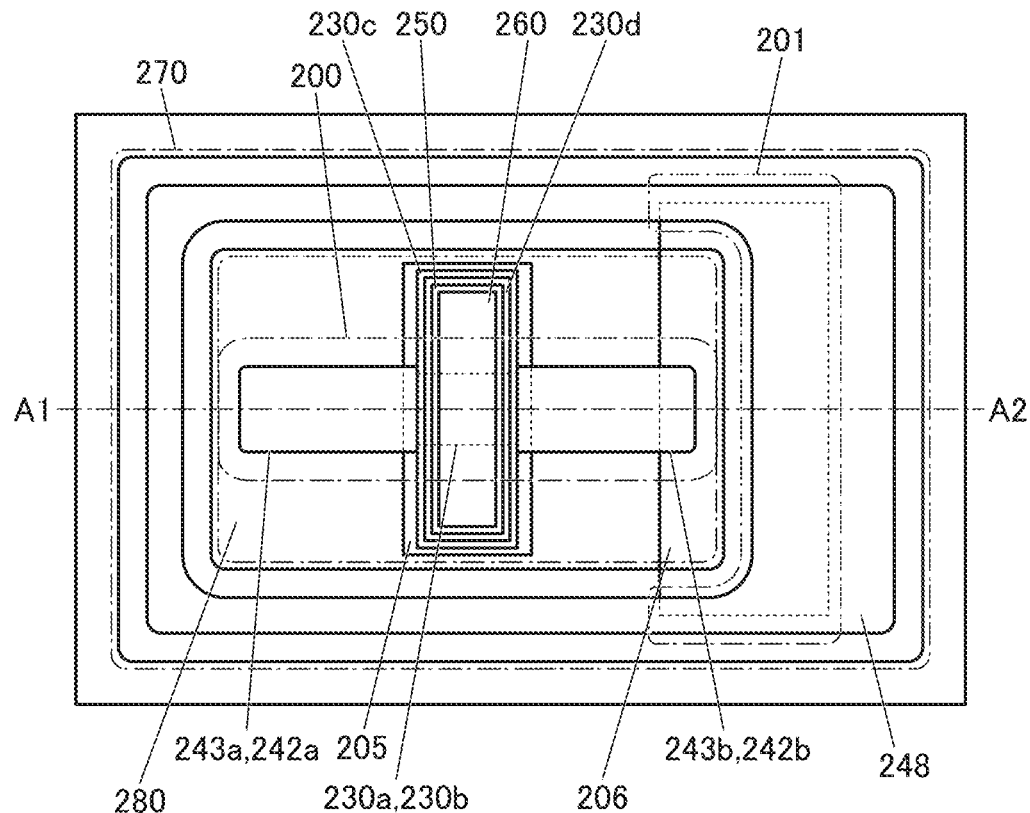
FIG. 18A is a top view showing a method of manufacturing a semiconductor device of one embodiment of the present invention.
Figure 18B:
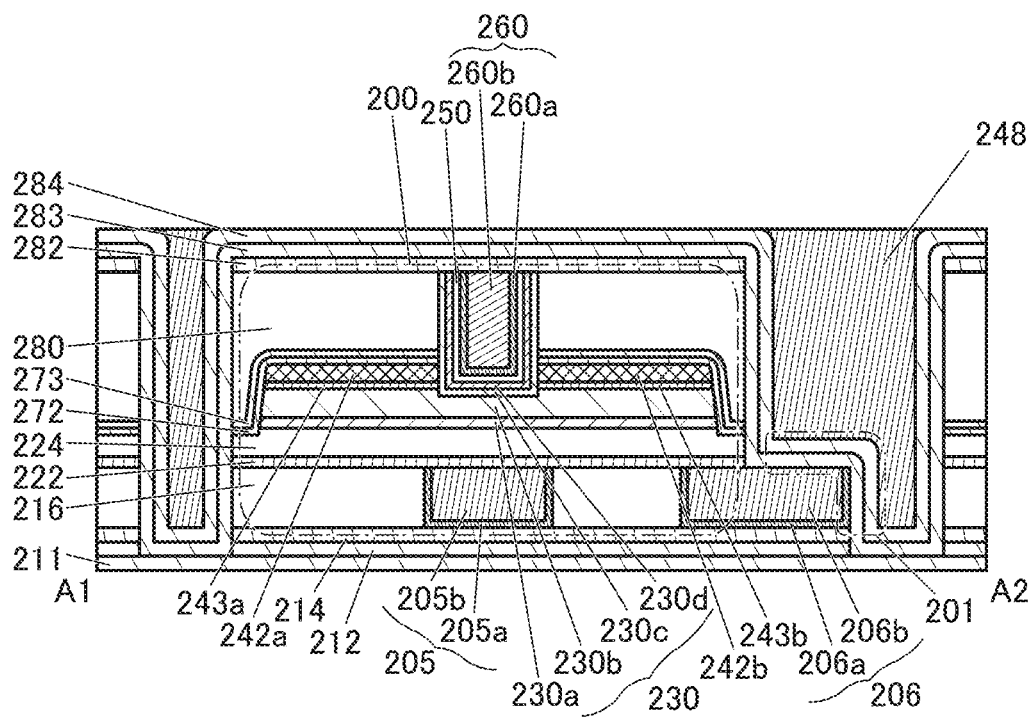
FIG. 18B is a cross-sectional view showing the method of manufacturing a semiconductor device of one embodiment of the present invention.

Next, using CMP treatment, the conductive film 248A is polished until the insulator 284 is exposed, whereby the conductor 248 is formed (see FIG. 18A and FIG. 18B). Thus, the conductor 248 is embedded in the opening 270. The conductor 248 is formed using CMP treatment, whereby the top surface of the conductor 248 is substantially level with the top surface of the insulator 284.

Since the conductor 248 is formed to be embedded in the opening 270 in this manner, the conductor 248 functioning as the upper electrode of the capacitor 201 can be formed with no additional mask.

Figure 19A:
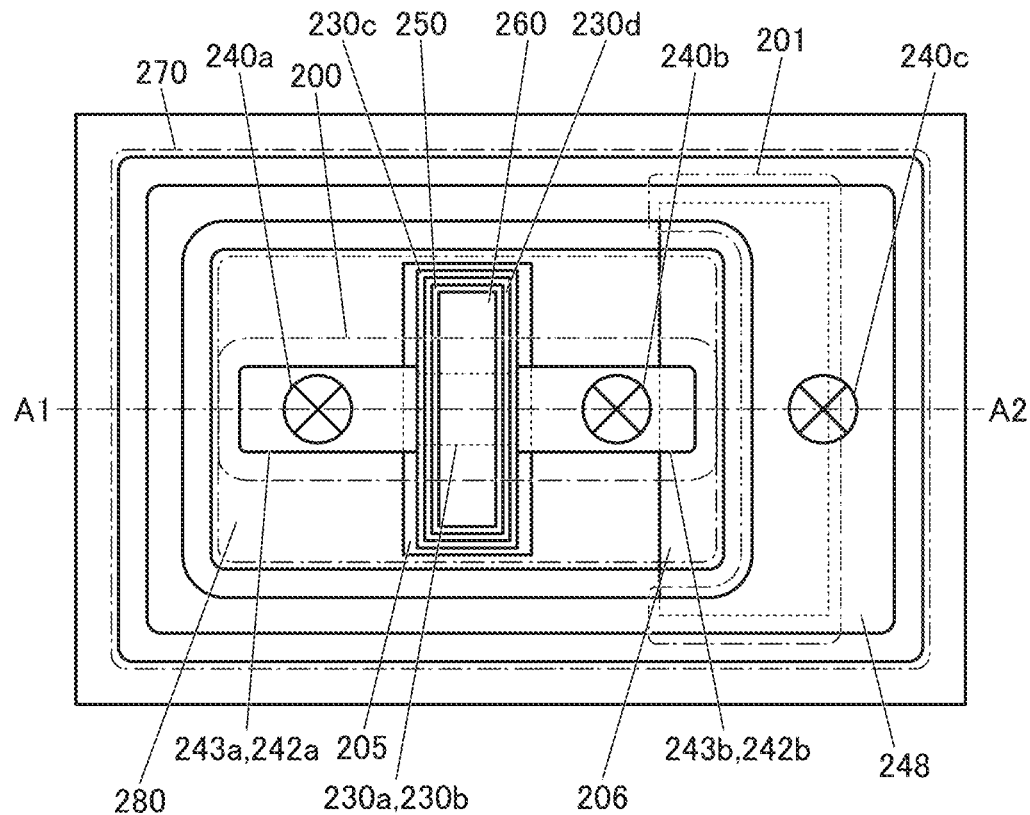
FIG. 19A is a top view showing a method of manufacturing a semiconductor device of one embodiment of the present invention.
Figure 19B:
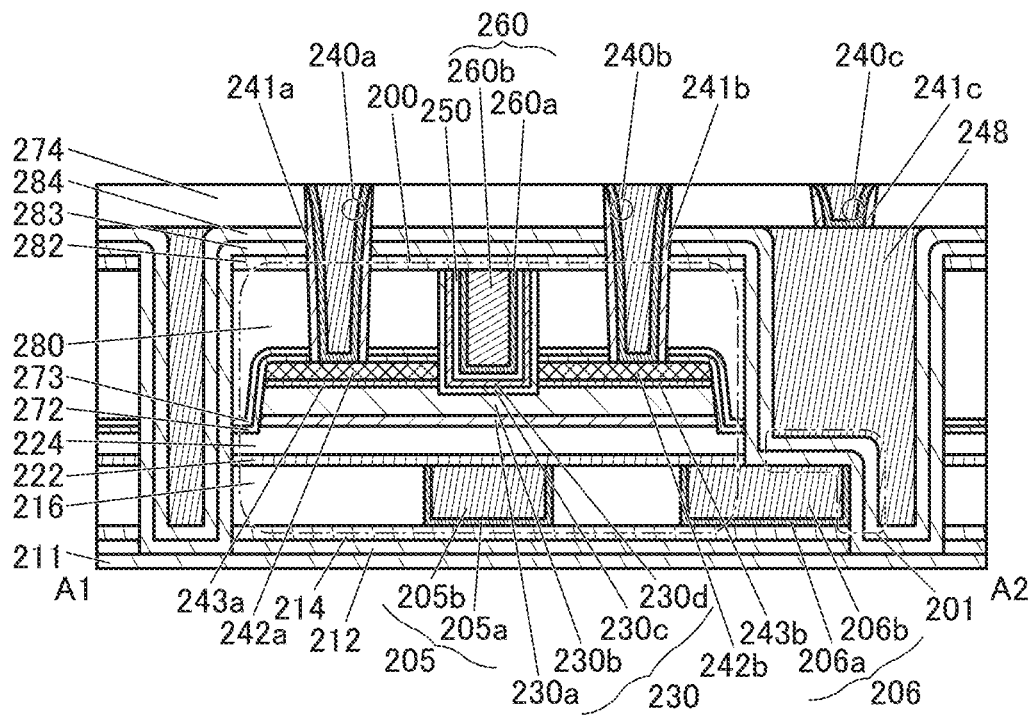
FIG. 19B is a cross-sectional view showing the method of manufacturing a semiconductor device of one embodiment of the present invention.

Next, the insulator 274 is formed over the insulator 284 and the conductor 248 (see FIG. 19A and FIG. 19B). The insulator 274 can be formed using a sputtering method, a CVD method, an MBE method, a PLD method, an ALD method, or the like. For example, silicon nitride is preferably deposited with a CVD method. The insulator 274 is preferably formed with a formation method using a gas in which hydrogen atoms are reduced or removed. Thus, the hydrogen concentration of the insulating film to be the insulator 274 can be reduced. The insulator 274 is preferably subjected to CMP treatment so that the top surface thereof is preferably planarized.

Next, heat treatment may be performed. In this embodiment, treatment is performed at 400° C. in a nitrogen atmosphere for one hour. Through the heat treatment, oxygen added at the time of the formation of the insulator 282 can be diffused into the insulator 280 and then can be supplied to the oxide 230a and the oxide 230b through the oxide 230c. Note that the heat treatment is not necessarily performed after the deposition of the insulator 274 and may be performed after the deposition of the insulator 282 and the insulator 284.

Next, openings reaching the conductor 242a, the conductor 242b, and the conductor 248 are formed in the insulator 272, the insulator 273, the insulator 280, the insulator 282, the insulator 283, the insulator 284, and the insulator 274 (see FIG. 19A and FIG. 19B). The openings are formed using a lithography method. Note that the openings in the top view in FIG. 19A each have a circular shape; however, the shapes of the openings are not limited thereto. For example, the openings in the top view may each have an almost circular shape such as an elliptical shape, a polygonal shape such as a quadrangular shape, or a polygonal shape such as a quadrangular shape with rounded corners.

Subsequently, an insulating film to be the insulator 241 is formed and the insulating film is subjected to anisotropic etching, so that the insulator 241 is formed (see FIG. 19A and FIG. 19B). The insulating film to be the insulator 241 can be formed with a sputtering method, a CVD method, an MBE method, a PLD method, an ALD method, or the like. The insulating film to be the insulator 241 preferably has a function of inhibiting the passage of oxygen. For example, aluminum oxide is preferably deposited with an ALD method. Alternatively, silicon nitride is preferably deposited with a PEALD method. Silicon nitride is preferable because it has high blocking property against hydrogen.

As an anisotropic etching for the insulating film to be the insulator 241, a dry etching method may be performed, for example. When the insulator 241 is provided on the side wall portions of the openings, passage of oxygen from the outside can be inhibited and oxidation of the conductor 240 to be formed next can be prevented. Furthermore, impurities such as water and hydrogen can be prevented from diffused from the conductor 240 to the outside.

Next, a conductive film to be the conductor 240 is deposited. The conductive film to be the conductor 240 desirably has a stacked-layer structure which includes a conductor having a function of inhibiting transmission of impurities such as water and hydrogen. For example, a stacked layer of tantalum nitride, titanium nitride, or the like and tungsten, molybdenum, copper, or the like can be employed. The conductive film to be the conductor 240 can be deposited with a sputtering method, a CVD method, an MBE method, a PLD method, an ALD method, or the like.

Then, part of the conductive film to be the conductor 240 is removed with CMP treatment to expose top surfaces of the insulator 284 and the insulator 274. As a result, the conductive films are left only in the openings, so that the conductor 240a, the conductor 240b, and the conductor 240c having flat top surfaces can be formed (see FIG. 19A and FIG. 19B). Note that the top surface of the insulator 274 is partly removed using the CMP treatment in some cases.

Next, a conductive film to be the conductor 246 is deposited. The conductive film to be the conductor 246 can be formed with a sputtering method, a CVD method, an MBE method, a PLD method, an ALD method, or the like.

Then, the conductive film to be the conductor 246 is processed using a lithography method, thereby forming the conductor 246a in contact with the top surface of the conductor 240a and the conductor 246b in contact with the top surface of the conductor 240b and the top surface of the conductor 240c (see FIG. 1A and FIG. 1B). At this time, the insulator 274 in a region not overlapping with the conductor 246a or the conductor 246b is sometimes partly removed.

Next, the insulator 286 is deposited over the conductor 246 and the insulator 274 (see FIG. 1A and FIG. 1B). The insulator 286 can be formed with a sputtering method, a CVD method, an MBE method, a PLD method, an ALD method, or the like. In addition, the insulator 286 may have a multilayer structure. For example, silicon nitride may be deposited using a sputtering method and silicon nitride may be formed using a CVD method over the silicon nitride.

Through the above process, the semiconductor device including the transistor 200 shown in FIG. 1A and FIG. 1B can be manufactured. As shown in FIG. 5A to FIG. 19A and FIG. 5B to FIG. 19B, the memory device 202 including the transistor 200 and the capacitor 201 can be manufactured using the manufacturing method of the semiconductor device shown in this embodiment.

As described above, the conductor 206, the insulator 283, the insulator 284, and the conductor 248 which are included in the capacitor 201 can be formed with no additional mask to the process of manufacturing the transistor 200. Part of the manufacturing process of the capacitor 201 can be used for part of the manufacturing process of the transistor 200. The memory device 202 of one embodiment of the present invention is manufactured, whereby a semiconductor device with high productivity can be provided.

MODIFICATION EXAMPLE OF SEMICONDUCTOR DEVICE

An example of the semiconductor device that is one embodiment of the present invention is described below with reference to FIG. 20 to FIG. 25. The semiconductor device including the memory device 202 shown in FIG. 20 to FIG. 25 includes structures having the same functions as those of the semiconductor device including the memory device 202 shown in <Structure example of semiconductor device>; the structures are denoted with the same reference numerals. The materials described in detail in <Structure example of semiconductor device> can also be used as constituent materials of the semiconductor devices including the memory device 202 in this section.

Modification Example 1 of Semiconductor Device

Figure 20A:
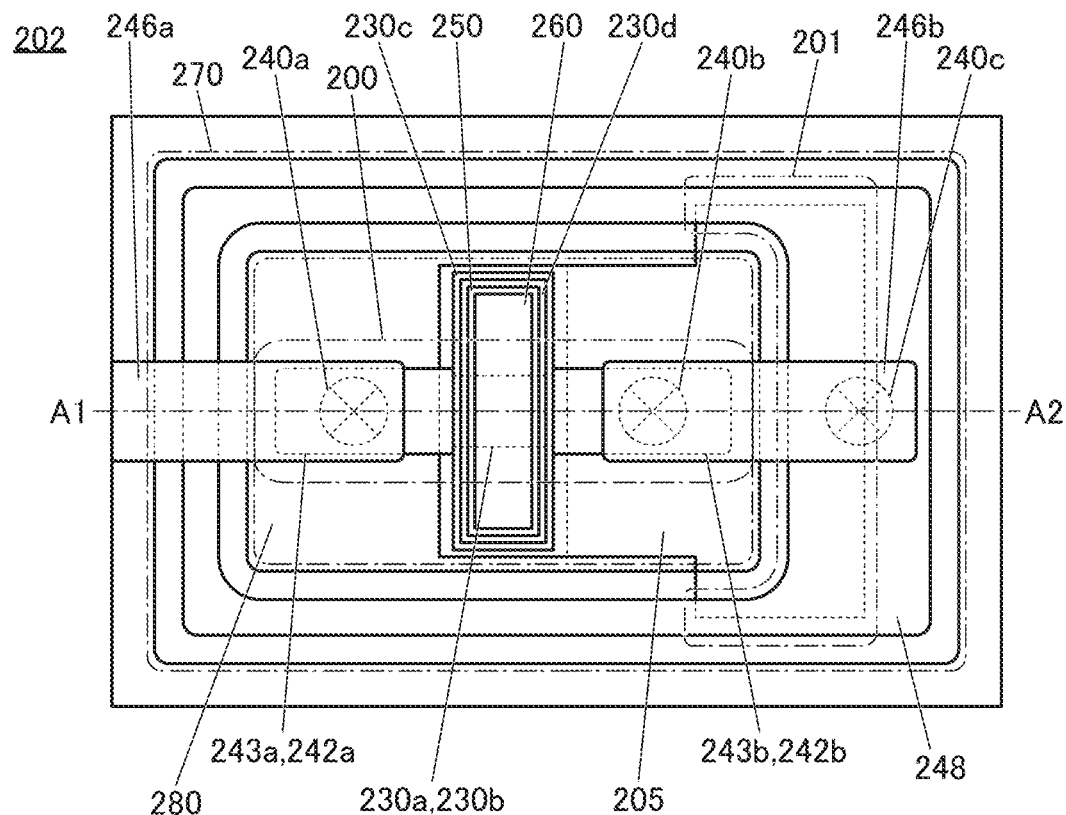
FIG. 20A is a top view of a semiconductor device of one embodiment of the present invention.
Figure 20B:
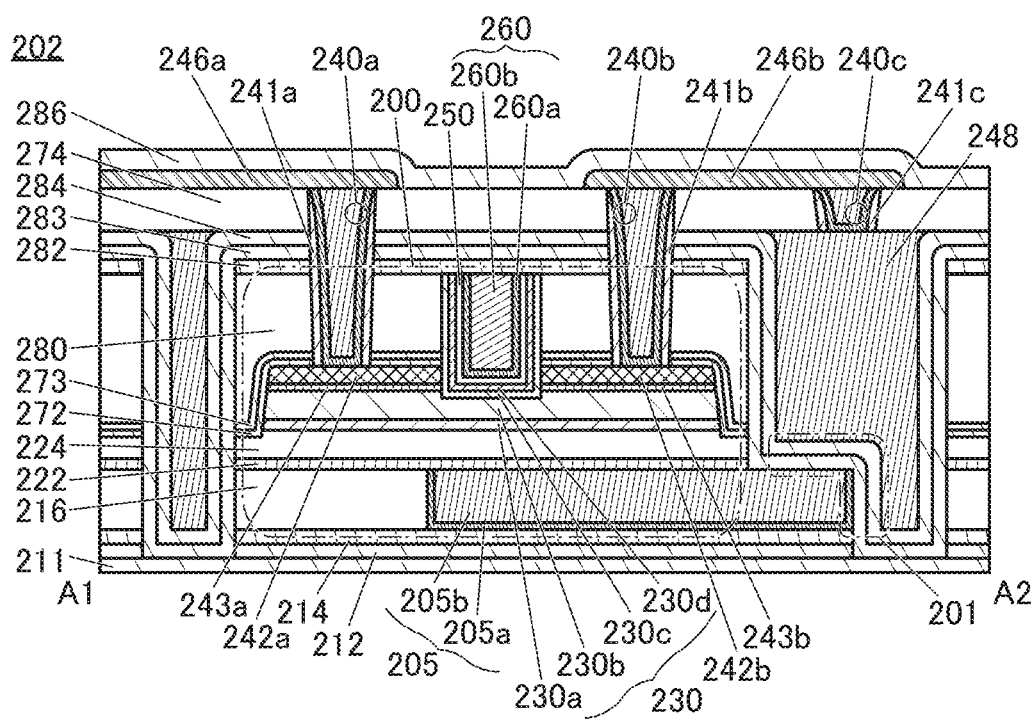
FIG. 20B is a cross-sectional view of the semiconductor device of one embodiment of the present invention.

The memory device 202 in FIG. 20A and FIG. 20B is a modification example of the memory device 202 shown in FIG. 1A and FIG. 1B. FIG. 20A is a top view of the memory device 202. FIG. 20B is a cross-sectional view of a portion indicated with a dashed-dotted line A1-A2 in FIG. 20A. Note that for clarity of the drawing, some components are not shown in the top view of FIG. 20A. The memory device 202 in FIG. 20A and FIG. 20B differs from the memory device 202 shown in FIG. 1A and FIG. 1B in that part of the conductor 205 overlaps with the conductor 248 with the insulator 283 and the insulator 284 therebetween.

In other words, the memory device 202 in FIG. 1A and FIG. 1B has the conductor 205 and the conductor 206 that are isolated from each other, whereas the memory device 202 in FIG. 20A and FIG. 20B has an integrated conductor 205. The conductor 205 functions as a back gate of the transistor 200 and the lower electrode of the capacitor 201.

In the memory device 202 shown in FIG. 20A and FIG. 20B, the conductor 205 is formed to be an island-like shape, and the conductor 205 is in a floating state. With such a structure, electric charge is induced in the conductor 205 due to electric charge held in the conductor 248, so that Vth of the transistor 200 can be decreased. Accordingly, electric charge corresponding to data retained in the capacitor 201 can be easily read out, so that the data in the memory device 202 can be read out at high speed.

Modification Example 2 of Semiconductor Device

Figure 21A:
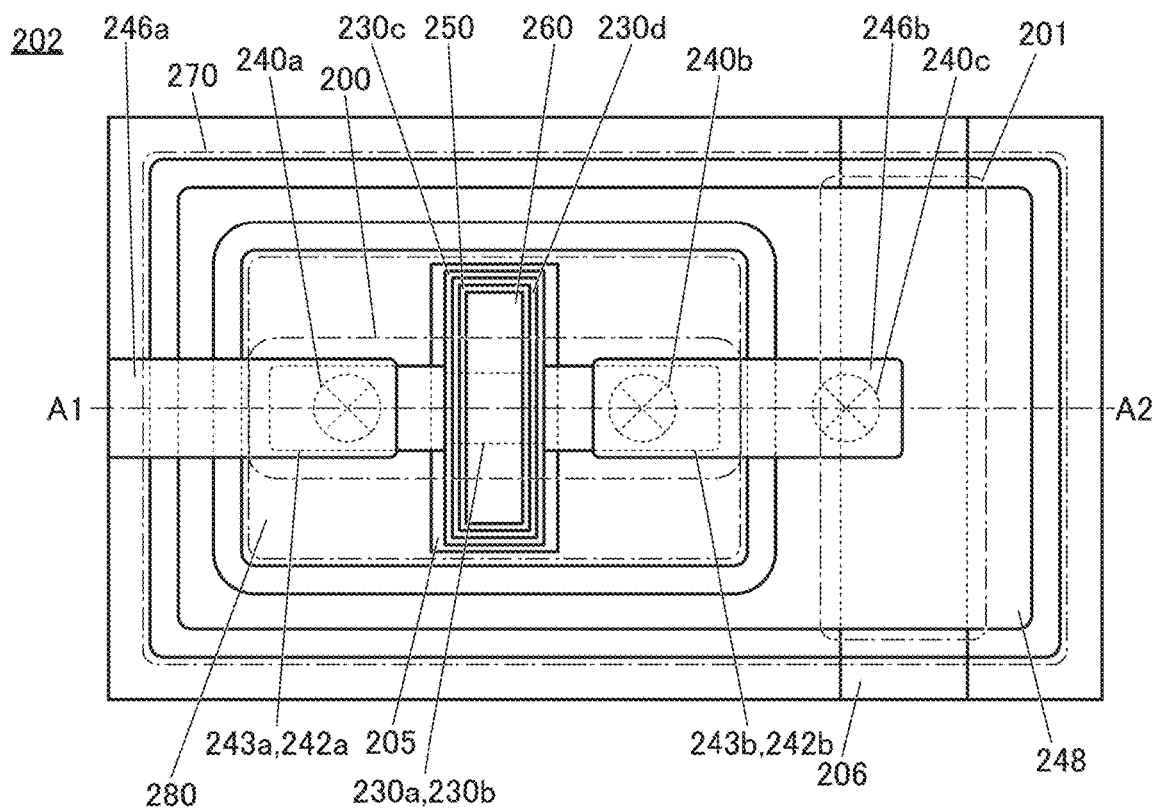
FIG. 21A is a top view of a semiconductor device of one embodiment of the present invention.
Figure 21B:
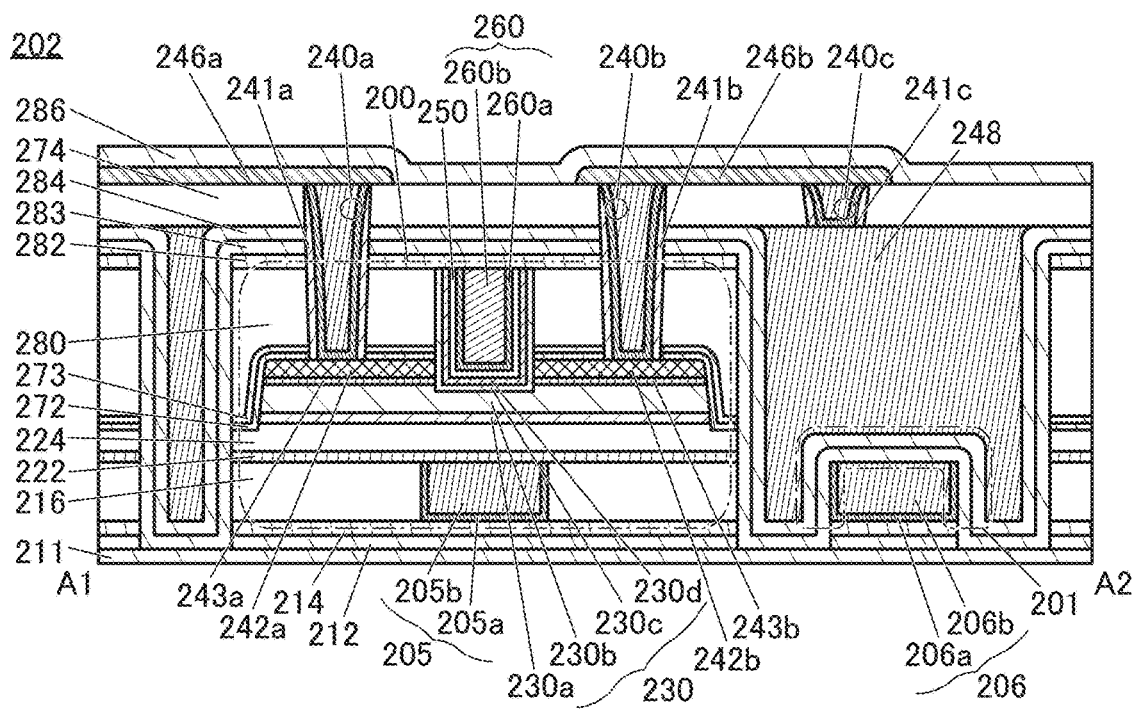
FIG. 21B is a cross-sectional view of the semiconductor device of one embodiment of the present invention.

A memory device 202 shown in FIG. 21A and FIG. 21B is a modification example of the memory device 202 shown in FIG. 1A and FIG. 1B. FIG. 21A is a top view of the memory device 202. FIG. 21B is a cross-sectional view of a portion indicated with a dashed-dotted line A1-A2 in FIG. 21A. Note that for clarity of the drawing, some components are not shown in the top view of FIG. 21A. The memory device 202 shown in FIG. 21A and FIG. 21B differs from the memory device 202 shown in FIG. 1A and FIG. 1B in that the conductor 206 does not overlap with the insulator 280. In the memory device 202 in FIG. 21A and FIG. 21B, the conductor 206 does not overlap with the transistor 200.

As shown in FIG. 21B, it is preferable that the insulator 283 be in contact with one side surface (the side surface at the A1 side) of the conductor 206 and with the side surface opposite to the one side surface (the side surface at the A2 side). In the memory device 202 in FIG. 21A and FIG. 21B, the conductor 206 is covered with the conductor 248.

With this structure, the capacitor 201 can be formed to include the side surface at the A1 side of the conductor 206, which makes the electrostatic capacitance large.

Modification Example 3 of Semiconductor Device

Figure 22A:
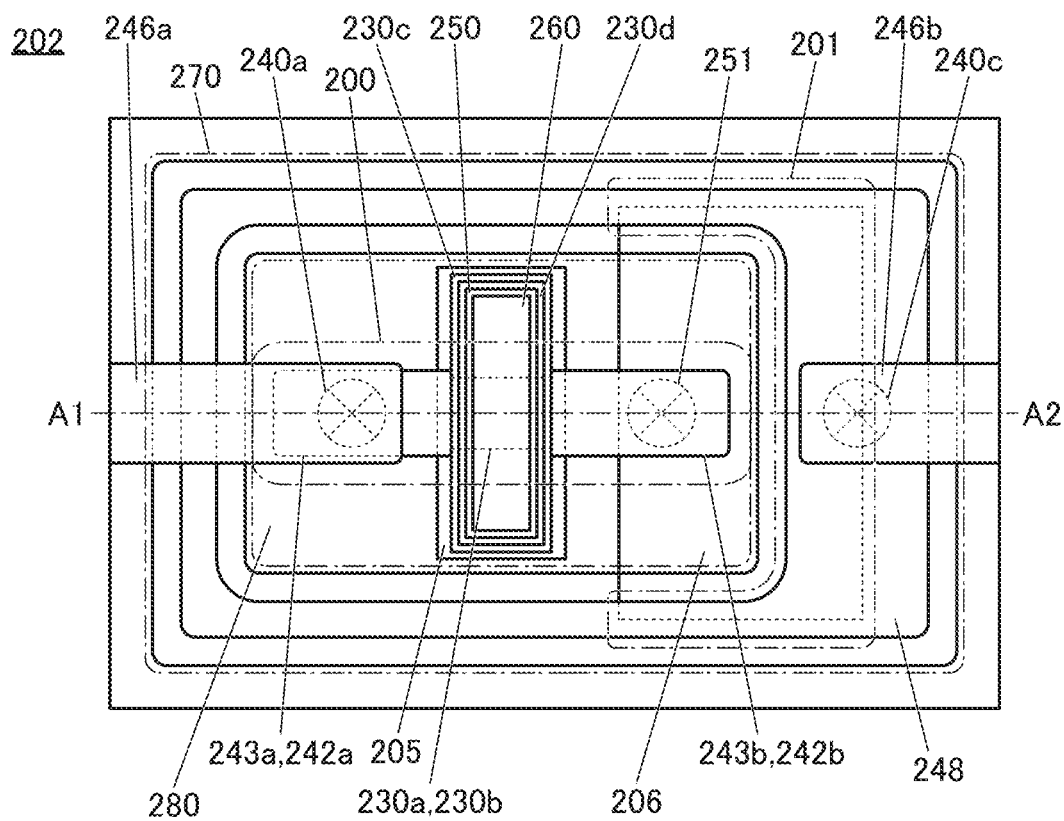
FIG. 22A is a top view of a semiconductor device of one embodiment of the present invention.
Figure 22B:
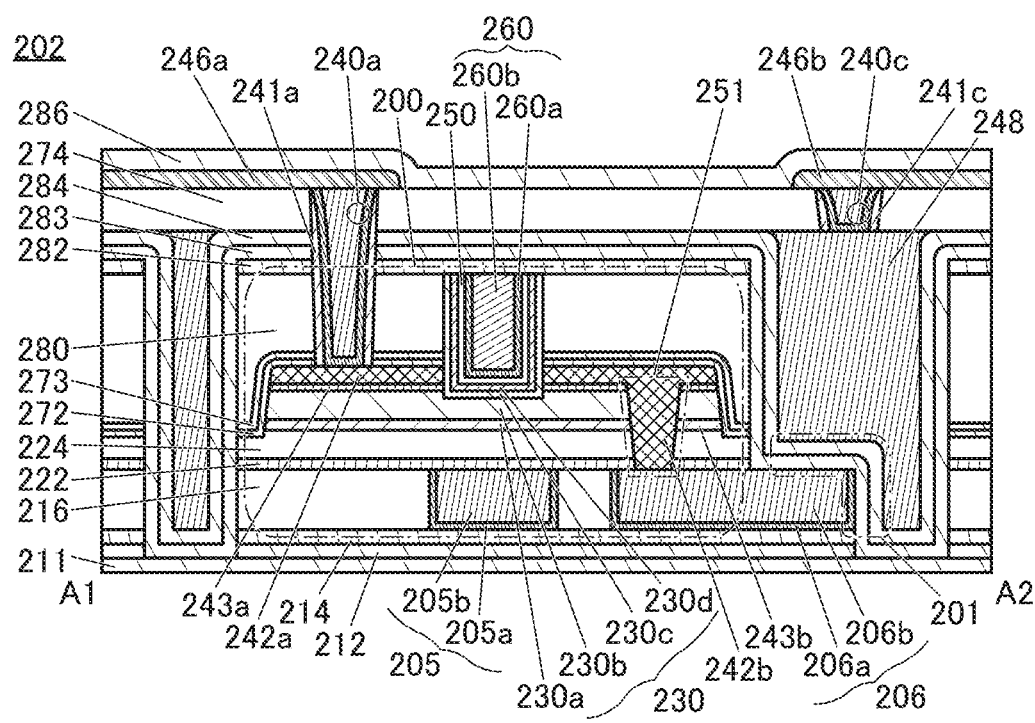
FIG. 22B is a cross-sectional view of the semiconductor device of one embodiment of the present invention.

The memory device 202 shown in FIG. 22A and FIG. 22B is a modification example of the memory device 202 shown in FIG. 1A and FIG. 1B. FIG. 22A is a top view of the memory device 202. FIG. 22B is a cross-sectional view of a portion indicated with a dashed-dotted line A1-A2 in FIG. 22A. Note that for clarity of the drawing, some components are not shown in the top view of FIG. 22A. The memory device 202 shown in FIG. 22A and FIG. 22B differs from the memory device 202 in FIG. 1A and FIG. 1B in that an opening 251 reaching the conductor 206 is formed in the insulator 222, the insulator 224, the oxide 230a, and the oxide 230b, and the conductor 242b is in contact with the conductor 206 through the opening 251.

With this structure, one of the source and the drain of the transistor 200 can be electrically connected to the conductor 206 that functions as the lower electrode of the capacitor 201.

The conductor 246b electrically connected to the conductor 248 through the conductor 240c functions as a capacitor wiring. Since the conductor 242b is not necessarily extracted over the insulator 274, the conductor 240b and the insulator 241b, which are shown in FIG. 1B, are not necessarily provided.

In the case of forming the opening 251 in this manner, the opening 251 reaching the conductor 206 may be formed after forming the oxide film 243A in the step shown in FIG. 5. After that, when the conductive film 242A is formed, the conductive film 242A is formed in contact with the top surface of the conductor 206.

Modification Example 4 of Semiconductor Device

Figure 23A:
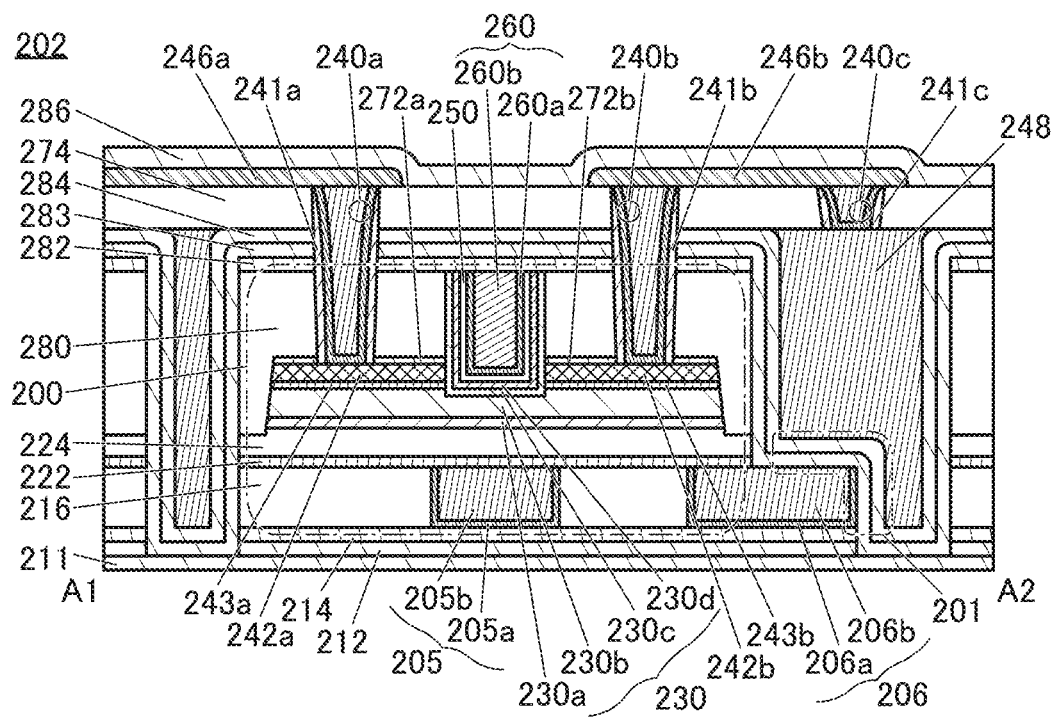
FIG. 23A and FIG. 23B are cross-sectional views of semiconductor devices of one embodiment of the present invention.
Figure 23B:
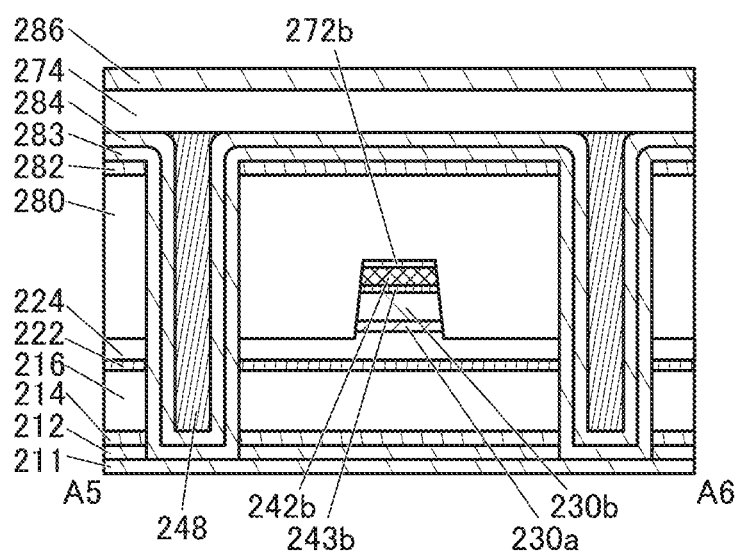

The memory device 202 shown in FIG. 23A and FIG. 23B is a modification example of the memory device 202 shown in FIG. 1A and FIG. 1B. The memory device 202 in FIG. 23A and FIG. 23B has a similar layout to the memory device 202 in FIG. 1A. FIG. 23A is a cross-sectional view of a portion indicated with a dashed-dotted line A1-A2 in FIG. 1A, and FIG. 23B is a cross-sectional view of a portion indicated with a dashed-dotted line A5-A6 in FIG. 1A. The memory device 202 shown in FIG. 23A and FIG. 23B differs from the memory device 202 in FIG. 1A and FIG. 1B in that the side surface and the top surface of the conductor 242a intersect to form an angular edge and the side surface and the top surface of the conductor 242b intersect to form an angular edge.

The cross-sectional area of the conductor 242 is larger in the case where the end portion at the intersection of the side surface and the top surface of the conductor 242 is angular than in the case where the end portion is rounded. Accordingly, the resistance of the conductor 242 is reduced, so that the on-state current of the transistor 200 can be increased.

To form angular edges where the side surface and the top surface of the conductor 242 intersect, a hard mask is formed over the conductive layer 242B in the step of forming the conductor 242B into an island-like shape as shown in FIG. 6. This can prevent the angular edges where the side surface and the top surface of the conductor 242B intersect from being etched.

As the hard mask, an insulator similar to the insulator 272 may be provided. In this case, when the hard mask is left and the manufacturing process is carried out, the insulator 272a can be formed over the conductor 242a and the insulator 272b can be formed over the conductor 242b as shown in FIG. 23A and FIG. 23B. When the insulator 272a and the insulator 272b are formed in this manner, the insulator 272 and the insulator 273 in FIG. 1B are not necessarily formed.

Modification Example 5 of Semiconductor Device

Figure 24A:
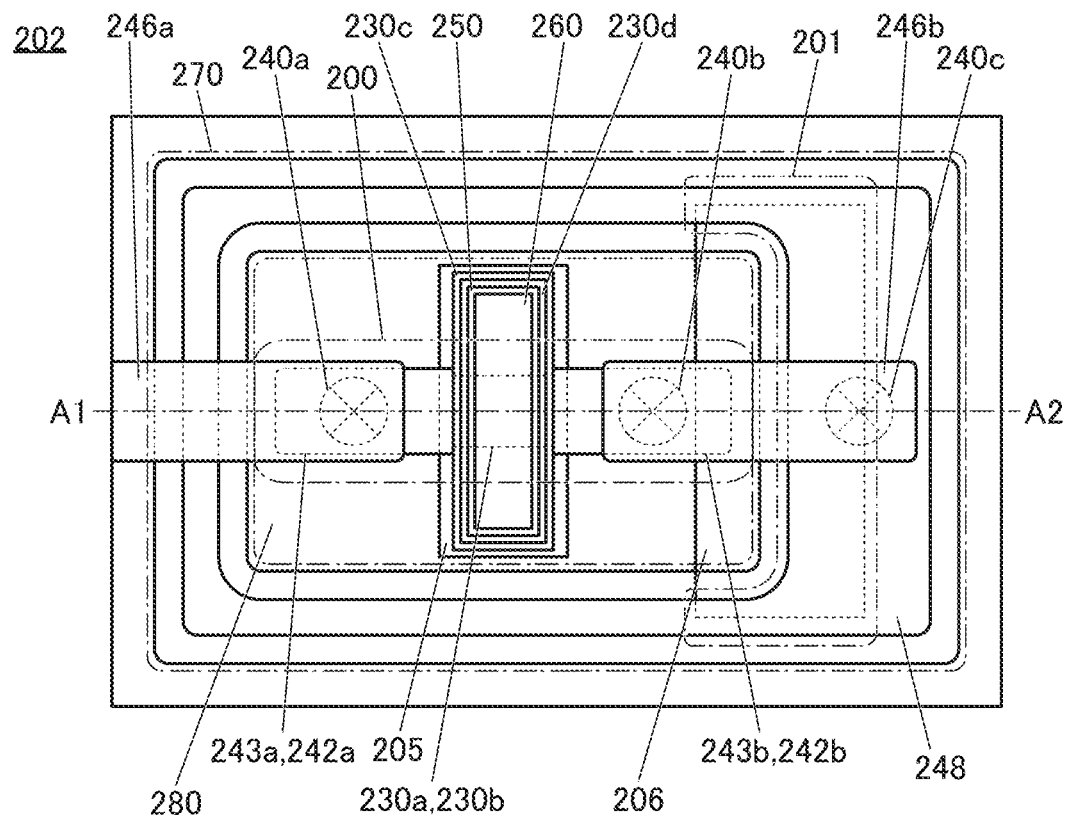
FIG. 24A is a top view of a semiconductor device of one embodiment of the present invention.
Figure 24B:
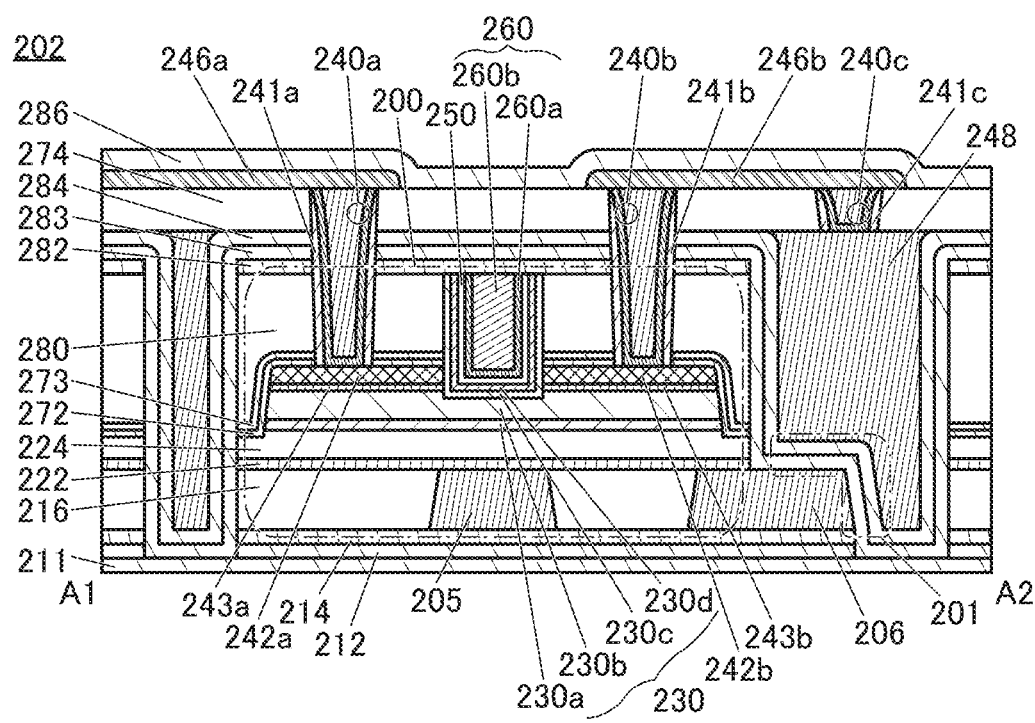
FIG. 24B is a cross-sectional view of the semiconductor device of one embodiment of the present invention.

The memory device 202 shown in FIG. 24A and FIG. 24B is a modification example of the memory device 202 shown in FIG. 1A and FIG. 1B. FIG. 24A is a top view of the memory device 202. FIG. 24B is a cross-sectional view of a portion indicated with a dashed-dotted line A1-A2 in FIG. 24A. Note that for clarity of the drawing, some components are not shown in the top view of FIG. 24A. The memory device 202 shown in FIG. 24A and FIG. 24B differs from the memory device 202 in FIG. 1A and FIG. 1B in that the conductor 205 and the conductor 206 have tapered side surfaces.

To form the conductor 205 and the conductor 206 having tapered side surfaces, the insulator 214 is formed over the insulator 214 through the process shown in FIG. 5 and then the conductor 205 and the conductor 206 are formed through patterning. At the time, the conductor 205 and the conductor 206 are formed to have tapered side surfaces. After that, the insulator 216 is formed to cover the conductor 205 and the conductor 206, and CMP treatment is performed to remove part of the insulator 216, so that surfaces of the conductor 205 and the conductor 206 are exposed.

Modification Example 6 of Semiconductor Device

Figure 25A:
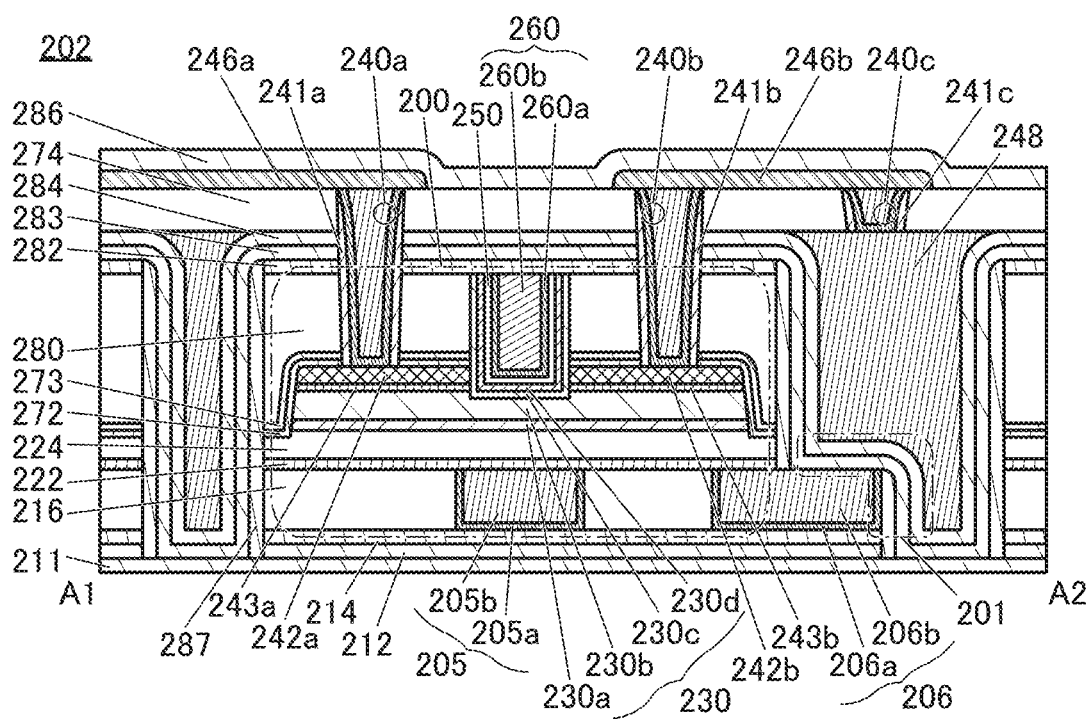
FIG. 25A and FIG. 25B are cross-sectional views of semiconductor devices of one embodiment of the present invention.
Figure 25B:
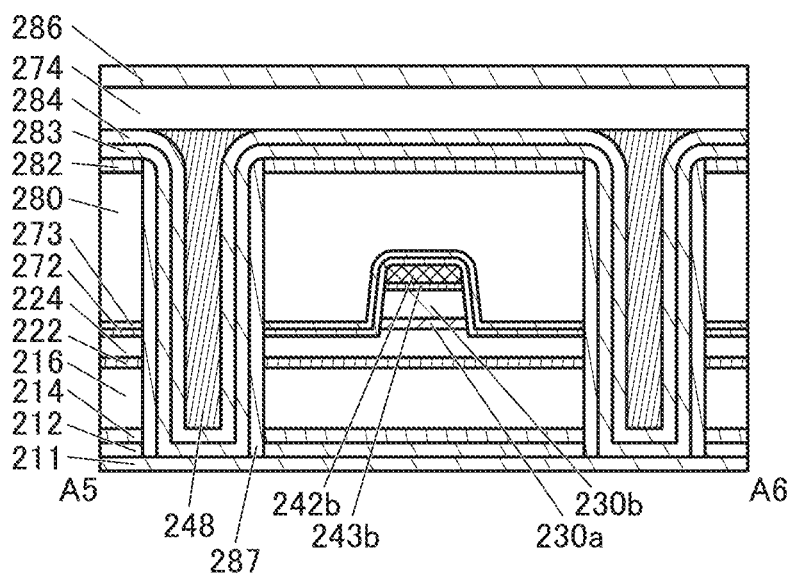

The memory device 202 shown in FIG. 25A and FIG. 25B is a modification example of the memory device 202 shown in FIG. 1A and FIG. 1B. The memory device 202 in FIG. 25A and FIG. 25B has a similar layout to the memory device 202 in FIG. 1A. FIG. 25A is a cross-sectional view of a portion indicated with a dashed-dotted line A1-A2 in FIG. 1A and FIG. 25B is a cross-sectional view of a portion indicated with a dashed-dotted line A5-A6 in FIG. 1A. The memory device 202 shown in FIG. 25A and FIG. 25B differs from the memory device 202 in FIG. 1A and FIG. 1B in that an insulator 287 is provided to be in contact with side surfaces of the insulator 212, the insulator 214, the insulator 216, the insulator 222, the insulator 224, the insulator 272, the insulator 273, the insulator 280, the insulator 282, and the conductor 206.

Like the insulator 282 or the insulator 214, the insulator 287 is preferably formed using a material that has a function of capturing and fixing hydrogen. Typically, aluminum oxide can be used for the insulator 287.

As shown in FIG. 25A and FIG. 25B, the insulator 283 is provided to cover the insulator 282 and the insulator 287. The insulator 214, the insulator 287, and the insulator 282, each of which has a function of capturing and fixing hydrogen, are provided in contact with the insulator 216, the insulator 280, and the like in the region sealed with the insulator 283 and the insulator 211. The insulator 214, the insulator 287, and the insulator 282 capture or fix hydrogen in the insulator 216, the insulator 280, and the like, whereby the amount of hydrogen in the sealed region is kept constant.

The insulator 287 can be formed in the following manner: the opening 270 is formed through the step shown in FIG. 14; an insulating film such as aluminum oxide is formed using a sputtering method; the insulating film is anisotropically etched to form the insulator 287 in contact with side surfaces of the insulator 211, the insulator 212, the insulator 214, the insulator 216, the insulator 222, the insulator 224, the insulator 272, the insulator 273, the insulator 280, the insulator 282, and the conductor 206. Dry etching is preferably performed as the anisotropic etching. In this manner, the insulating film formed on a plane substantially parallel to the substrate surface can be removed, so that the insulator 287 can be formed in a self-aligned manner.

Modification Example 7 of Semiconductor Device

Figure 26A:
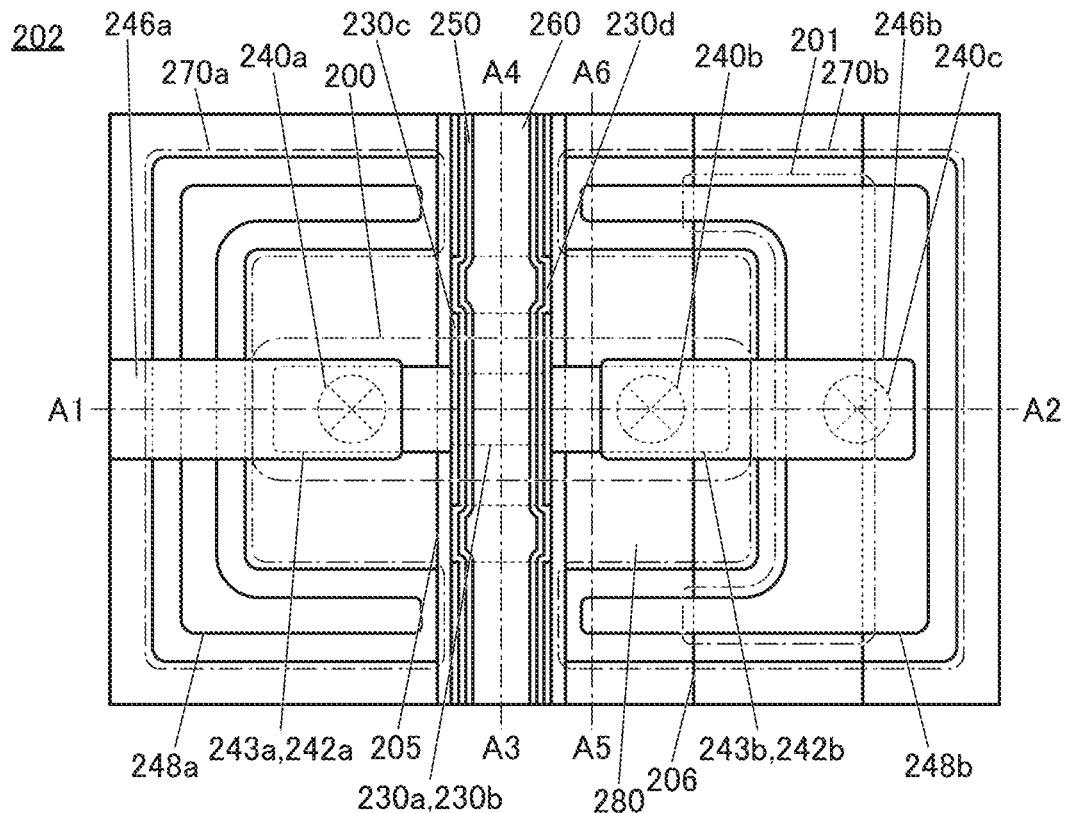
FIG. 26A is a top view of a semiconductor device of one embodiment of the present invention.
Figure 26B:
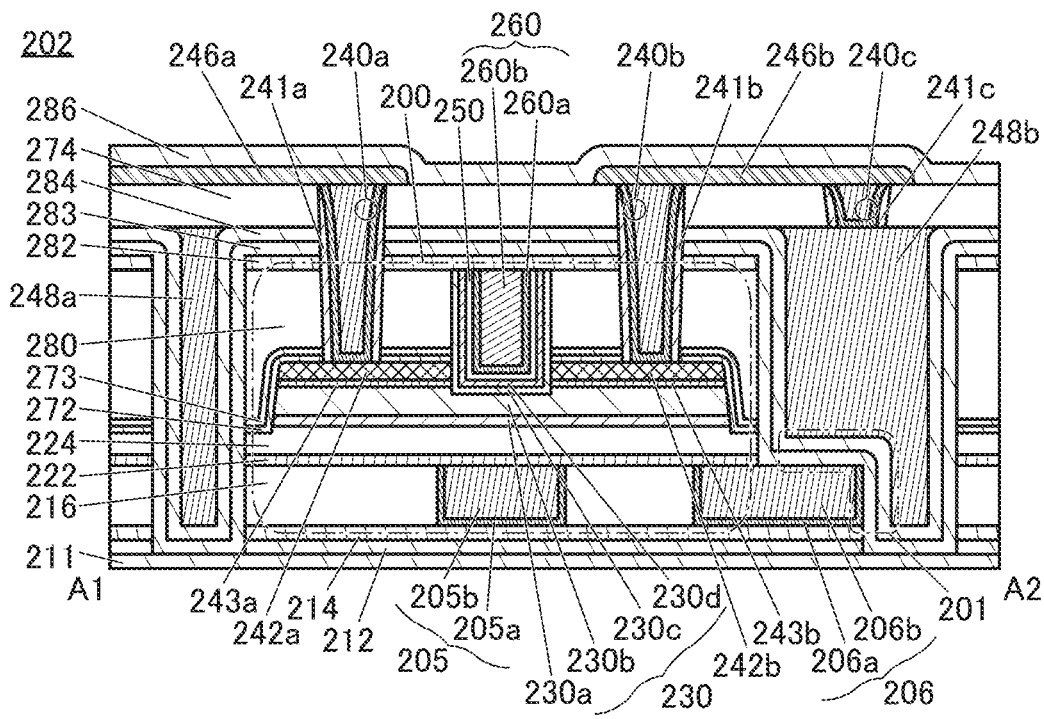
FIG. 26B is a cross-sectional view of the semiconductor device of one embodiment of the present invention.
Figure 27A:
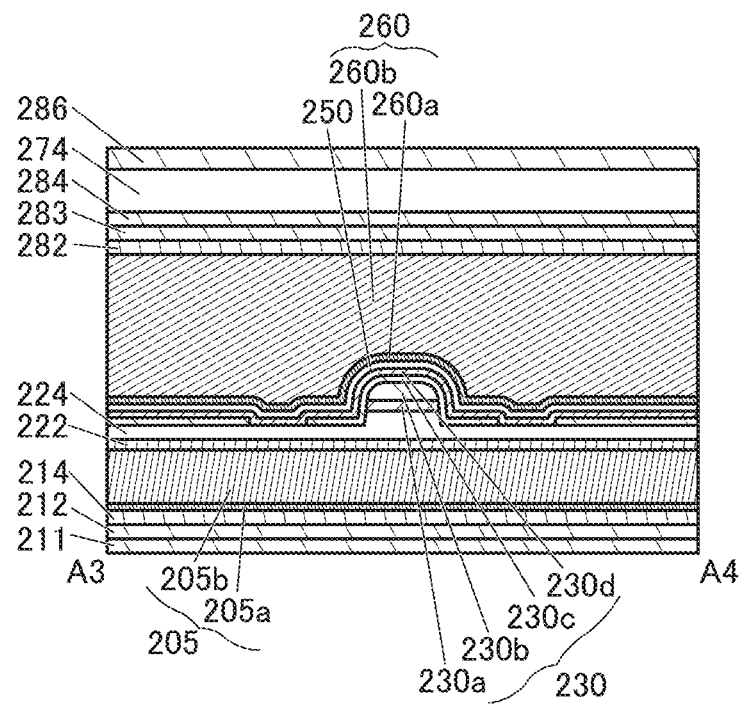
FIG. 27A and FIG. 27B are schematic cross-sectional views of semiconductor devices of one embodiment of the present invention.
Figure 27B:
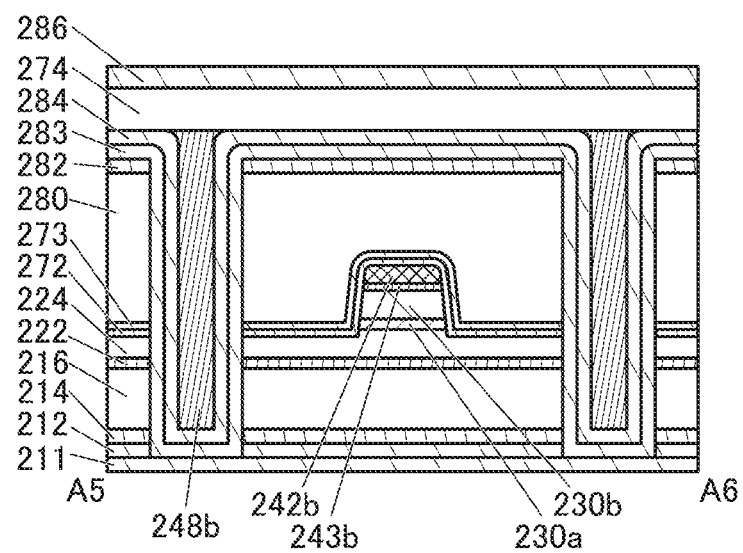

The memory device 202 shown in FIG. 26A, FIG. 26B, FIG. 27A, and FIG. 27B is a modification example of the memory device 202 shown in FIG. 1A, FIG. 1B, FIG. 2A, and FIG. 2B. FIG. 26A is a top view of the memory device 202. FIG. 26B is a cross-sectional view of a portion indicated with a dashed-dotted line A1-A2 in FIG. 26A. FIG. 27A is a cross-sectional view of a portion indicated with a dashed-dotted line A3-A4 in FIG. 26A. FIG. 27B is a cross-sectional view of a portion indicated with a dashed-dotted line A5-A6 in FIG. 26A. Note that for clarity of the drawing, some components are not shown in the top view of FIG. 26A. The memory device 202 shown in FIG. 26A, FIG. 26B, FIG. 27A, and FIG. 27B differs from the memory device 202 in FIG. 1A, FIG. 1B, FIG. 2A, and FIG. 2B in that the conductor 260, the conductor 205, and the conductor 206 are extended to function as wirings. The memory device 202 shown in FIG. 26A, FIG. 26B, FIG. 27A, and FIG. 27B differs from the memory device 202 in FIG. 1A, FIG. 1B, FIG. 2A, and FIG. 2B in that an opening 270a and an opening 270b are provided to surround the transistor 200, a conductor 248a is provided to be embedded in the opening 270a, and a conductor 248b is provided to be embedded in the opening 270b. The distance between the opening 270a and the oxide 230c and the distance between the opening 270b and the oxide 230c are preferably short as long as possible.

In the opening 270b, as in the opening 270, the conductor 206 is exposed to form the capacitor 201. As in the opening 270, the insulator 283 is provided in contact with a bottom surface and an inner wall of the opening 270b, and the insulator 284 is provided on the inner side therein. As in the conductor 248 in the opening 270, the conductor 248b is provided to be embedded in the inner portion than the insulator 284 in the opening 270b. The top surface of the conductor 248b is preferably and substantially level with the top surface of the region of the insulator 284 that overlaps with the insulator 280.

In the opening 270a, except that the conductor in the same layer as the conductor 206 is not provided, the insulator 283 is provided in contact with a bottom surface and an inner wall of the opening 270a and the insulator 284 is provided therein as in the opening 270. Like the conductor 248 in the opening 270, the conductor 248a is provided to be embedded in the inner portion than the insulator 284 in the opening 270a. The top surface of the conductor 248a is preferably and substantially level with the top surface of the region of the insulator 284 that overlaps with the insulator 280.

The conductor 260 functions as a wiring including the first gate electrode, the conductor 205 functions as a wiring including the second gate electrode, and the conductor 206 functions as a wiring including the lower electrode of the capacitor 201. The conductor 260, the conductor 205, and the conductor 206 are arranged to extend in the A3-A4 direction in FIG. 26A; not limited to this, the conductor 260, the conductor 205, and the conductor 206 can be appropriately arranged in accordance with the circuit structure of the semiconductor device including the memory device 202.

The insulator 250, the oxide 230c, and the oxide 230d may be arranged to extend in the channel width direction in accordance with the conductor 260.

The oxide 230c can be provided in an island-like shape in each transistor 200 as shown in FIG. 26A and FIG. 27A. Accordingly, the oxide 230c of the transistor 200 is not necessarily in contact with the oxide 230c of another transistor 200 adjacent to the transistor 200. Furthermore, the oxide 230c of the transistor 200 may be apart from the oxide 230c of another transistor 200 adjacent to the transistor 200. In other words, a structure in which the oxide 230c is not located between the transistor 200 and another transistor 200 adjacent to the transistor 200 may be employed.

When the above structure is employed for the semiconductor device where a plurality of transistors 200 are located in the channel width direction, the oxide 230c can be independently provided for each transistor 200. Accordingly, the formation of a parasitic transistor between the adjacent transistors 200 is inhibited, and the generation of the leakage path can be inhibited. Thus, a semiconductor device that has excellent electrical characteristics and can be miniaturized or highly integrated can be provided.

In the above structure, as shown in FIG. 27A, the oxide 230d includes a region in contact with the insulator 224 between the transistor 200 and another transistor 200 adjacent to the transistor 200. Note that the oxide 230c and the oxide 230d of the transistor 200 may be apart from the oxide 230c and the oxide 230d of the adjacent transistor 200.

Application Example of Semiconductor Device

Examples of a semiconductor device including the memory device 202 of one embodiment of the present invention which is different from the semiconductor device described in the above <Structure example of semiconductor device> and the above <Modification example of semiconductor device> will be described below with reference to FIG. 28 to FIG. 30. Note that in the semiconductor device shown in FIG. 28 to FIG. 30, components having the same functions as the components included in the semiconductor device described in <<Structure example of semiconductor device>> are denoted with the same reference numerals. Note that also in this section, the materials described in detail in <Structure example of semiconductor device> and <Modification example of semiconductor device> can be used as the materials for the transistor 200.

Figure 28:
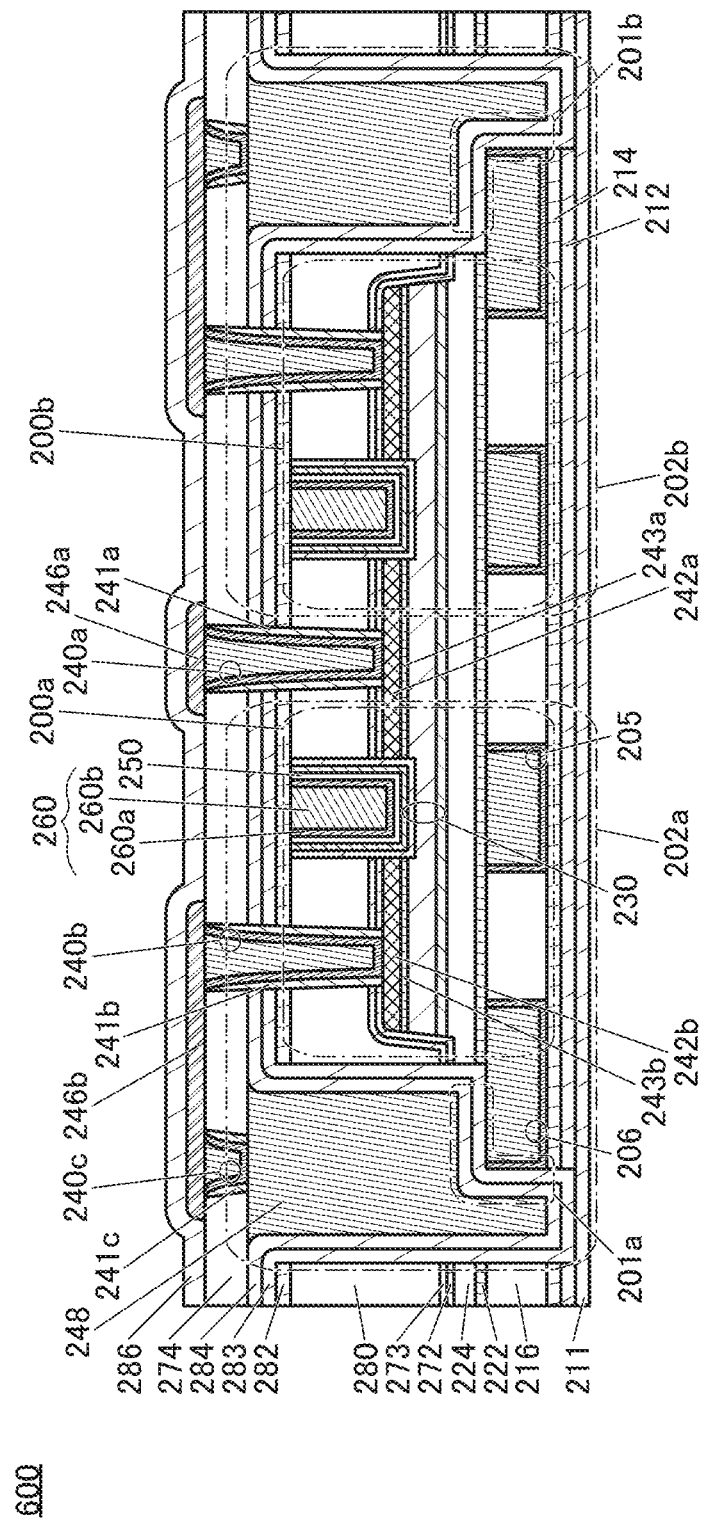
FIG. 28 is a cross-sectional view of a semiconductor device of one embodiment of the present invention.

FIG. 28 is a cross-sectional view in the channel length direction of a semiconductor device 600 including a memory device 202a including the transistor 200a and the capacitor 201a and a memory device 202b including a transistor 200b and a capacitor 201b. The semiconductor device 600 has a symmetrical structure with respect to the conductor 240a and the conductor 246a as the symmetrical axis as shown in FIG. 28. For this reason, in FIG. 28, the components of the memory device 202a are denoted with reference numerals and the reference numerals can be referred to for the components of the memory device 202b.

A conductor 242a serves as one of a source electrode and a drain electrode of the transistor 200a and one of a source electrode and a drain electrode of the transistor 200b. The conductor 240a functioning as a plug also makes connection of the conductor 246a functioning as a wiring to the transistor 200a and the transistor 200b. Accordingly, when the connection of the two transistors, the two capacitors, the wiring, and the plug have the above-described structure, a semiconductor device that can be miniaturized or highly integrated can be provided.

The above structure example of the semiconductor device can be referred to for the structures and effects of the memory device 202a including the transistor 200a and the capacitor 201a and the memory device 202b including the transistor 200b and the capacitor 201b.

The memory device 202a and the memory device 202b are given as the structure example of the semiconductor device in the above; the semiconductor device of this embodiment is not limited thereto. For example, as shown in FIG. 29, a semiconductor device 600_1 and the semiconductor device 600_2 having a structure similar to that of the semiconductor device 600_1 may be connected to each other through the conductor 206 functioning as the lower electrode of the capacitor. In this specification, the semiconductor device including the memory device 202a and the memory device 202b is referred to as a cell in some cases.

Figure 29:
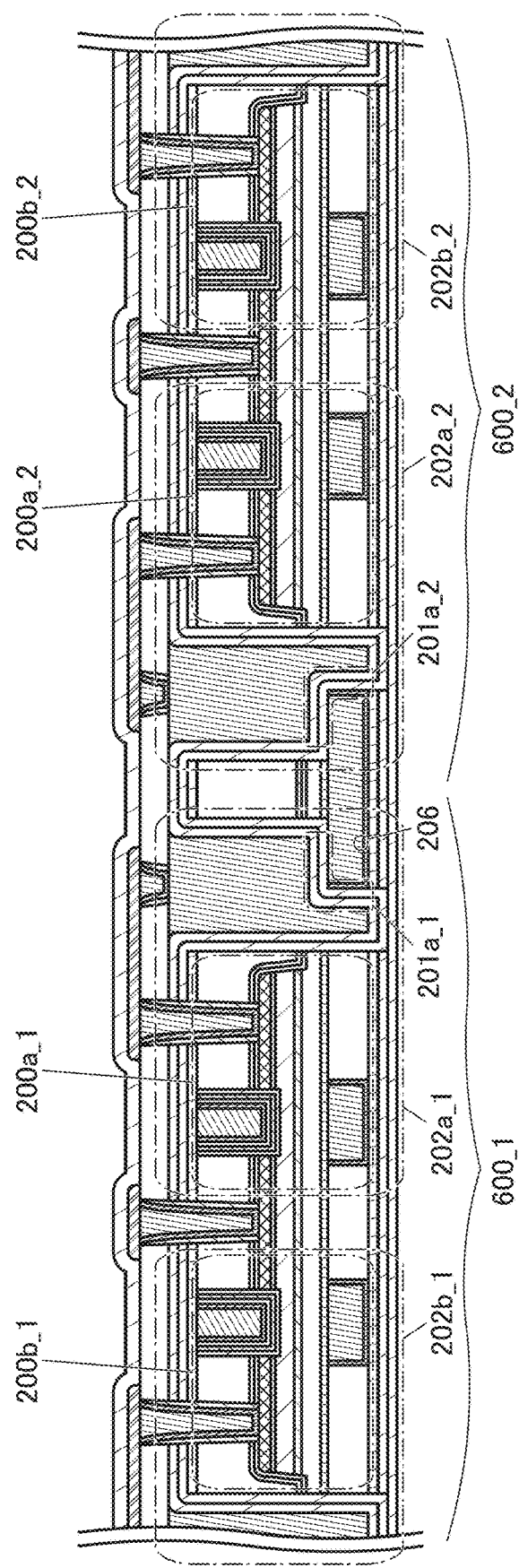
FIG. 29 is a cross-sectional view of a semiconductor device of one embodiment of the present invention.
Figure 30:
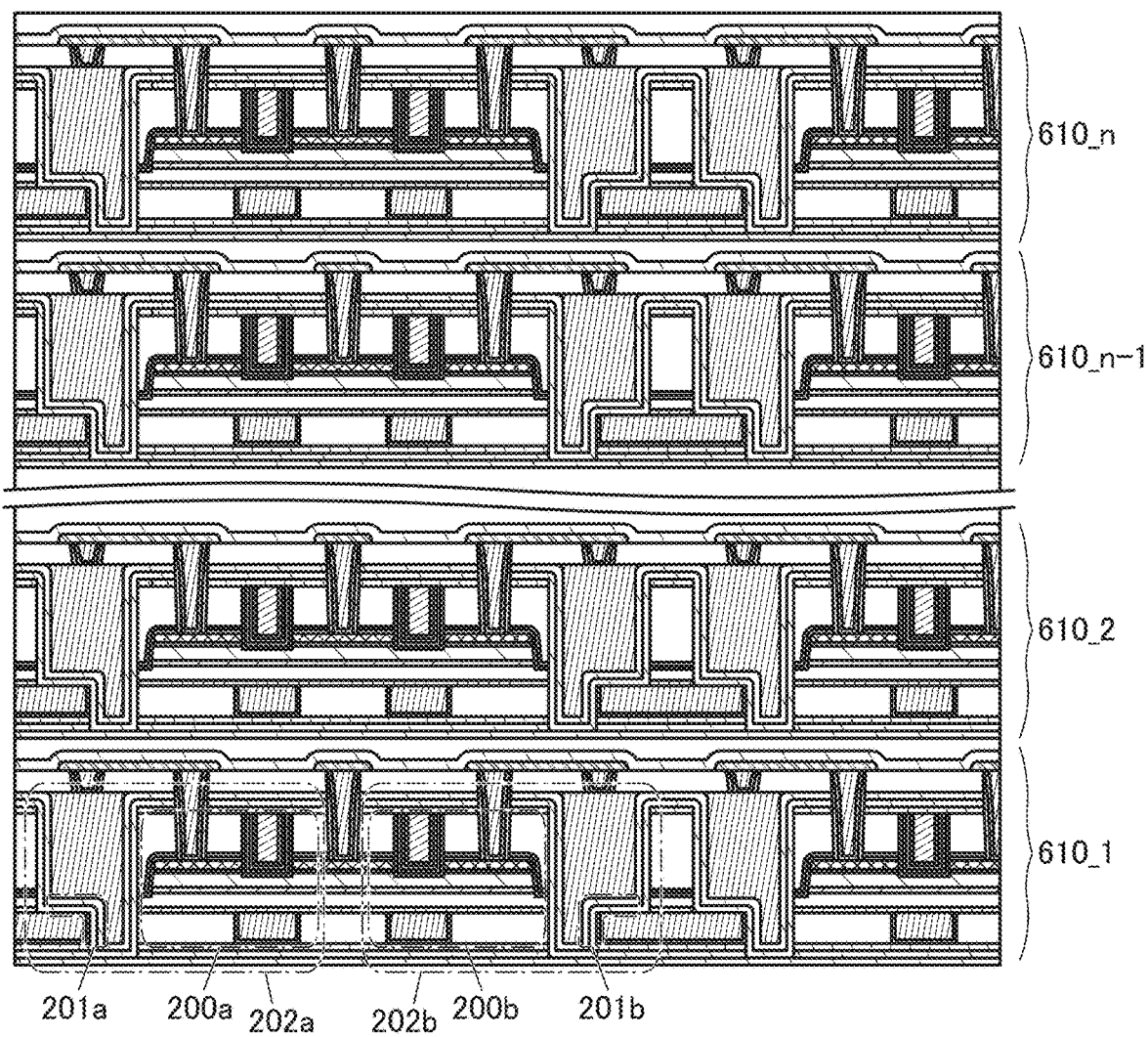
FIG. 30 is a cross-sectional view of a semiconductor device of one embodiment of the present invention.

FIG. 29 shows a cross-sectional view of the semiconductor device 6001 and the semiconductor device 600_2 connected through the conductor 206 functioning as the lower electrode of the capacitor; the semiconductor device 600_1 includes a memory device 202a_1 having a transistor 200a_1 and a capacitor 201a_1 and a memory device 202b_1 having a transistor 200b_1 and a capacitor 201b_1 (not shown); the semiconductor device 600_2 includes a memory device 202a_2 having a transistor 200a_2 and a capacitor 201a_2 and a memory device 202b_2 having a transistor 200b_2 and a capacitor 201b_2 (not shown).

As shown in FIG. 29, the conductor 206 functioning as one electrode of the capacitor 201a_1 functions as one electrode of the capacitor 201a2 included in the semiconductor device 600_2. Furthermore, although not shown, the conductor 206 functioning as one electrode of the capacitor 201b_1 included in the semiconductor device 600_1 also functions as one electrode of a capacitor included in the adjacent cell on the left side of the semiconductor device 600_1. The same applies to a cell at the right side of the semiconductor device 600_2. That is, a cell array (also referred to as a memory device layer) can be formed. With this structure of the cell array, the space between the adjacent cells can be reduced; thus, the projected area of the cell array can be reduced and high integration can be achieved. When the cell array shown in FIG. 29 are arranged in a matrix, a matrix-shape cell array can be formed.

The semiconductor device 600_1 and the semiconductor device 6002 are formed to have the structure shown in this embodiment, whereby the area of the cells can be reduced and the semiconductor device including the cell array can be miniaturized or highly integrated.

The cell array may be arranged in a matrix and stacked. FIG. 30 shows a cross-sectional view of n layers of cell arrays 610 that are stacked. When a plurality of cell arrays (a cell array 610_1 to a cell array 610_n) are stacked as shown in FIG. 30, cells can be integrally arranged without increasing the area occupied by the cell arrays. In other words, a 3D cell array can be formed.

One embodiment of the present invention can provide a semiconductor device in which variation of transistor characteristics is small. According to one embodiment of the present invention, a semiconductor device with high productivity can be provided. Alternatively, according to one embodiment of the present invention, a highly reliable semiconductor device can be provided. According to one embodiment of the present invention, a semiconductor device having excellent electrical characteristics can be provided. According to one embodiment of the present invention, a semiconductor device with a high on-state current can be provided. According to one embodiment of the present invention, a semiconductor device that can be miniaturized or highly integrated can be provided. Alternatively, according to one embodiment of the present invention, a semiconductor device with low power consumption can be provided.

The structures and methods described in this embodiment can be used in an appropriate combination with any of the structures and methods described in this embodiment and the other embodiments.

Embodiment 2

Figure 31:
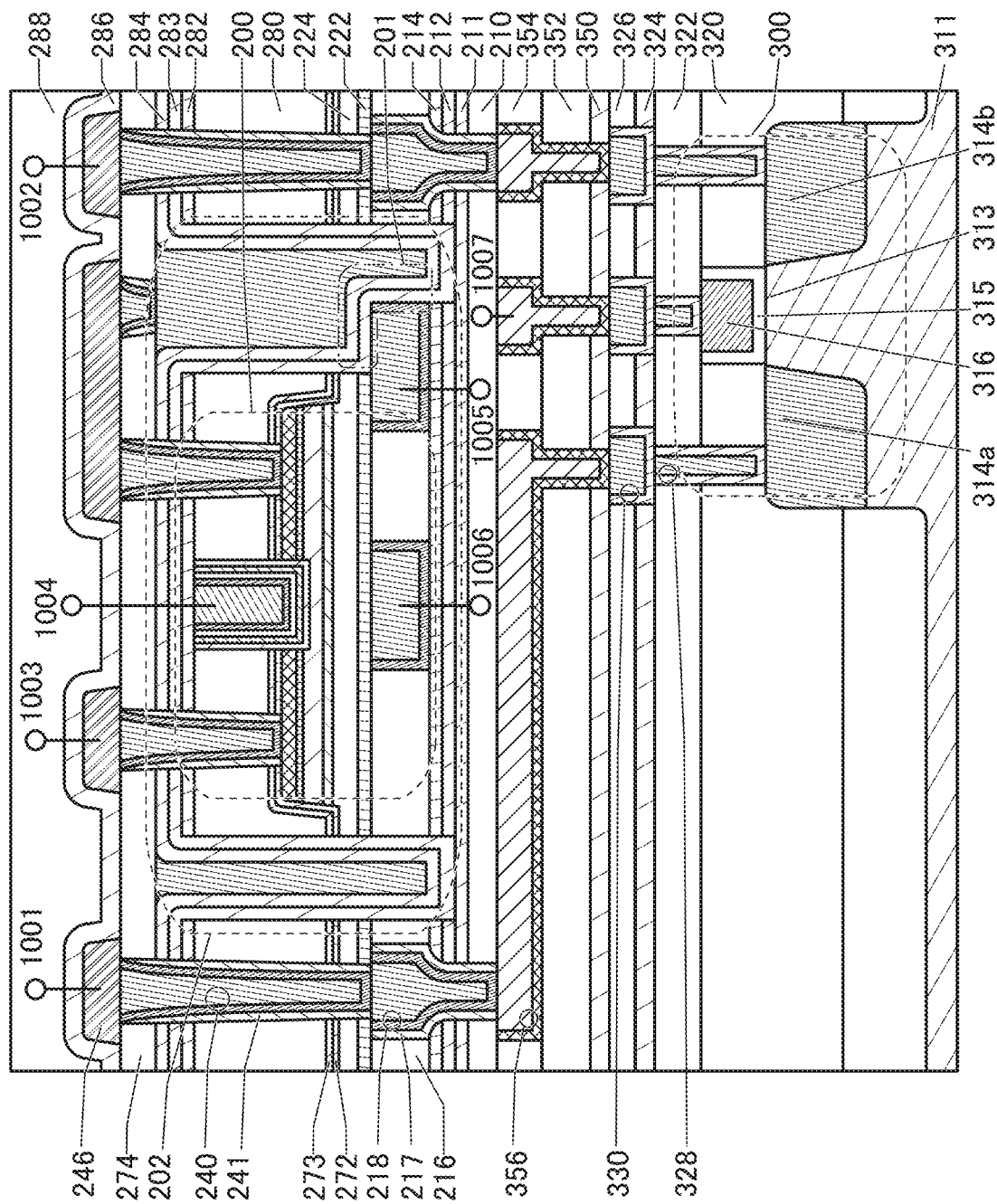
FIG. 31 is a cross-sectional view showing a structure of a storage device of one embodiment of the present invention.

In this embodiment, one embodiment of a semiconductor device is described using FIG. 31.
[Storage Device]
An example of the semiconductor device (storage device) of the present invention is shown in FIG. 31. In the semiconductor device of one embodiment of the present invention, the memory device 202 is provided above a transistor 300. The memory device 202 includes the transistor 200 and the capacitor 201 like the embodiment above. The memory device 202, the transistor 200, and the capacitor 201 described in the above embodiment can be used as memory device 202, the transistor 200, and the capacitor 201.

The transistor 200 is a transistor in which a channel is formed in a semiconductor layer including an oxide semiconductor. The off-state current of the transistor 200 is low; thus, by using the transistor 200 in a storage device, data can be retained for a long time. In other words, such a storage device does not require refresh operation or has extremely low frequency of the refresh operation, which leads to a sufficient reduction in power consumption of the storage device. Since the transistor 200 is sealed with the insulator 283, the insulator 284, the insulator 211, and the insulator 212 as shown in Embodiment 1, variation of the electrical characteristics of the storage device is suppressed and the reliability can be improved.

In the semiconductor device shown in FIG. 31, a wiring 1001 is electrically connected to a source of the transistor 300, a wiring 1002 is electrically connected to a drain of the transistor 300, and a wiring 1007 is electrically connected to a gate of the transistor 300. In addition, a wiring 1003 is electrically connected to one of the source and the drain of the transistor 200, a wiring 1004 is electrically connected to the first gate of the transistor 200, and a wiring 1006 is electrically connected to the second gate of the transistor 200. Furthermore, a wiring 1005 is electrically connected to one electrode of the capacitor 201.

By arranging the storage devices shown in FIG. 31 in a matrix, a memory cell array can be formed.

<Transistor 300>

The transistor 300 is provided over a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as the source region and the drain region. The transistor 300 may be a p-channel transistor or an n-channel transistor.

In the transistor 300 shown in FIG. 31, the semiconductor region 313 (part of the substrate 311) in which a channel is formed has a projecting shape. In addition, the conductor 316 is provided to cover a side surface and a top surface of the semiconductor region 313 with the insulator 315 therebetween. Note that a material adjusting the work function may be used for the conductor 316. Such a transistor 300 is also referred to as a FIN-type transistor because it utilizes a projecting portion of a semiconductor substrate. Note that an insulator functioning as a mask for forming the projecting portion may be included in contact with an upper portion of the projecting portion. Furthermore, although the case where the projecting portion is formed by processing part of the semiconductor substrate is described here, a semiconductor film having a projecting shape may be formed by processing an SOI substrate.

Note that the transistor 300 shown in FIG. 31 is only an example and the structure is not limited thereto; an appropriate transistor can be used in accordance with a circuit configuration or a driving method.

<Wiring Layer>

Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted with the same reference numeral in some cases. Furthermore, in this specification and the like, a wiring and a plug electrically connected to the wiring may be a single component. That is, in some cases, part of a conductor functions as a wiring or part of a conductor functions as a plug.

For example, an insulator 320, an insulator 322, an insulator 324, and the insulator 326 are sequentially stacked over the transistor 300 as interlayer films. A conductor 328, a conductor 330, and the like that are electrically connected to the capacitor 201 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, the top surface of the insulator 322 may be planarized through planarization treatment using a CMP method or the like to increase the level of planarity.

A wiring layer may be provided over the insulator 326 and the conductor 330. For example, in FIG. 31, an insulator 350, an insulator 352, and an insulator 354 are provided to be stacked in this order. Furthermore, a conductor 356 is formed in the insulator 350, the insulator 352, and the insulator 354. The conductor 356 functions as a plug or a wiring.

Similarly, a conductor 218, a conductor (conductor 205) included in the transistor 200, a conductor included in the capacitor 201 (conductor 206), and the like are embedded in an insulator 210, the insulator 211, the insulator 212, the insulator 214, and the insulator 216. Note that the conductor 218 has a function as a plug or a wiring that electrically connects the transistor 300 to wirings above.

As shown in Embodiment 1, the conductor 240, the transistor 200, the capacitor 201, and the like are embedded in the insulator 222, the insulator 224, the insulator 272, the insulator 273, the insulator 280, the insulator 282, the insulator 283, and the insulator 284. As shown in Embodiment 1, the conductor 246 is provided over the conductor 240, and the insulator 286 and the insulator 288 are provided over the conductor 246.

Here, like the insulator 241 described in the above embodiment, an insulator 217 is provided in contact with the side surface of the conductor 218 functioning as a plug. The insulator 217 is provided in contact with the inner wall of the opening formed in the insulator 210, the insulator 211, the insulator 212, the insulator 214, and the insulator 216. That is, the insulator 217 is provided between the conductor 218 and the insulator 210, the insulator 211, the insulator 212, the insulator 214, and the insulator 216. Note that the conductor 205, the conductor 206, and the conductor 218 can be formed in parallel; thus, the insulator 217 is sometimes formed in contact with the side surface of the conductor 205 and the conductor 206.

As the insulator 217, an insulator such as silicon nitride, aluminum oxide, or silicon nitride oxide may be used. Since the insulator 217 is provided in contact with the insulator 211, the insulator 212, the insulator 214, and the insulator 222, the entry of impurities such as water and hydrogen into the oxide 230 through the conductor 218 from the insulator 210, the insulator 216, or the like can be inhibited. In particular, silicon nitride is suitable because of having a high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride is deposited using a PEALD method and an opening reaching the conductor 356 is formed with anisotropic etching.

As an insulator that can be used as an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, the parasitic capacitance between wirings can be reduced. Thus, a material is preferably selected depending on the function of an insulator.

For example, as the insulator 210, the insulator 352, the insulator 354, and the like, an insulator having a low relative permittivity is preferably used. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 214, the insulator 211, the insulator 212, the insulator 350, the insulator 324, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used.

Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 246, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 241 is preferably provided between the conductor 240 and the insulator 224 and the insulator 280 that include excess oxygen in FIG. 31. Since the insulator 241 is provided in contact with the insulator 222, the insulator 272, the insulator 273, the insulator 282, the insulator 283, and the insulator 284, the insulator 224 and the transistor 200 can be sealed with the insulators having a barrier property.

That is, the insulator 241 can inhibit excess oxygen contained in the insulator 224 and the insulator 280 from being absorbed by the conductor 240. In addition, the diffusion of hydrogen, which is an impurity, into the transistor 200 through the conductor 240 can be inhibited when the insulator 241 is provided.

The insulator 241 is preferably formed using an insulating material having a function of inhibiting the diffusion of impurities such as water or hydrogen and oxygen. For example, silicon nitride, silicon nitride oxide, aluminum oxide, hafnium oxide, or the like is preferably used. In particular, silicon nitride is preferably used because silicon nitride has a high blocking property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

As in the above embodiment 1, the transistor 200 is preferably sealed with the insulator 211, the insulator 212, the insulator 214, the insulator 282, the insulator 283, and the insulator 284. Such a structure can inhibit entry of hydrogen contained in the insulator 274 or the like into the insulator 280 or the like.

Here, the conductor 240 penetrates the insulator 284, the insulator 283, and the insulator 282, and the conductor 218 penetrates the insulator 214, the insulator 212, and the insulator 211; as described above, the insulator 241 is provided in contact with the conductor 240. This can reduce the amount of hydrogen entering the inside of the insulator 211, the insulator 212, the insulator 214, the insulator 282, the insulator 283, and the insulator 284 through the conductor 240 and the conductor 218. In this manner, the transistor 200 is sealed more surely with the insulator 211, the insulator 212, the insulator 214, the insulator 282, the insulator 283, the insulator 284, and the insulator 241, so that impurities such as hydrogen contained in the insulator 274 or the like can be inhibited from entering from the outside.

As described in the above embodiment, the insulator 216, the insulator 224, the insulator 280, the insulator 250, and the insulator 274 are preferably formed using a deposition method using the gas in which hydrogen atoms are reduced or removed. Thus, the hydrogen concentrations of the insulator 216, the insulator 224, the insulator 280, the insulator 250, and the insulator 274 can be lowered.

In this manner, the hydrogen concentration of silicon-based insulating films in the vicinity of the transistor 200 can be reduced; thus, the hydrogen concentration of the oxide 230 can be reduced.

A dicing line (also referred to as scribe line, division line, or cut line in some cases) is preferably designed to overlap with the region where the insulator 283 and the insulator 211 are in contact and the capacitor 201 is not formed; the dicing line is provided to divide a large substrate into semiconductor elements so that semiconductor devices are formed as chips. Examples of a dividing method include the case where a groove (a dicing line) for dividing the semiconductor elements is formed on the substrate, and then the substrate is cut along the dicing line to divide (split) it into a plurality of semiconductor devices.

The structures, methods, and the like described in this embodiment can be used in combination as appropriate with the structures, configurations, methods, and the like described in the other embodiments and examples.

Embodiment 3

In this embodiment, a storage device (hereinafter referred to as an OS memory device in some cases) in which a memory device of one embodiment of the present invention (hereinafter referred to as a memory cell in some cases) is used is described with reference to FIG. 32A, FIG. 32B, and FIG. 33A to FIG. 33C. The memory cell includes an OS transistor and a capacitor. The OS memory device is a storage device including at least a capacitor and the OS transistor that controls the charging and discharging of the capacitor. Since the OS transistor has an extremely low off-state current, the OS memory device has excellent data retention characteristics and thus can function as a nonvolatile memory. As shown in the above embodiments, the OS transistor is sealed with barrier insulating films having a barrier property against hydrogen; this can suppress variation of electrical characteristics of the OS memory device and can improve the reliability.

<Structure Example of Storage Device>

Figure 32A:
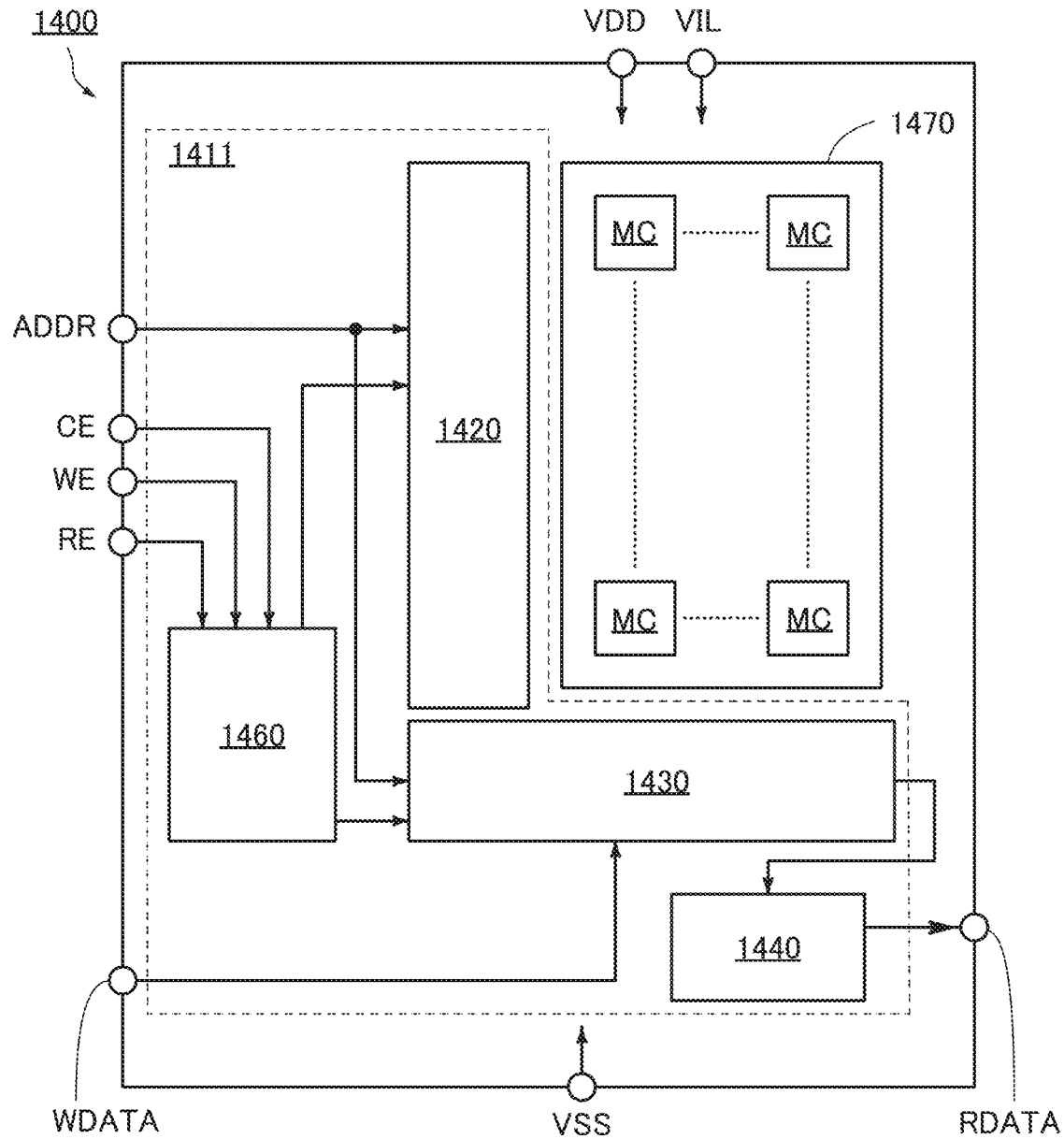
FIG. 32A is block diagram showing a structure example of a storage device of one embodiment of the present invention.

FIG. 32A shows a structure example of the OS memory device. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RE), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed with the control logic circuit 1460 are not limited thereto, and other control signals are input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 32B:
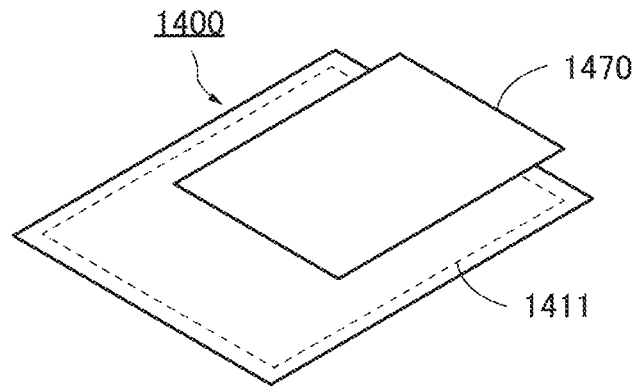
FIG. 32B is a block diagram showing a structure example of a storage device of one embodiment of the present invention.

Note that FIG. 32A shows an example in which the peripheral circuit 1411 and the memory cell array 1470 are formed on the same plane; however, this embodiment is not limited thereto. For example, as shown in FIG. 32B, the memory cell array 1470 may be provided to overlap part of the peripheral circuit 1411. For example, the sense amplifier may be provided below the memory cell array 1470 so that they overlap with each other.

Figure 33A:
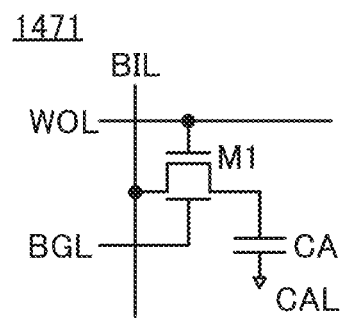
FIG. 33A to FIG. 33C are circuit diagrams showing structure examples of a storage device of one embodiment of the present invention.
Figure 33B:
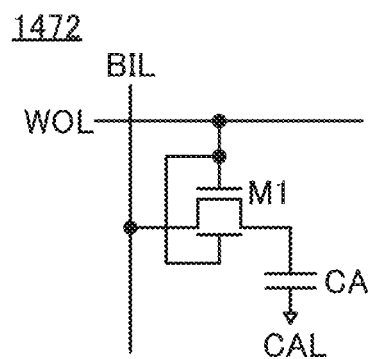
Figure 33C:
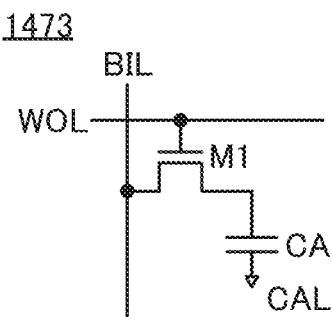

FIG. 33A to FIG. 33C show structure examples of a memory cell that can be applied to the memory cell MC.

[DOSRAM]

FIG. 33A to FIG. 33C show circuit structure examples of DRAM memory cells (Dynamic Random Access Memory). In this specification and the like, a DRAM using a memory cell including one OS transistor and one capacitor is referred to as a DOSRAM (Dynamic Oxide Semiconductor Random Access Memory) in some cases. A memory cell 1471 shown in FIG. 33A includes a transistor M1 and a capacitor CA. Note that the transistor M1 includes a gate (also referred to as a top gate in some cases) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be controlled.

Here, the memory cell 1471 in FIG. 33A corresponds to the memory device 202 described in the above embodiment. That is, the transistor M1 and the capacitor CA correspond to the transistor 200 and the capacitor 201, respectively.

The memory cell MC is not limited to the memory cell 1471, and the circuit structure can be changed. For example, as in a memory cell 1472 shown in FIG. 33B, the back gate of the transistor M1 may be connected not to the wiring BGL but to the wiring WOL in the memory cell MC. Alternatively, for example, the transistor M1 may be a single-gate transistor, that is, a transistor without a back gate in the memory cell MC as in a memory cell 1473 shown in FIG. 33C.

In the case where the semiconductor device described in the above embodiment is used in the memory cell 1471 or the like, the transistor 200 can be used as the transistor M1, and the capacitor 201 can be used as the capacitor CA. When an OS transistor is used as the transistor M1, the leakage current of the transistor M1 can be extremely low. That is, with the use of the transistor M1, written data can be retained for a long period of time, and thus the frequency of the refresh operation for the memory cell can be decreased. Alternatively, the refresh operation of the memory cell can be omitted. In addition, since the transistor M1 has an extremely low leakage current, multi-level data or analog data can be retained in the memory cell 1471, the memory cell 1472, and the memory cell 1473.

In addition, in the DOSRAM, when the sense amplifier is provided below the memory cell array 1470 to overlap with the memory cell array 1470 as described above, the bit line can be shortened. This reduces bit line capacity, which reduces the storage capacity of the memory cell.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

Figure 34:
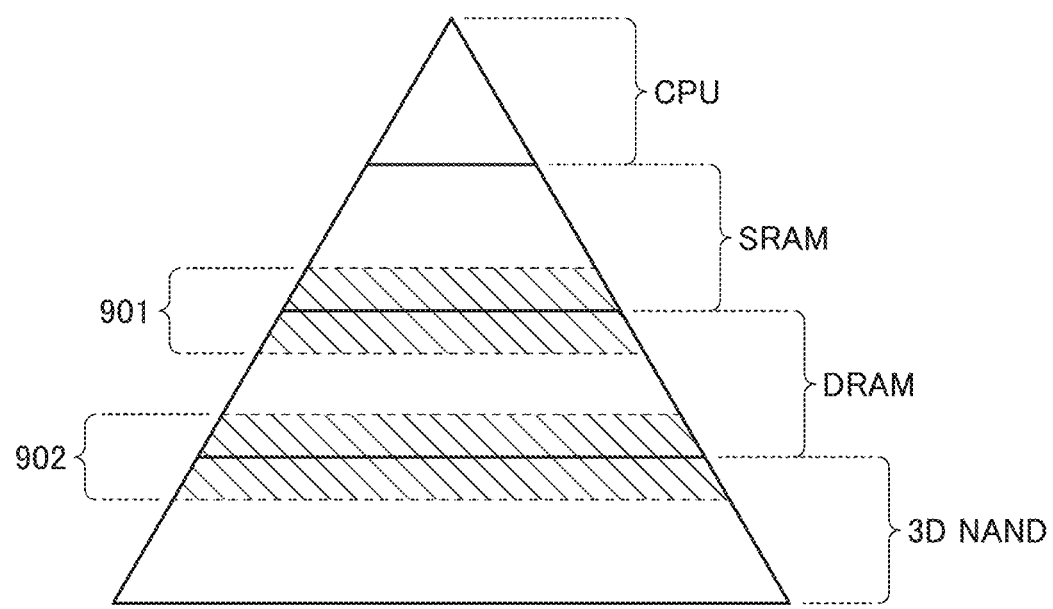
FIG. 34 is a diagram showing various storage devices in hierarchy.

In general, a variety of storage devices (memory) are used in semiconductor devices such as a computer in accordance with its usage. FIG. 34 shows a hierarchy of storage devices. The storage devices at the upper levels of the diagram require high access speeds, and the storage devices at the lower levels require large memory capacity and high record density. In FIG. 34, sequentially from the top level, a memory combined as a register in an arithmetic processing device such as a CPU, SRAM (Static Random Access Memory), DRAM, and 3D NAND memory are shown.

A memory combined as a register in an arithmetic processing device such as a CPU is used for temporary storage of arithmetic operation results, for example, and thus is very frequently accessed by the arithmetic processing device. Accordingly, rapid operation is more important than the memory capacity of the memory. The register also has a function of retaining setting information of the arithmetic processing device, for example.

The SRAM is used for a cache, for example. The cache has a function of retaining a copy of part of data retained in a main memory. By copying data which is frequently used and holding the copy of the data in the cache, the access speed to the data can be increased.

The DRAM is used for the main memory, for example. The main memory has a function of retaining a program or data which are read from a storage. The record density of a DRAM is approximately 0.1 to 0.3 Gbit/mm$^2$.

The 3D NAND memory is used for a storage, for example. The storage has a function of retaining data that needs to be retained for a long time and programs used in an arithmetic processing device, for example. Therefore, the storage needs to have a high memory capacity and a high record density rather than operating speed. The record density of a storage device used for a storage is approximately 0.6 to 6.0 Gbit/mm$^2$.

The storage device of one embodiment of the present invention operates fast and can retain data for a long time. The storage device of one embodiment of the present invention can be favorably used as a storage device in a boundary region 901 including both the level in which cache is placed and the level in which main memory is placed. Alternatively, the storage device of one embodiment of the present invention can be favorably used as a storage device in a boundary region 902 including both the level in which main memory is placed and the level in which storage is placed.

The structure described in this embodiment can be used in appropriate combination with the structures described in the other embodiments and the example.

Embodiment 4

In this embodiment, an example of a chip 1200 on which the semiconductor device of the present invention is mounted is described with reference to FIG. 35A and FIG. 35B. A plurality of circuits (systems) are mounted on the chip 1200. A technique for integrating a plurality of circuits (systems) into one chip is referred to as system on chip (SoC) in some cases.

Figure 35A:
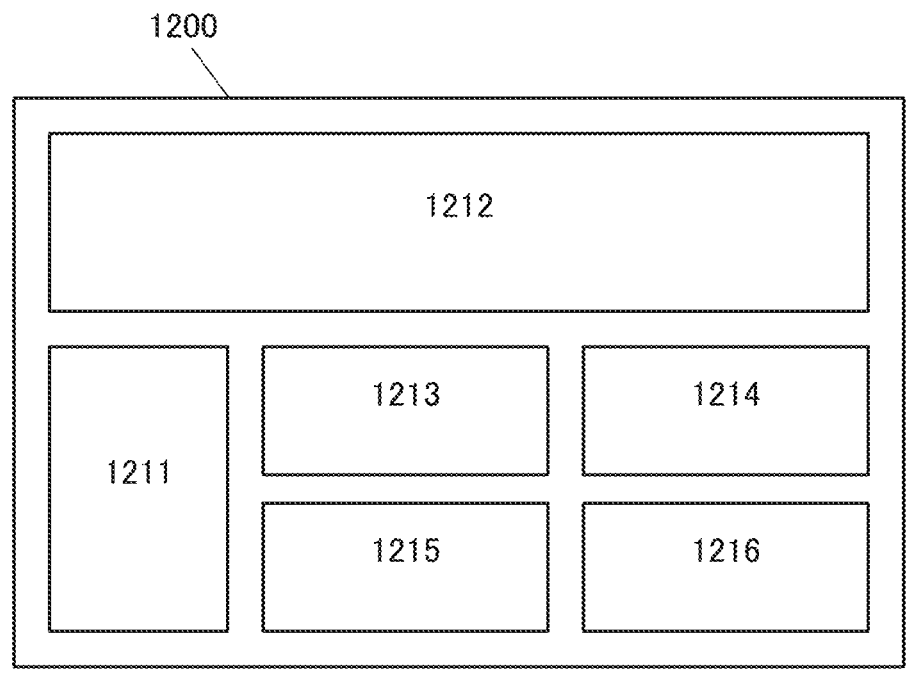
FIG. 35A and FIG. 35B are schematic diagrams of a semiconductor device of one embodiment of the present invention.

As shown in FIG. 35A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 35B:
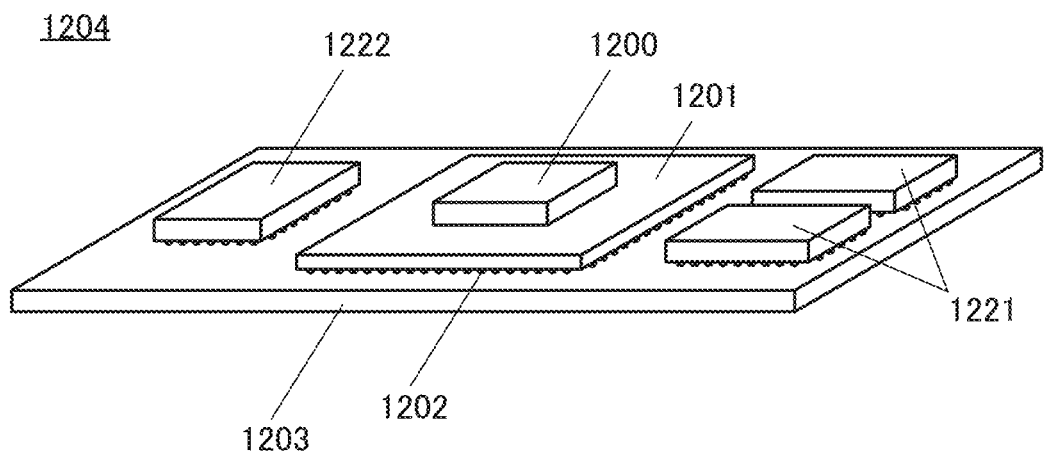

A bump (not shown) is provided on the chip 1200, and as shown in FIG. 35B, the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Storage devices such as DRAMs 1221 and a flash memory 1222 may be provided over the motherboard 1203. For example, the DOSRAM described in the above embodiment can be used as the DRAM 1221.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of manufacturing processes; thus, the chip 1200 can be fabricated at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 has excellent capability of processing image, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in appropriate combination with the structures described in the other embodiments and the example.

Embodiment 5

This embodiment shows examples of an electronic component and an electronic device that include the storage device of the above embodiments and the like.

<Electronic Component>

Figure 36A:
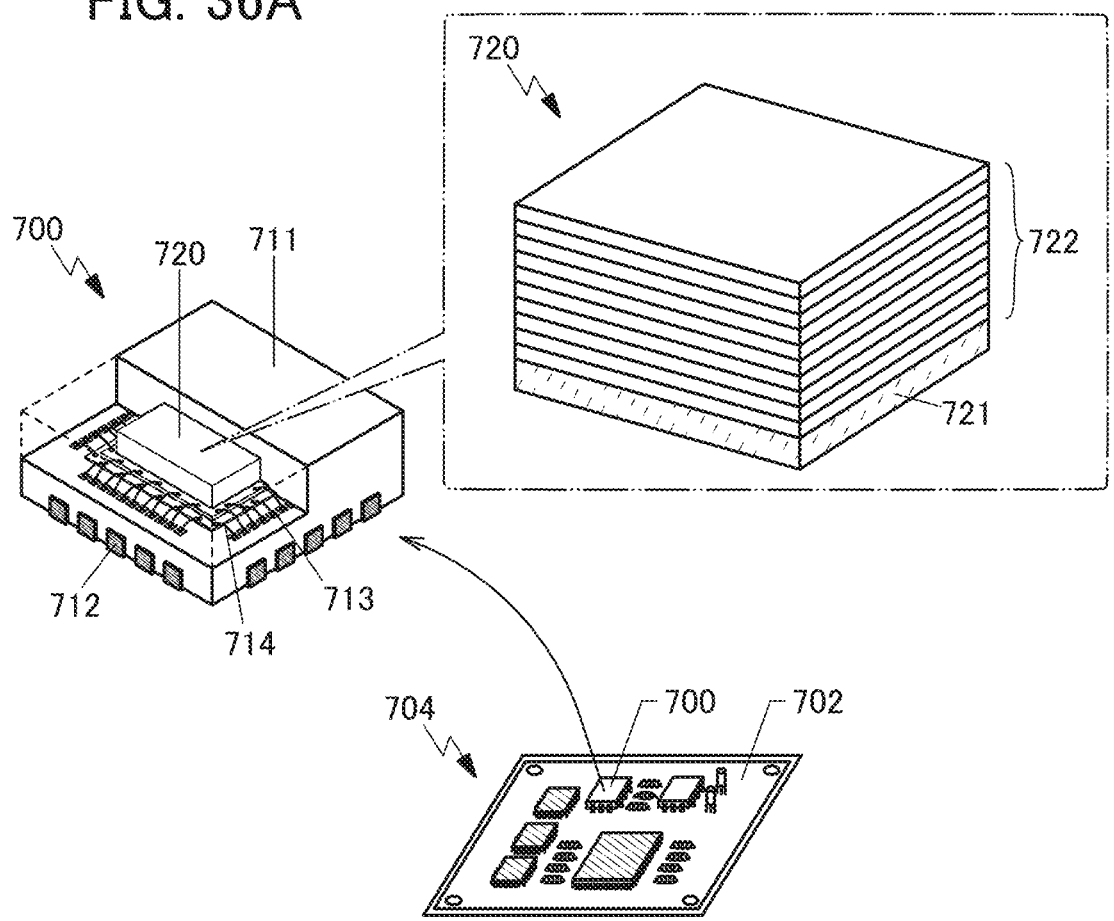
FIG. 36A and FIG. 36B are drawings showing examples of electronic devices.
Figure 36B:
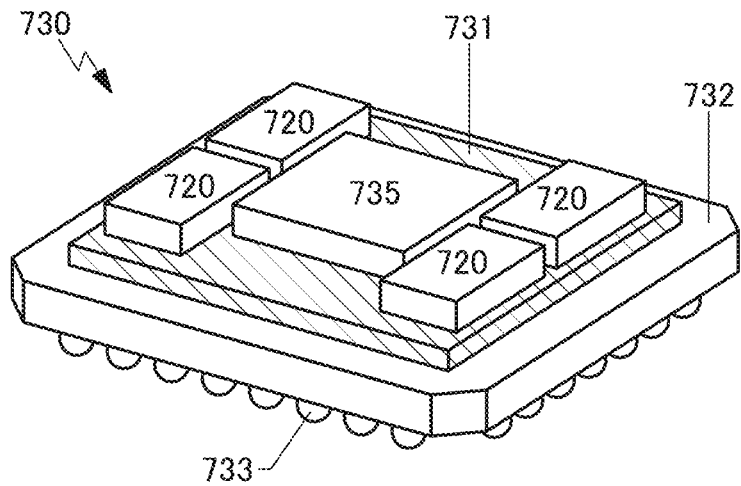

First, FIG. 36A and FIG. 36B show examples of an electronic component including a storage device 720.

FIG. 36A is a perspective view of an electronic component 700 and a substrate (circuit board 704) on which the electronic component 700 is mounted. The electronic component 700 in FIG. 36A includes a storage device 720 in a mold 711. FIG. 36A omits part of the electronic component to show the inside of the electronic component 700. The electronic component 700 includes a land 712 outside the mold 711. The land 712 is electrically connected to an electrode pad 713, and the electrode pad 713 is electrically connected to the storage device 720 with a wire 714. The electronic component 700 is mounted on a printed circuit board 702, for example. A plurality of such electronic components are combined and electrically connected to each other on the printed circuit board 702, which forms the circuit board 704.

The storage device 720 includes a driver circuit layer 721 and a memory circuit layer 722.

FIG. 36B is a perspective view of an electronic component 730. The electronic component 730 is an example of a system in package (SiP) or a multi-chip module (MCM). In the electronic component 730, an interposer 731 is provided over a package substrate 732 (printed circuit board) and a semiconductor device 735 and a plurality of storage devices 720 are provided over the interposer 731.

The electronic component 730 using the storage device 720 as a high bandwidth memory (HBM) is shown as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided on the interposer 731 to an electrode provided on the package substrate 732. Accordingly, the interposer is sometimes referred to as a redistribution substrate or an intermediate substrate. A through electrode may be provided in the interposer 731 to be used for electrically connecting the integrated circuit and the package substrate 732. In the case of using a silicon interposer, a through-silicon via (TSV) can also be used as the through electrode.

A silicon interposer is preferably used as the interposer 731. The silicon interposer can be manufactured at lower cost than an integrated circuit because the silicon interposer is not necessarily provided with an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in the coefficient of expansion between an integrated circuit and the interposer is less likely to occur. Furthermore, a surface of a silicon interposer has high planarity, and a poor connection between the silicon interposer and an integrated circuit provided thereon less likely occurs. It is particularly preferable to use a silicon interposer for a 2.5D package (2.5D mounting) in which a plurality of integrated circuits are arranged side by side on the interposer.

A heat sink (radiator plate) may be provided to overlap with the electronic component 730. In this case, the heights of integrated circuits provided on the interposer 731 are preferably equal to each other. In the electronic component 730 of this embodiment, the heights of the storage device 720 and the semiconductor device 735 are preferably equal to each other, for example.

An electrode 733 may be provided on the bottom portion of the package substrate 732 to mount the electronic component 730 on another substrate. FIG. 36B shows an example in which the electrode 733 is formed of a solder ball. Solder balls are provided in a matrix on the bottom portion of the package substrate 732, whereby a ball grid array (BGA) can be achieved.

Alternatively, the electrode 733 may be formed of a conductive pin. When conductive pins are provided in a matrix on the bottom portion of the package substrate 732, a pin grid array (PGA) can be achieved.

The electronic component 730 can be mounted on another substrate in various manners, not limited to the BGA and the PGA. For example, a staggered pin grid array (SPGA), a land grid array (LGA), a quad flat package (QFP), a quad flat J-leaded package (QFJ), or a quad flat non-leaded package (QFN) can be employed.

This embodiment can be implemented in combination with any of the structures described in the other embodiments, examples, or the like, as appropriate.

Embodiment 6

In this embodiment, application examples of the storage device using the semiconductor device described in the above embodiment are described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 37A to FIG. 37E schematically show some structure examples of removable storage devices. The semiconductor device described in the above embodiment is processed into a packaged memory chip and used in a variety of storage devices and removable memories, for example.

Figure 37A:
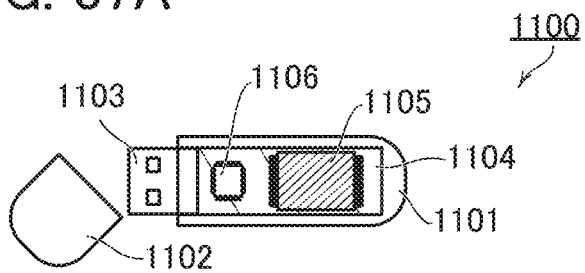
FIG. 37A to FIG. 37E are schematic views of storage devices of one embodiment of the present invention.

FIG. 37A is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

Figure 37B:
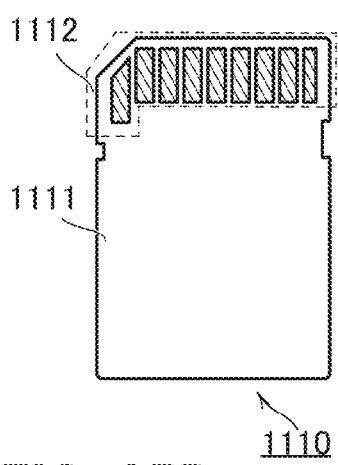
Figure 37C:
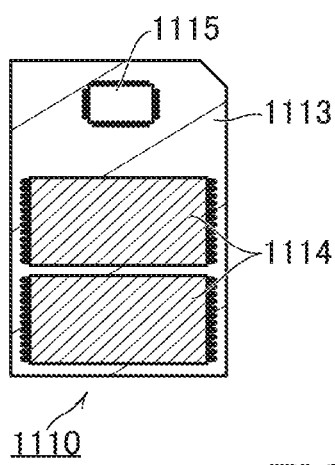

FIG. 37B is a schematic external view of an SD card, and FIG. 37C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 through radio communication between a host device and the SD card 1110. The semiconductor device described in the above embodiment can be incorporated in the memory chip 1114 or the like.

Figure 37D:
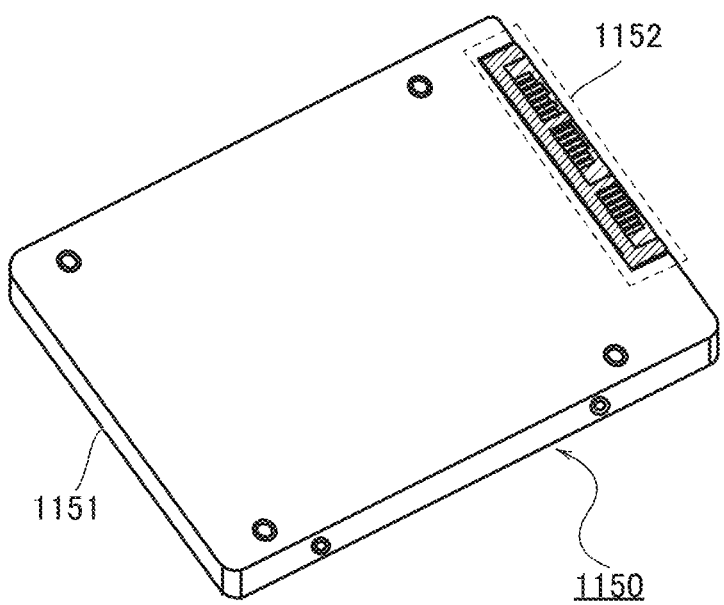
Figure 37E:
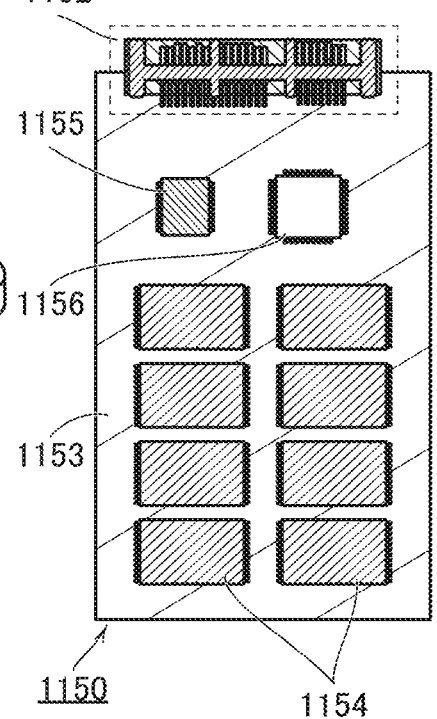

FIG. 37D is a schematic external view of an SSD, and FIG. 37E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

This embodiment can be implemented in combination with any of the structures described in the other embodiments, examples, and the like, as appropriate.

Embodiment 7

The semiconductor device of one embodiment of the present invention can be used as a processor such as a CPU and a GPU or a chip. FIG. 38A to FIG. 38H show specific examples of electronic devices including a chip or a processor such as a CPU or a GPU of one embodiment of the present invention.

<Electronic Device, System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 38A to FIG. 38H show examples of electronic devices.

[Information Terminal]

Figure 38A:
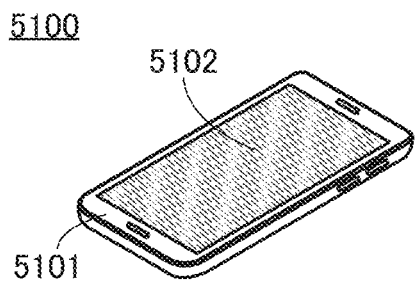
FIG. 38A to FIG. 38H are drawings showing electronic devices of one embodiment of the present invention.

FIG. 38A shows a mobile phone (smartphone), which is a type of information terminal.

An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 38B:
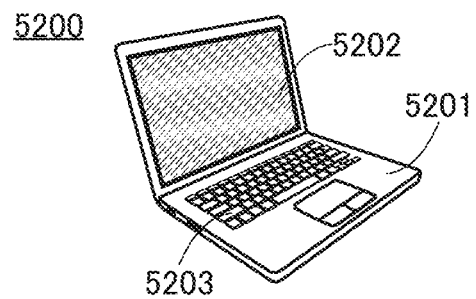

FIG. 38B shows a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with use of the notebook information terminal 5200, novel artificial intelligence can be developed.

Note that although FIG. 38A and FIG. 38B show a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 38C:
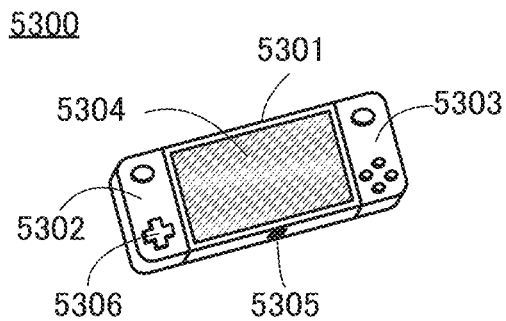

FIG. 38C shows a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not shown), an image to be output to the display portion 5304 can be output to another video device (not shown). In that case, the housing 5302 and the housing 5303 can each function as an operating unit. Thus, a plurality of players can perform a game at the same time. The chip described in the above embodiment can be incorporated into the chip provided on a substrate in the housing 5301, the housing 5302 and the housing 5303.

Figure 38D:
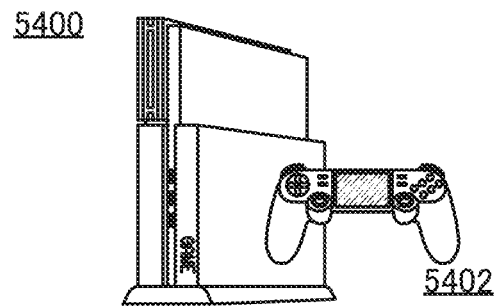

FIG. 38D shows a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 38C and FIG. 38D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 38E:
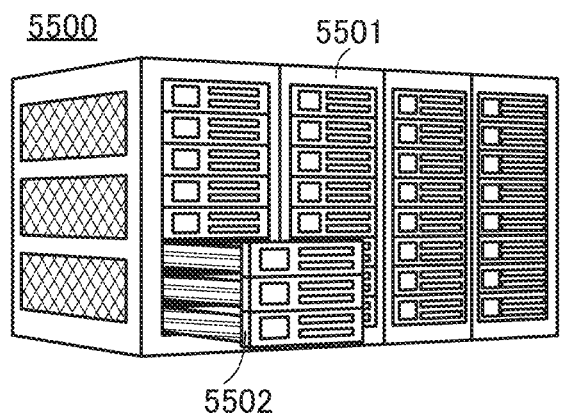
Figure 38F:
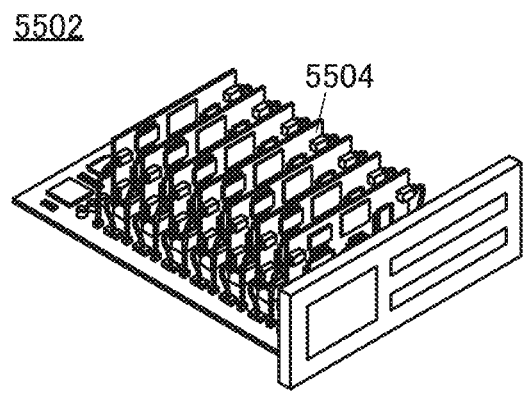

FIG. 38E shows a supercomputer 5500 as an example of a large computer. FIG. 38F shows a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is shown as an example of a large computer in FIG. 38E and FIG. 38F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 38G:
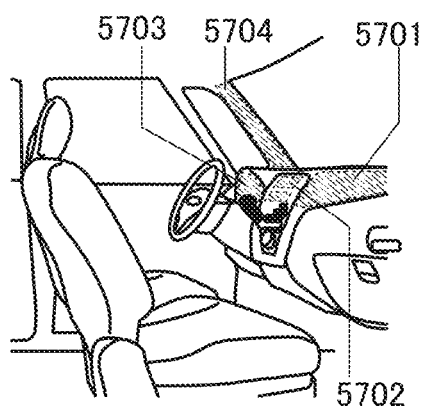

FIG. 38G shows an area around a windshield inside an automobile, which is an example of a moving vehicle. FIG. 38G shows a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for the view obstructed by the pillar (a blind spot) by showing an image taken by an imaging device (not shown) provided for the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 38H:
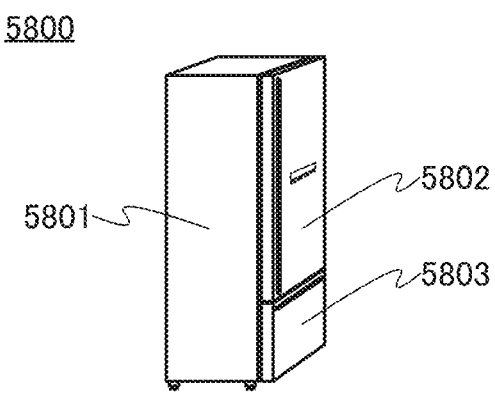

FIG. 38H shows an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in combination with any of the structures described in the other embodiments, examples, and the like, as appropriate.

REFERENCE NUMERALS

BGL: wiring, BIL: wiring, CA: capacitor, CAL: wiring, MC: memory cell, M1: transistor, WOL: wiring, 200: transistor, 200*a*: transistor, 200*a*_1: transistor, 200*a*_2: transistor, 200*b*: transistor, 200*b*_1: transistor, 200*b*_2: transistor, 201: capacitor, 201*a*: capacitor, 201*a*_1: capacitor, 201*a*_2: capacitor, 201*b*: capacitor, 201*b*_1: capacitor, 201*b*_2: capacitor, 202: memory device, 202*a*: memory device, 202*a*_1: memory device, 202*a*_2: memory device, 202*b*: memory device, 202*b*_1: memory device, 202*b*_2: memory device, 205: conductor, 205*a*: conductor, 205*b*: conductor, 206: conductor, 206*a*: conductor, 206*b*: conductor, 210: insulator, 211: insulator, 212: insulator, 214: insulator, 216: insulator, 217: insulator, 218: conductor, 222: insulator, 224: insulator, 230: oxide, 230*a*: oxide, 230A: oxide film, 230*b*: oxide, 230B: oxide film, 230*c*: oxide, 230C: oxide film, 230*d*: oxide, 230D: oxide film, 240: conductor, 240*a*: conductor, 240*b*: conductor, 240*c*: conductor, 240*d*: conductor, 240*e*: conductor, 240*f*: conductor, 241: insulator, 241*a*: insulator, 241*b*: insulator, 241*c*: insulator, 241*d*: insulator, 241*e*: insulator, 241*f*: insulator, 242: conductor, 242*a*: conductor, 242A: conductive film, 242*b*: conductor, 242B: conductive layer, 243: oxide, 243*a*: oxide, 243A: oxide film, 243*b*: oxide, 243B: oxide layer, 246: conductor, 246*a*: conductor, 246*b*: conductor, 246*d*: conductor, 246*e*: conductor, 246*f*: conductor, 248: conductor, 248*a*: conductor, 248A: conductive film, 248*b*: conductor, 250: insulator, 250A: insulating film, 251: opening, 260: conductor, 260*a*: conductor, 260A: conductive film, 260*b*: conductor, 260B: conductive film, 270: opening, 270*a*: opening, 270*b*: opening, 272: insulator, 272*a*: insulator, 272*b*: insulator, 273: insulator, 274: insulator, 280: insulator, 282: insulator, 283: insulator, 284: insulator, 286: insulator, 287: insulator, 288: insulator, 289: insulator, 300: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 600: semiconductor device, 600_1: semiconductor device, 600_2: semiconductor device, 610: cell array, 610_*n*: cell array, 610_1: cell array, 700: electronic component, 702: printed circuit board, 704: circuit board, 711: mold, 712: land, 713: electrode pad, 714: wire, 720: storage device, 721: driver circuit layer, 722: memory circuit layer, 730: electronic component, 731: interposer, 732: package substrate, 733: electrode, 735: semiconductor device, 901: boundary region, 902: boundary region, 1001: wiring, 1002: wiring, 1003: wiring, 1004: wiring, 1005: wiring, 1006: wiring, 1007: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: PCB, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: storage device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 5100: information terminal, 5101: housing, 5102: display portion, 5200: notebook information terminal, 5201: main body, 5202: display portion, 5203: keyboard, 5300: portable gaming machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door

The invention claimed is:

1. A semiconductor device, comprising:
a transistor, a first conductor, a second conductor, a first insulator, a second insulator, and a third insulator,
wherein the transistor and the first conductor are over the first insulator,
wherein the transistor comprises an oxide semiconductor,
wherein the second insulator is over the transistor,
wherein the first conductor comprises a region not overlapping with the second insulator,
wherein the third insulator covers the first conductor, the transistor, and the second insulator,
wherein the second conductor is over the third insulator and comprises a region overlapping with the first conductor,
wherein a first region of the third insulator is in direct contact with a top surface and a side surface of the first conductor,
wherein a second region of the third insulator is in direct contact with a top surface of the first insulator, and
wherein the second conductor comprises a region overlapping with the second region of the third insulator.

2. A semiconductor device, comprising:
a first oxide, a second oxide, a first conductor, a second conductor, a third conductor, a fourth conductor, a fifth conductor, a sixth conductor, a first insulator, a second insulator, a third insulator, a fourth insulator, and a fifth insulator,
wherein the first conductor is over the first insulator,
wherein the second insulator is over the first conductor,
wherein the first oxide is over the second insulator,
wherein the second conductor and the third conductor are over the first oxide,
wherein the third insulator is over the second conductor and the third conductor,
wherein the second oxide is between the second conductor and the third conductor over the first oxide,
wherein the fourth insulator is over the second oxide,
wherein the fourth conductor is over the fourth insulator,
wherein the fifth conductor is over the first insulator and comprises a region not overlapping with the third insulator,
wherein the fifth insulator covers the second insulator, the third insulator, and the fifth conductor,
wherein the sixth conductor is over the fifth insulator and comprises a region overlapping with the fifth conductor,
wherein a first region of the fifth insulator is in direct contact with a top surface and a side surface of the fifth conductor,
wherein a second region of the fifth insulator is in direct contact with a top surface of the first insulator, and
wherein the sixth conductor comprises a region overlapping with the second region of the fifth insulator.

3. The semiconductor device, according to claim 2,
wherein a top surface of the sixth conductor is level with or substantially level with a top surface of the fifth insulator in a region overlapping with the second insulator.

4. The semiconductor device, according to claim 2,
wherein the fifth insulator is in contact with a side surface of the third insulator and a side surface of the second insulator.

5. The semiconductor device, according to claim 2,
wherein each of the first insulator and the fifth insulator comprises a nitride containing silicon.

6. The semiconductor device, according to claim 2,
wherein the fifth insulator has a stacked-layer structure.

7. The semiconductor device, according to claim 2,
wherein a top surface of the third insulator, a top surface of the second oxide, a top surface of the fourth insulator, and a top surface of the fourth conductor are level with or substantially level with each other.

8. The semiconductor device, according to claim 2,
wherein the fifth conductor comprises a region overlapping with the third insulator.

9. The semiconductor device, according to claim 2,
wherein the first conductor and the fifth conductor are integrated in an island-like shape.

10. The semiconductor device, according to claim 2,
wherein the fifth conductor does not overlap with the third insulator, and
wherein the fifth insulator is in contact with one side surface of the fifth conductor and a side surface opposite to the one side surface.

11. The semiconductor device, according to claim 2,
wherein the third conductor is electrically connected to the sixth conductor.

12. The semiconductor device, according to claim 2,
wherein an opening reaching the fifth conductor is formed in the second insulator and the first oxide, and
wherein the third conductor is in contact with the fifth conductor through the opening.

* * * * *